(12) United States Patent
Terasawa et al.

(10) Patent No.: US 6,621,555 B1
(45) Date of Patent: Sep. 16, 2003

(54) PROJECTION OPTICAL SYSTEM AND PROJECTION EXPOSURE APPARATUS WITH THE SAME, AND DEVICE MANUFACTURING METHOD

(75) Inventors: Chiaki Terasawa, Utsunomiya (JP); Hiroyuki Ishii, Utsunomiya (JP); Takashi Kato, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 83 days.

(21) Appl. No.: 09/592,582

(22) Filed: Jun. 12, 2000

(30) Foreign Application Priority Data

Jun. 14, 1999 (JP) ............................................. 11-167424

(51) Int. Cl.$^7$ ......................... G03B 27/42; G03B 27/54; G02B 9/00; G02B 13/22
(52) U.S. Cl. ......................... 355/53; 355/67; 359/649; 359/663; 359/708
(58) Field of Search ..................... 355/56, 37; 359/648, 359/649, 633, 708, 713

(56) References Cited

U.S. PATENT DOCUMENTS

| | | | |
|---|---|---|---|
| 4,948,238 A | 8/1990 | Araki | 350/469 |
| 5,345,292 A | 9/1994 | Shiozawa et al. | 355/67 |
| 5,713,660 A * | 2/1998 | Mori et al. | 353/38 |
| 5,754,504 A * | 5/1998 | Yamazaki et al. | 257/358 |
| 5,805,344 A | 9/1998 | Sasaya et al. | 359/649 |
| 5,818,809 A * | 10/1998 | Arai et al. | 369/112.24 |
| 5,831,770 A | 11/1998 | Matsuzawa et al. | 359/649 |
| 5,956,182 A | 9/1999 | Takahashi | 359/649 |
| 6,008,884 A | 12/1999 | Yamaguchi et al. | 355/53.54 |
| 6,154,323 A * | 11/2000 | Kamo | 359/691 |
| 6,195,213 B1 * | 2/2001 | Omura et al. | 655/53 |
| 6,259,508 B1 * | 7/2001 | Shigematsu | 355/53 |

FOREIGN PATENT DOCUMENTS

| | | |
|---|---|---|
| EP | 0 828 172 | 3/1998 |
| JP | 63-311223 | 12/1988 |
| JP | 5-34593 | 2/1993 |
| JP | 7-48089 | 5/1995 |
| JP | 7-128592 | 5/1995 |
| JP | 8-179204 | 7/1996 |
| JP | 9-105861 | 4/1997 |
| JP | 10-48517 | 2/1998 |
| JP | 10-79345 | 3/1998 |
| JP | 10-154657 | 6/1998 |
| JP | 10-197791 | 7/1998 |
| JP | 10-325922 | 12/1998 |
| JP | 10-333030 | 12/1998 |
| JP | 11-6957 | 1/1999 |
| JP | 2000-121934 | 4/2000 |

OTHER PUBLICATIONS

Robert A. Jones, "Computer–controlled polishing of telescope mirror segments", *Optical Engineering*, 22(2), Mar./Apr. 1983, pp. 236–240.

* cited by examiner

Primary Examiner—Rodney Fuller
(74) Attorney, Agent, or Firm—Fitzpatrick, Cella, Harper & Scinto

(57) ABSTRACT

A projection exposure apparatus includes a projection optical system for projecting a pattern of a reticle onto a photosensitive substrate. The projection optical system includes at least three lens units, including a lens unit of a positive refractive power and a lens unit of a negative refractive power, and an aspherical lens having aspherical surfaces formed on both sides thereof, in which a relation $|L \times \phi_0| > 17$ is satisfied, where L is a conjugate distance of the projection optical system and $\phi_0$ is the total power of the negative lens unit or of negative lens units of the projection optical system. Each aspherical surface of said aspherical surface lens is disposed at a position satisfying a relation $|h_b/h| > 0.36$ where h is a height of an axial marginal light ray, and $h_b$ is a height of a most abaxial chief ray, and each aspherical surface of the aspherical surface lens satisfies a relation $|\Delta ASPH/L| > 1.0 \times 10^{-6}$ where $\Delta ASPH$ is an aspherical amount of the aspherical surface.

9 Claims, 31 Drawing Sheets

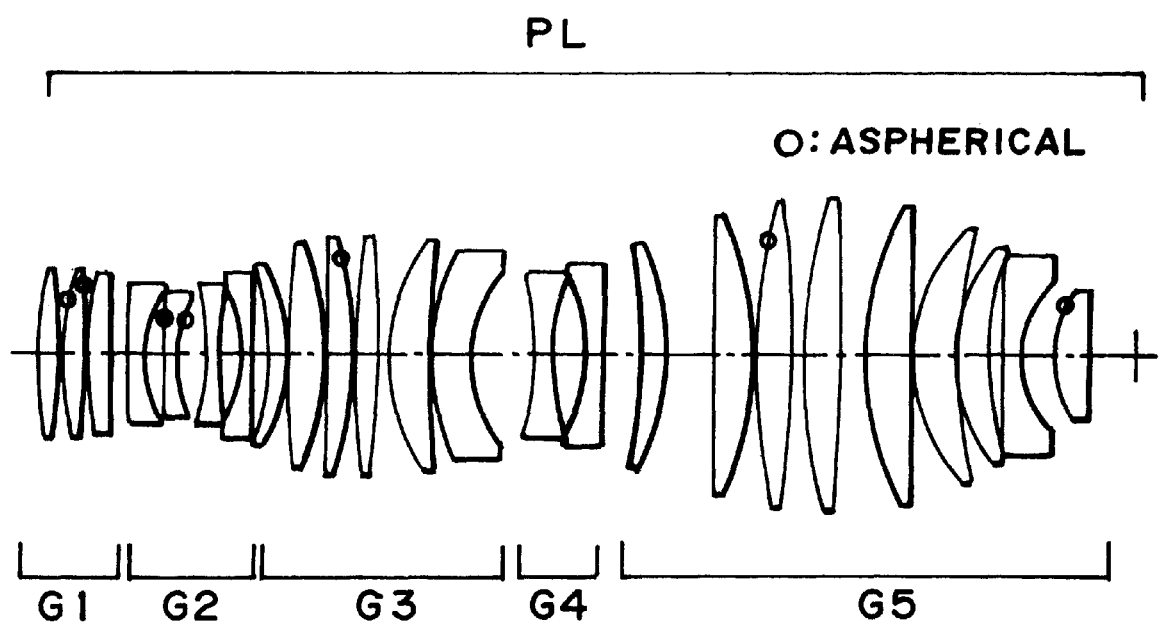
F I G. 13

ONE-SIDE
ASPHERICAL

BOTH-SIDES
ASPHERICAL

PROJECTION OPTICAL SYSTEM AND PROJECTION EXPOSURE APPARATUS WITH THE SAME, AND DEVICE MANUFACTURING METHOD

FIELD OF THE INVENTION AND RELATED ART

This invention relates to a projection optical system and a projection exposure apparatus using the same, and also to a device manufacturing method using such an apparatus. More particularly, the invention is suitably applicable to a projection exposure process for printing a reticle pattern on a photosensitive substrate in accordance with a step-and-repeat method or a step-and-scan method, for the manufacture of large-integration microdevices or semiconductor devices of a submicron or quarter-micron order, such as ICs, LSIs, CCDs, or liquid crystal panels, for example.

Generally, in a projection exposure apparatus, a reticle having an electronic circuit pattern formed thereon is illuminated with light (exposure light) from an illumination system (illumination optical system) and the pattern is projected onto a wafer through a projection optical system.

With increasing density of a semiconductor device, strict requirements have been applied to the performance or specification of a projection optical system. Generally, for a higher resolution, attempts have been made in relation to shortening the wavelength of exposure light, better correction of aberrations of a projection optical system, or enlargement of the numerical aperture (NA) of a projection optical system.

As regards the exposure light, light of an i-line lamp or laser light of an excimer laser such as KrF or ArF, or an $F_2$ laser, for example, is used.

As regards enlargement of the numerical aperture (NA) of a projection optical system, the NA is being increased from 0.6 to 0.65, and then to 0.7.

As regards aberration correction, many attempts have been made so that a dual-telecentric system (being telecentric on object and image sides) is defined to reduce image distortion resulting from a warp of a reticle or a wafer and, on the other hand, distortion attributable to the projection optical system is reduced as much as possible. Also, that image plane width (field curvature amount) of best image points at each of the image heights is minimized, while the contrast gain at each of the image heights are made uniform as much as possible.

On the other hand, semiconductor device manufacturing processes use many reticle patterns or line widths and, in accordance with them, the illumination condition is changed variously to obtain a best pattern image. In order to minimize differences in distortion or image plane flatness, for example, under different illumination conditions, coma aberrations at each of the image heights are reduced to attain registration of the image plane.

Further, while the throughput of a projection exposure apparatus is an important factor, the chip size has been enlarged to increase the throughput. The exposure region of the projection optical system is enlarged to meet this.

As regards a projection optical system for use in a projection exposure apparatus, Japanese Laid-Open Patent Applications, Laid-Open No. 105861/1997, No. 48517/1998, and No. 79345/1998 have proposed a projection optical system wherein all lens systems are defined by spherical surfaces.

Japanese Published Patent Application, Publication No. 48089/1995 and Japanese Laid-Open Patent Applications, Laid-Open No. 128592/1995, No. 179204/1996, No. 34593/1993, No. 197791/1998, No. 154657/1998, No. 325922/1998, No. 333030/1998, and No. 6957/1999, have proposed a projection optical system wherein an aspherical surface is used for aberration correction.

SUMMARY OF THE INVENTION

It is an object of the present invention to provide a projection optical system by which aberrations such as distortion, curvature of field, astigmatism, coma and spherical aberration can be corrected satisfactorily such that a high optical performance is assured through an exposure region, and by which enlargement of numerical aperture (NA) and enlargement of exposure area can be attained.

It is another object of the present invention to provide a projection exposure apparatus having such a projection optical system.

It is a further object of the present invention to provide a device manufacturing method using such a projection exposure apparatus.

In accordance with an aspect of the present invention, there is provided a projection optical system for projecting an image of an object onto a photosensitive substrate, wherein said projection optical system includes at least one aspherical surface lens having aspherical surfaces formed on both sides thereof.

In one preferred form of this aspect of the present invention, each aspherical surface of said projection optical system satisfies a relation $|\Delta ASPH/L| > 1 \times 10^{-6}$ where $\Delta ASPH$ is the aspherical amount of the aspherical surface and L is an object-to-image distance of said projection optical system.

Here, the aspherical amount refers to a deviation between a spherical surface, following a design curvature radius, and an aspherical surface with respect to an optical axis direction.

The projection optical system may comprise a plurality of lens groups including a positive refractive power lens group and a negative refractive power lens group, and a relation $|L \times \phi_0| > 17$ may be satisfied where L is a conjugate distance of said projection optical system and $\phi_0$ is the sum of powers of the negative lens group or groups.

The aspherical surface may be formed on a surface satisfying a relation $|h_b/h| > 0.35$ where h is a height of an axial marginal light ray, and $h_b$ is a height of a most abaxial chief ray.

The projection optical system may include two aspherical surfaces having regions in which their local curvature powers change with mutually opposite signs, from a surface center to a surface peripheral portion.

The two aspherical surfaces may be the surfaces on both sides of said aspherical surface lens.

Each aspherical surface of said projection optical system may satisfy a relation $|\Delta ASPH/L| < 0.02$ where $\Delta ASPH$ is the aspherical amount of the aspherical surface and L is an object-to-image distance of said projection optical system.

The projection optical system may comprise a plurality of lens groups including a positive refractive power lens group and a negative refractive power lens group, wherein a relation $|L \times \phi_0| < 70$ is satisfied where L is a conjugate distance of said projection optical system and $\phi_0$ is the sum of powers of the negative lens group.

The aspherical surface may be formed on a surface satisfying a relation $|h_b/h| < 15$ where h is a height of an axial marginal light ray, and $h_b$ is a height of a most abaxial chief ray.

The projection optical system may be made a telecentric system both on the object side and on the image side.

Each aspherical surface lens of said projection optical system may have aspherical surfaces formed on both sides thereof.

In accordance with another aspect of the present invention, there is provided a projection exposure apparatus including a projection optical system as recited above.

In accordance with a further aspect of the present invention, there is provided a device manufacturing method for projecting a pattern of a reticle onto a wafer by use of a projection optical exposure apparatus as recited above, and for producing a device through a development process to the wafer.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 13 is a lens sectional view of a projection optical system for use in a projection exposure apparatus, according to Numerical Example 5 of the present invention.

DESCRIPTION OF THE PREFERRED EMBODIMENTS

Preferred embodiment of the present invention will now be described with reference to the accompanying drawings, and particularly in conjunction with some numerical examples.

Figure 1:
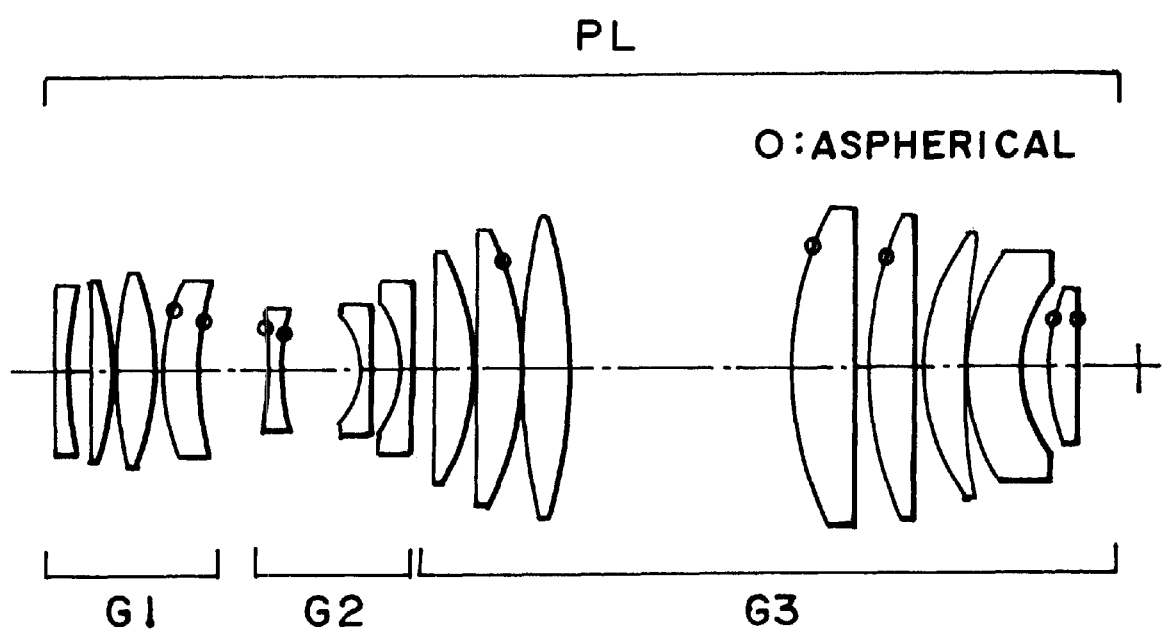
FIG. 1 is a lens sectional view of a projection optical system for use in a projection exposure apparatus, according to Numerical Example 1 of the present invention.
Figure 2:
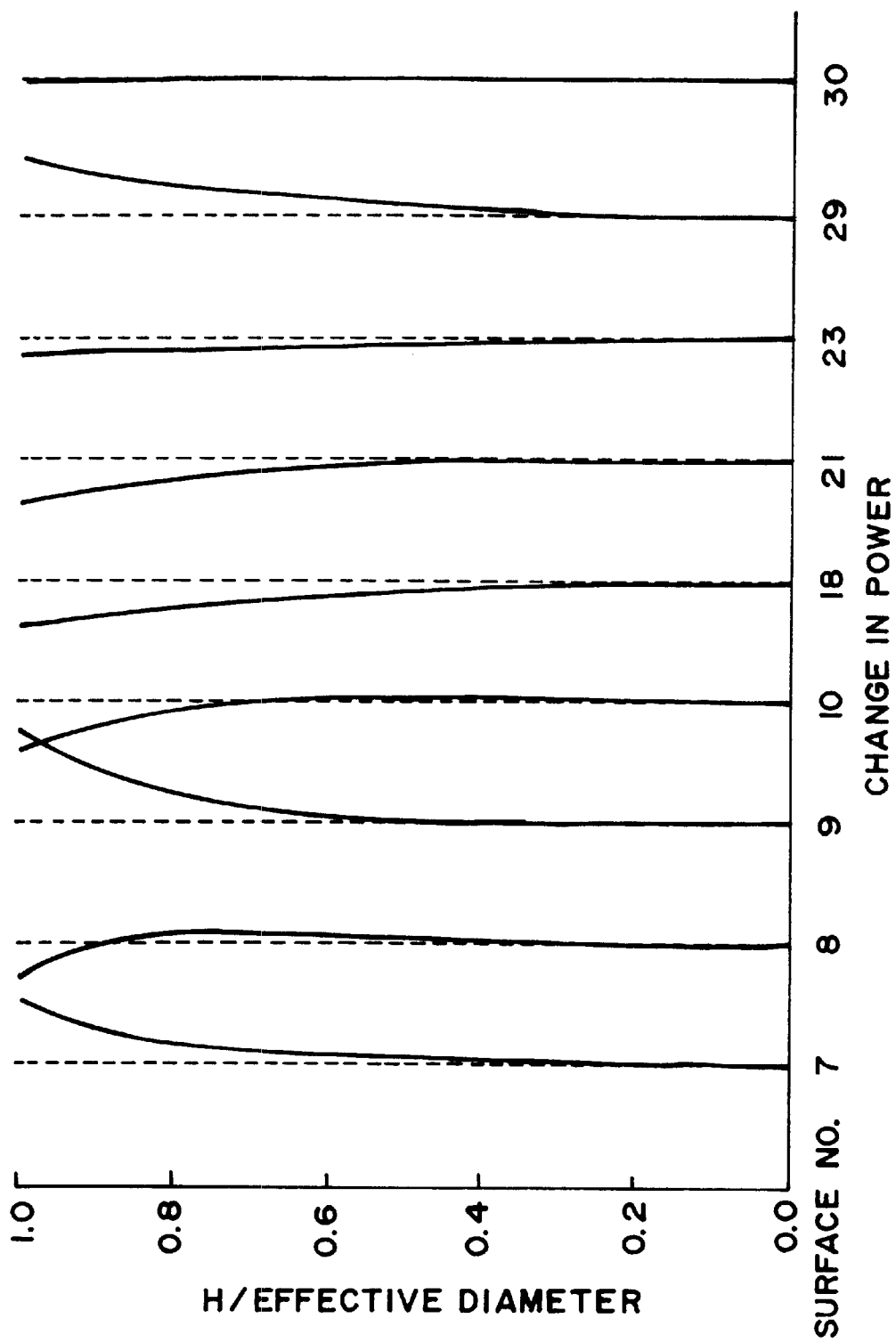
FIG. 2 is a graph for explaining changes in a local curvature power of an aspherical surface of a projection optical system according to Numerical Example 1.
Figure 3:
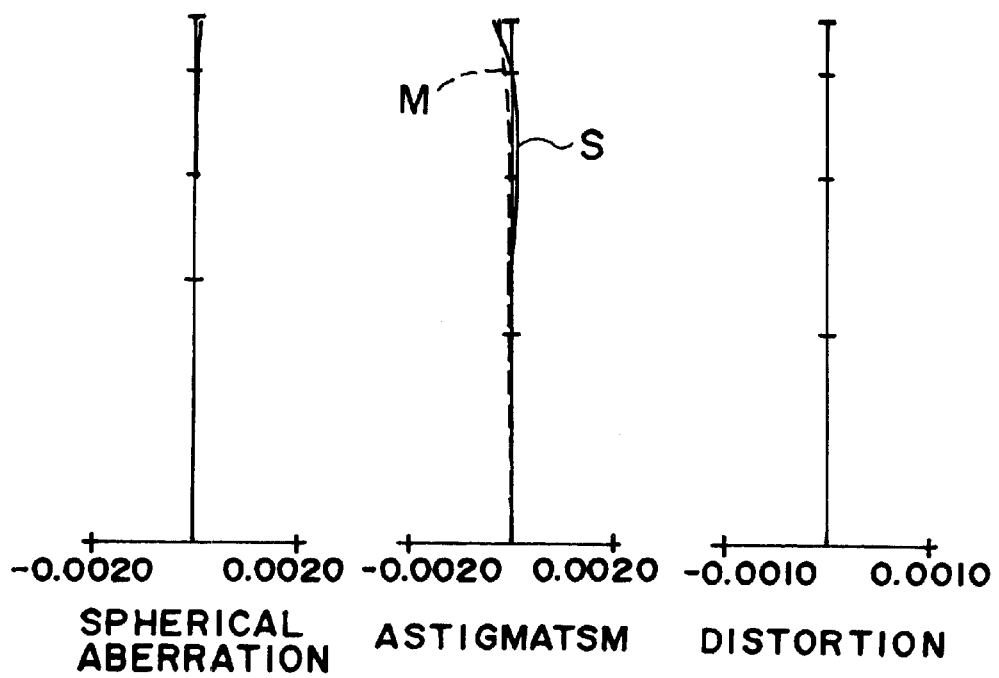
FIG. 3 illustrates aberrations of a projection optical system according to Numerical Example 1.
Figure 3:
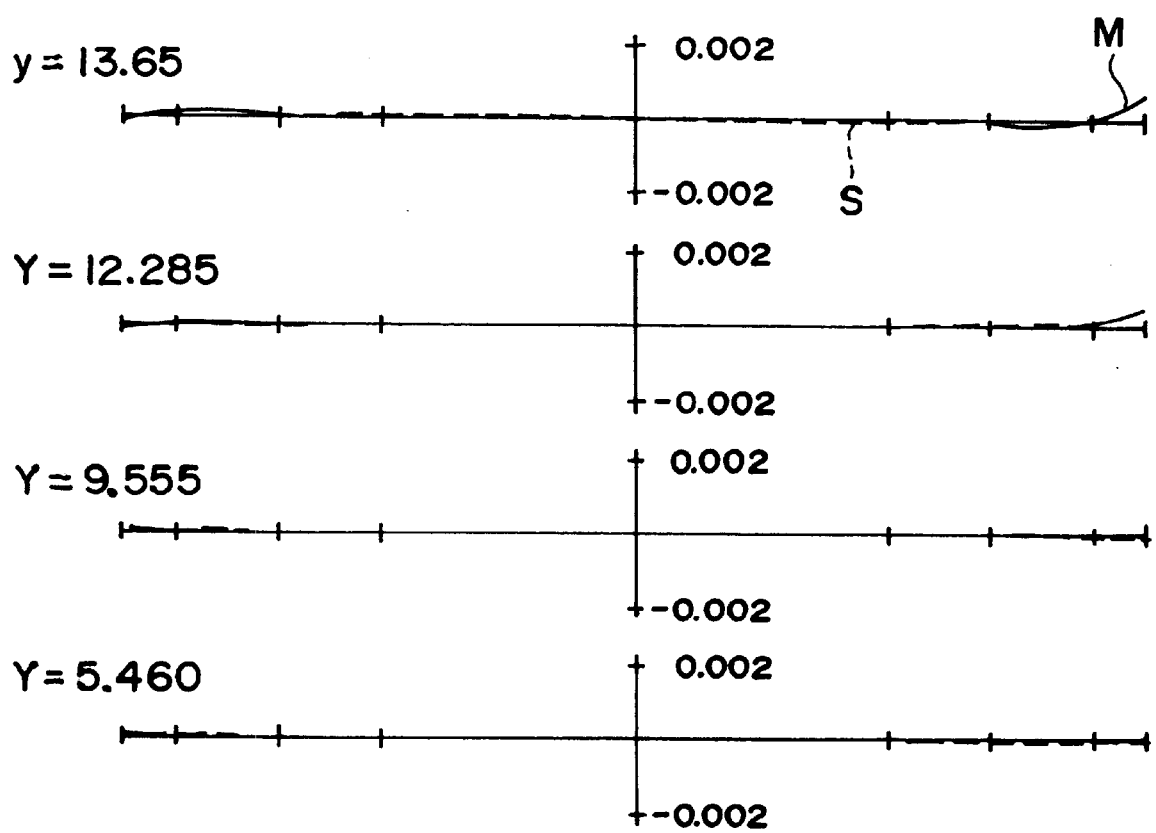

FIG. 1 is a lens sectional view of a projection optical system for use in a projection exposure apparatus, according to Numerical Example 1 of the present invention. FIG. 2 is a graph for explaining changes in a local curvature power of an aspherical surface of a projection optical system according to Numerical Example 1. FIG. 3 illustrates aberrations of a projection optical system according to Numerical Example 1.

Figure 4:
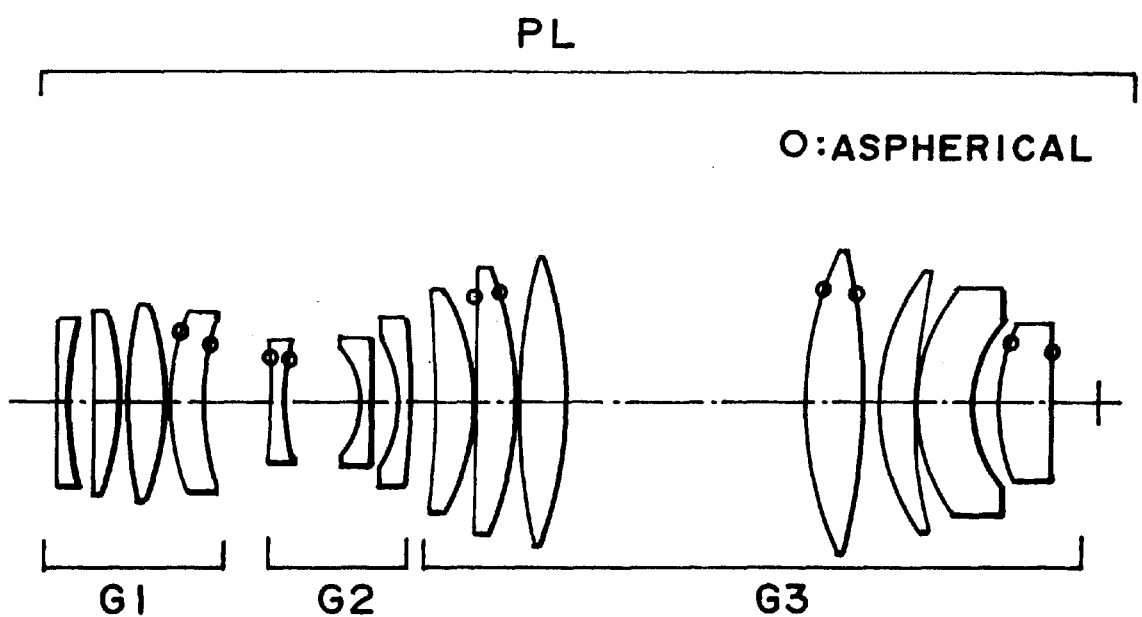
FIG. 4 is a lens sectional view of a projection optical system for use in a projection exposure apparatus, according to Numerical Example 2 of the present invention.
Figure 5:
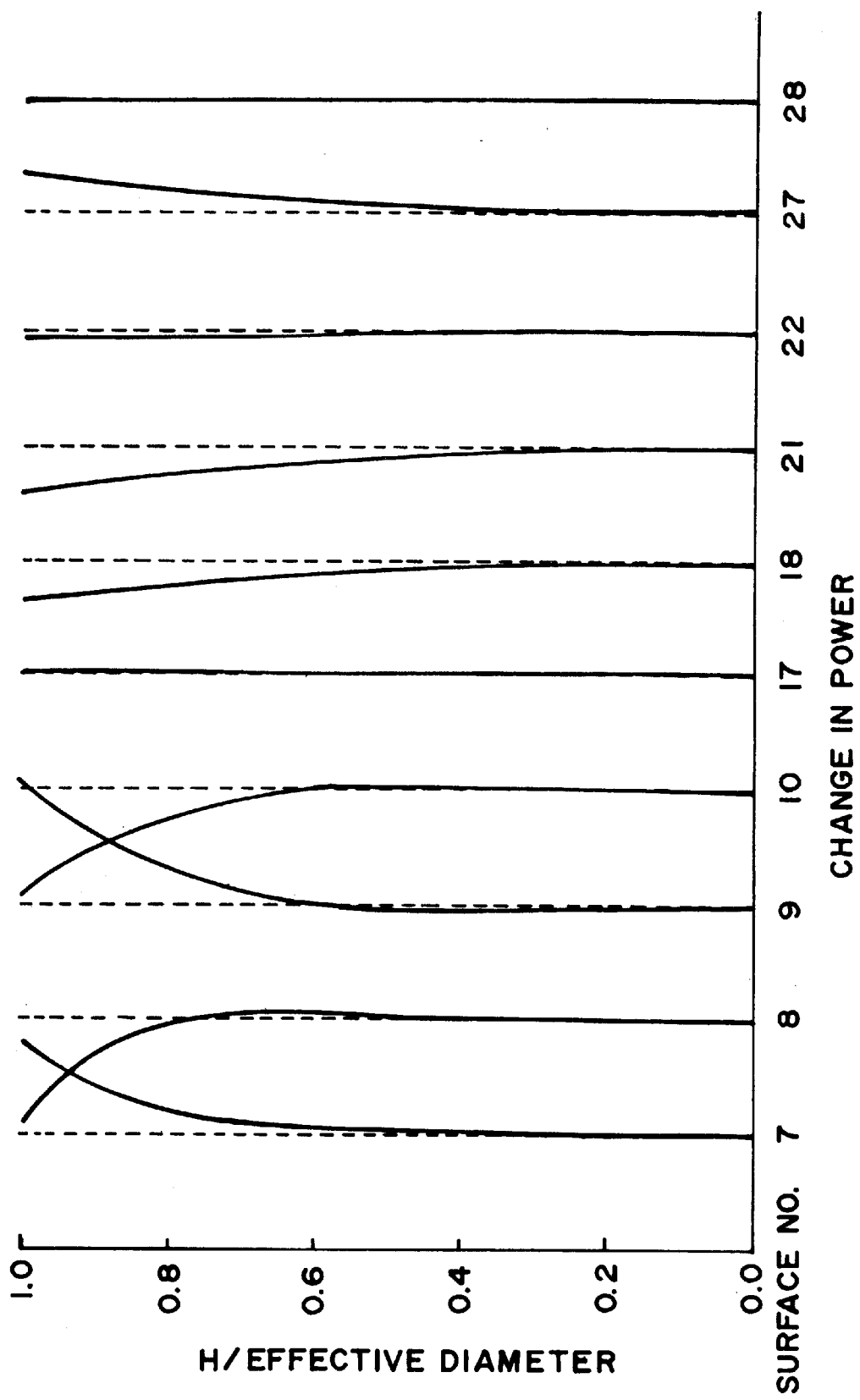
FIG. 5 is a graph for explaining changes in a local curvature power of an aspherical surface of a projection optical system according to Numerical Example 2.
Figure 6:
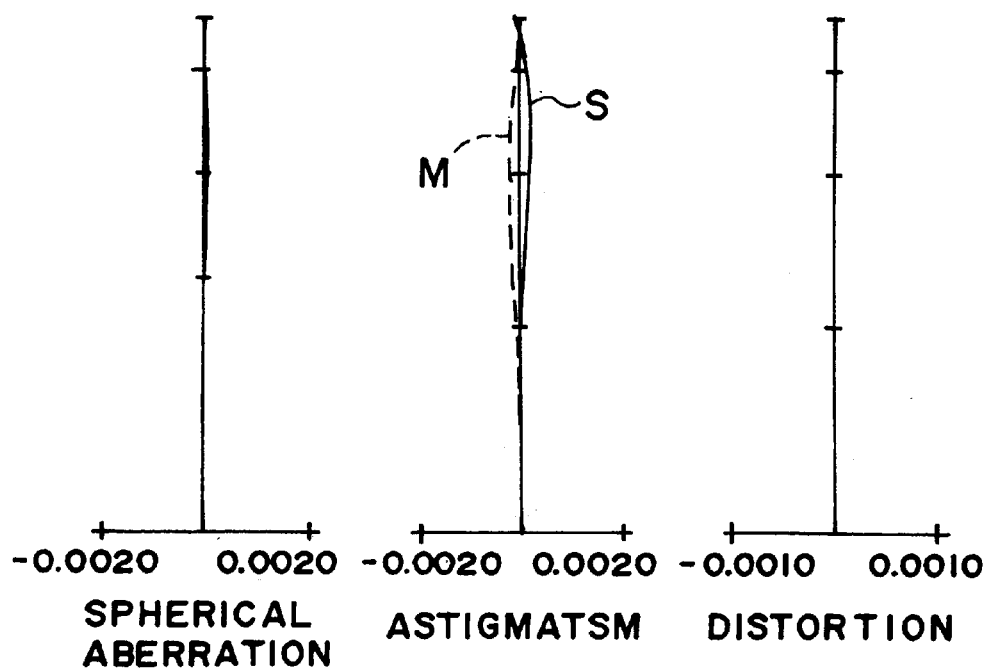
FIG. 6 illustrates aberrations of a projection optical system according to Numerical Example 2.
Figure 6:
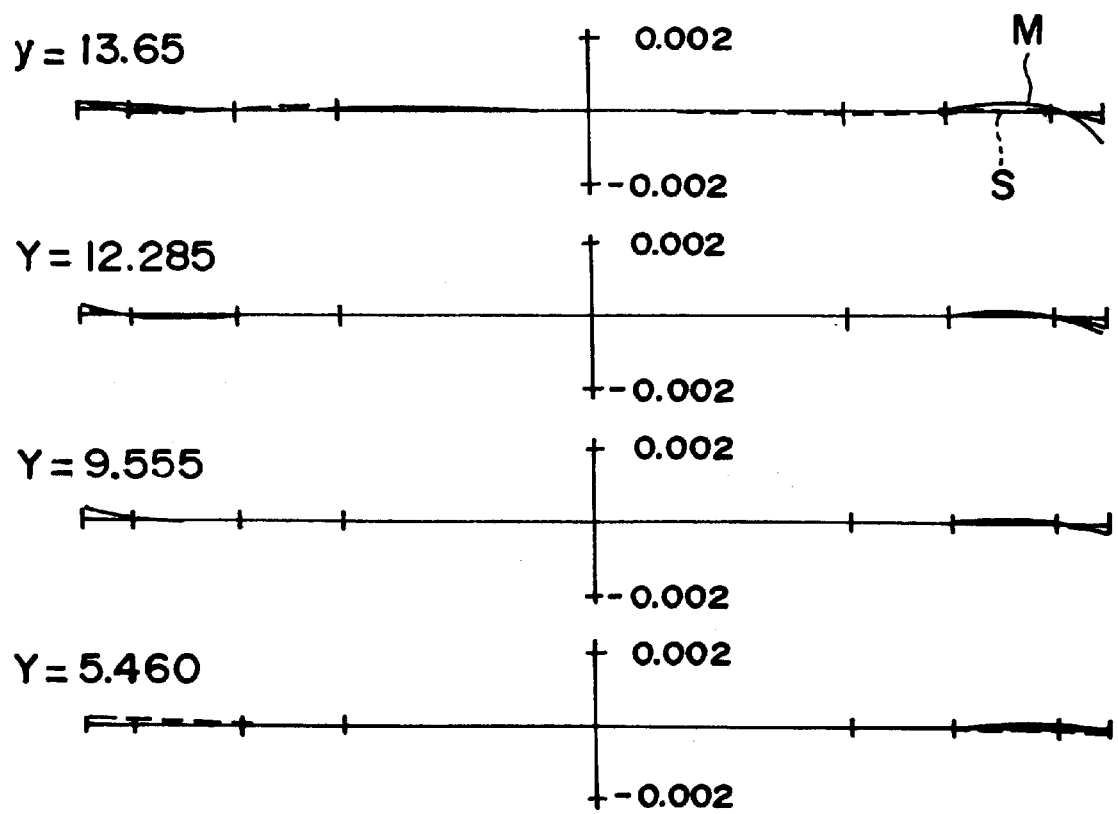

FIG. 4 is a lens sectional view of a projection optical system for use in a projection exposure apparatus, according to Numerical Example 2 of the present invention. FIG. 5 is a graph for explaining changes in a local curvature power of an aspherical surface of a projection optical system according to Numerical Example 2. FIG. 6 illustrates aberrations of a projection optical system according to Numerical Example 2.

Figure 7:
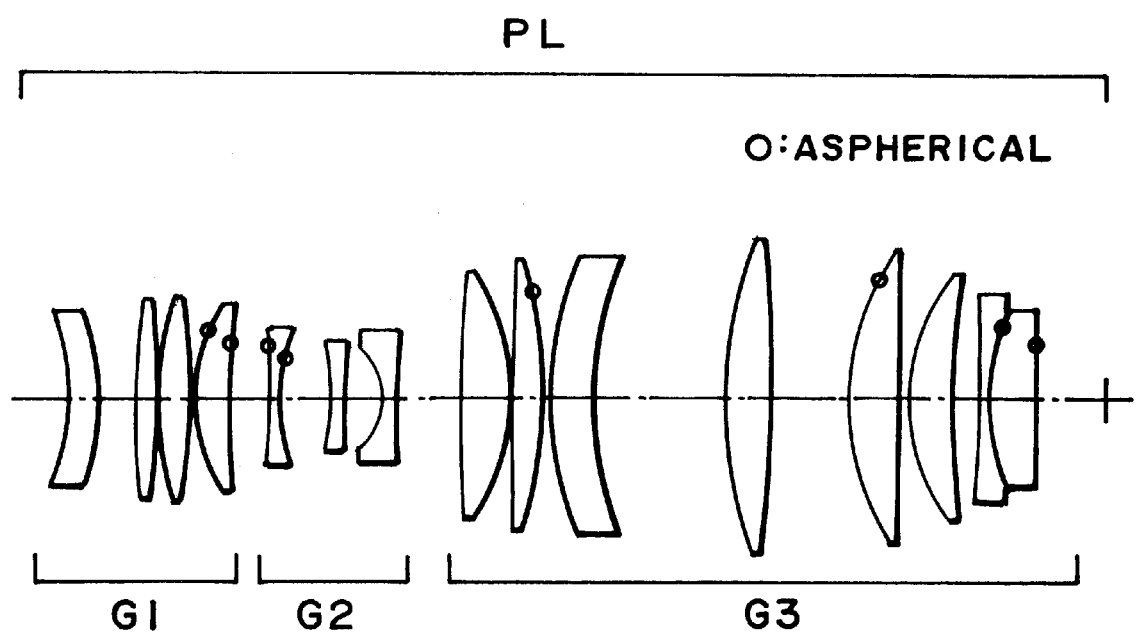
FIG. 7 is a lens sectional view of a projection optical system for use in a projection exposure apparatus, according to Numerical Example 3 of the present invention.
Figure 8:
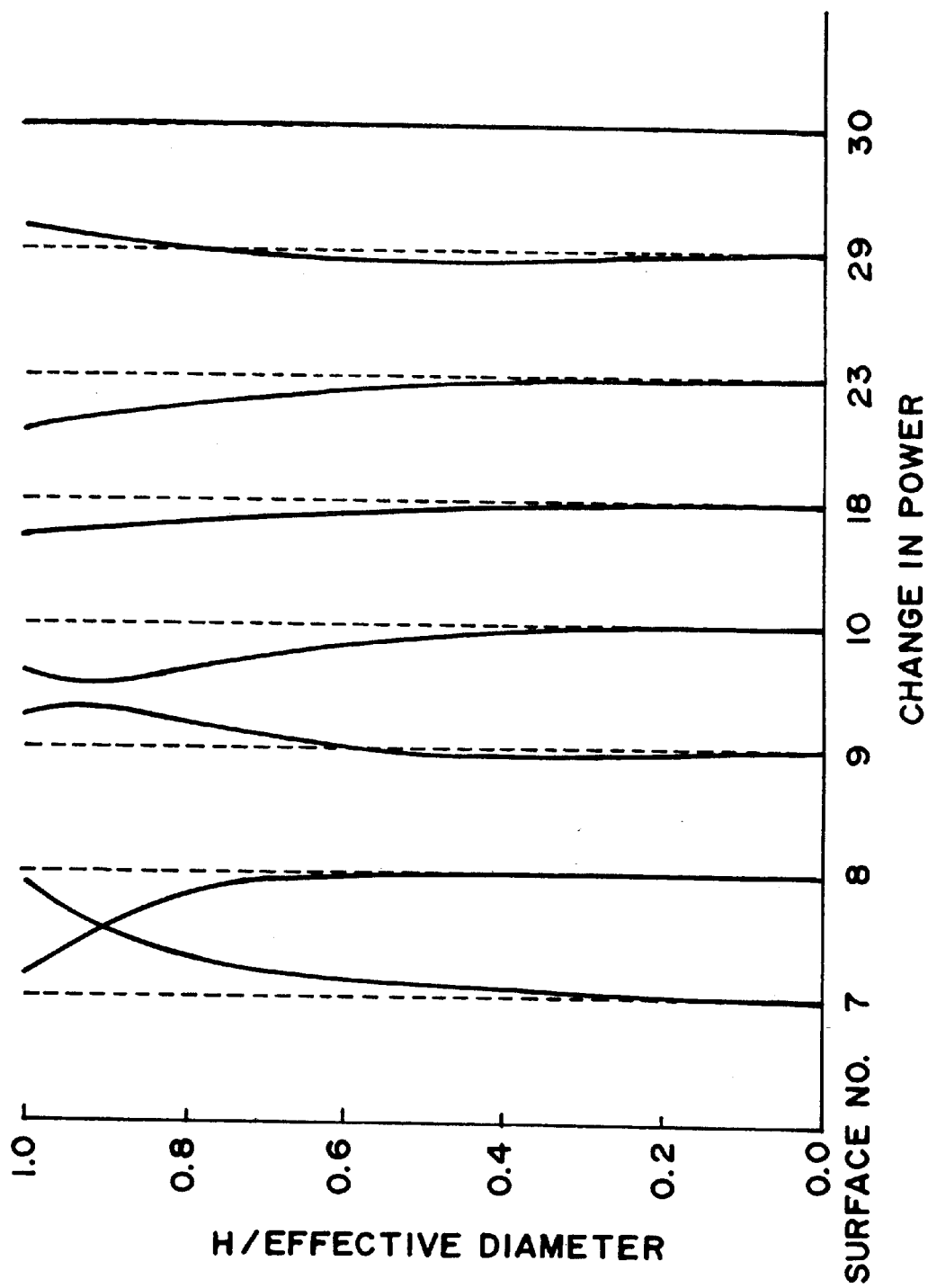
FIG. 8 is a graph for explaining changes in a local curvature power of an aspherical surface of a projection optical system according to Numerical Example 3.
Figure 9:
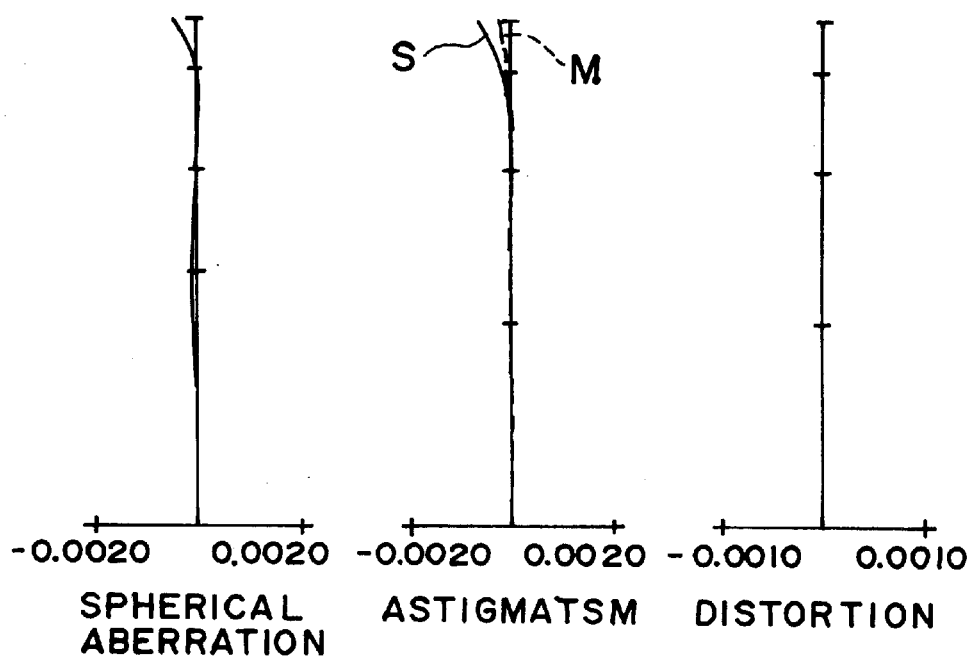
FIG. 9 illustrates aberrations of a projection optical system according to Numerical Example 3.
Figure 9:
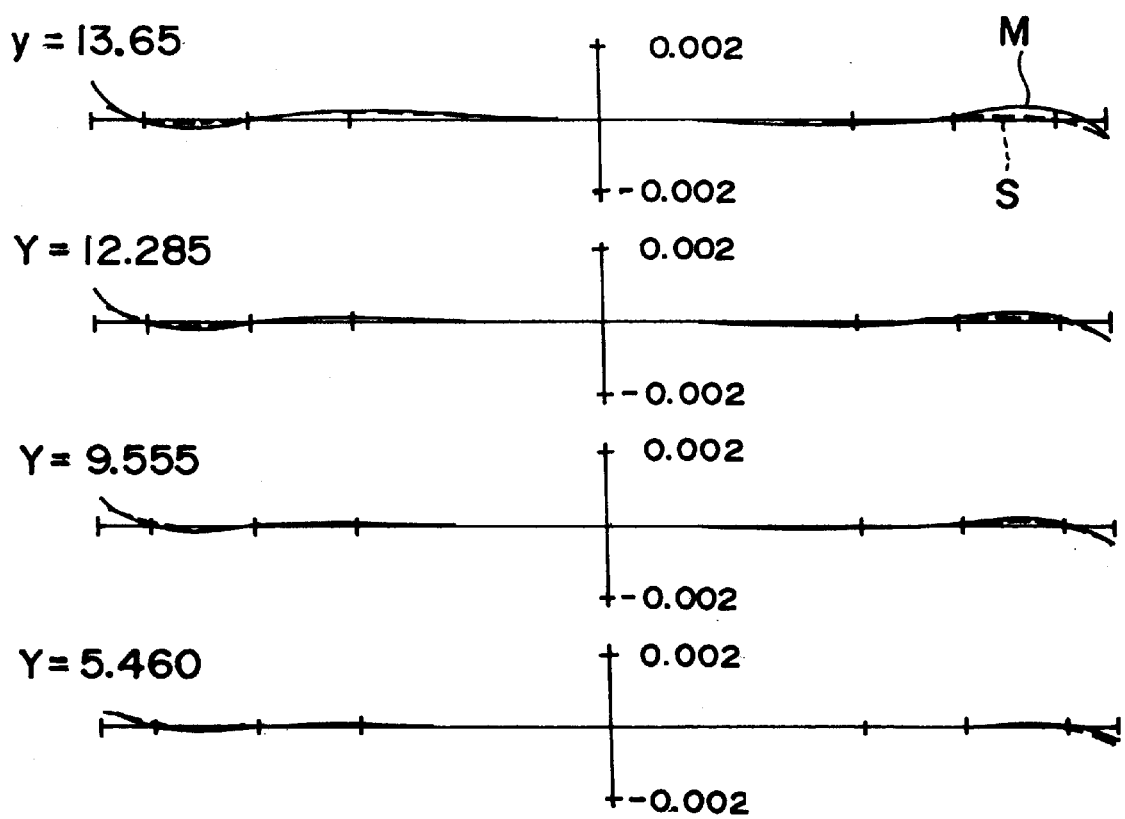

FIG. 7 is a lens sectional view of a projection optical system for use in a projection exposure apparatus, according to Numerical Example 3 of the present invention. FIG. 8 is a graph for explaining changes in a local curvature power of an aspherical surface of a projection optical system according to Numerical Example 3. FIG. 9 illustrates aberrations of a projection optical system according to Numerical Example 3.

Figure 10:
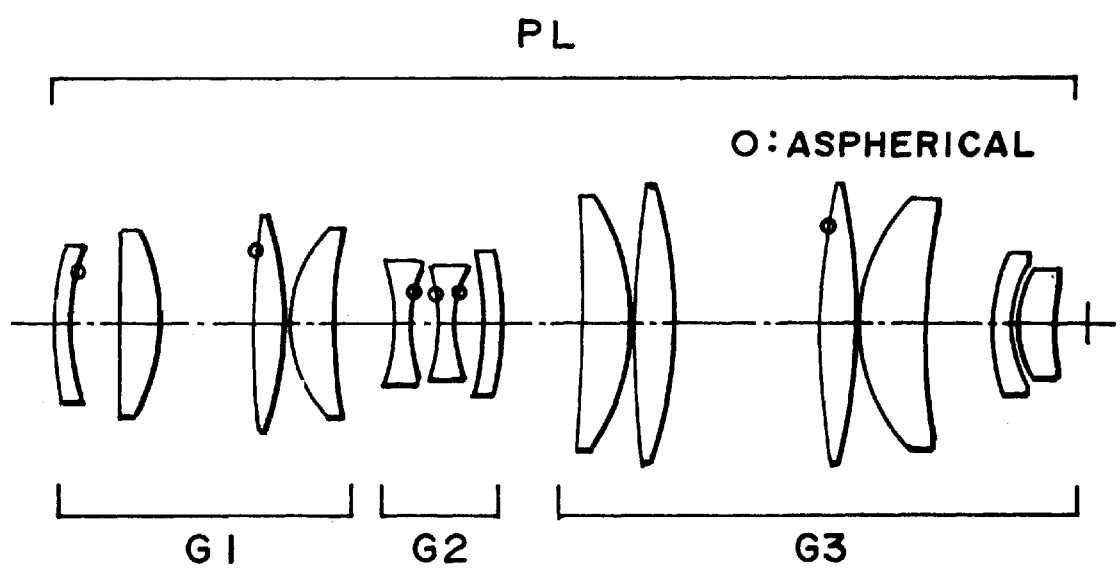
FIG. 10 is a lens sectional view of a projection optical system for use in a projection exposure apparatus, according to Numerical Example 4 of the present invention.
Figure 11:
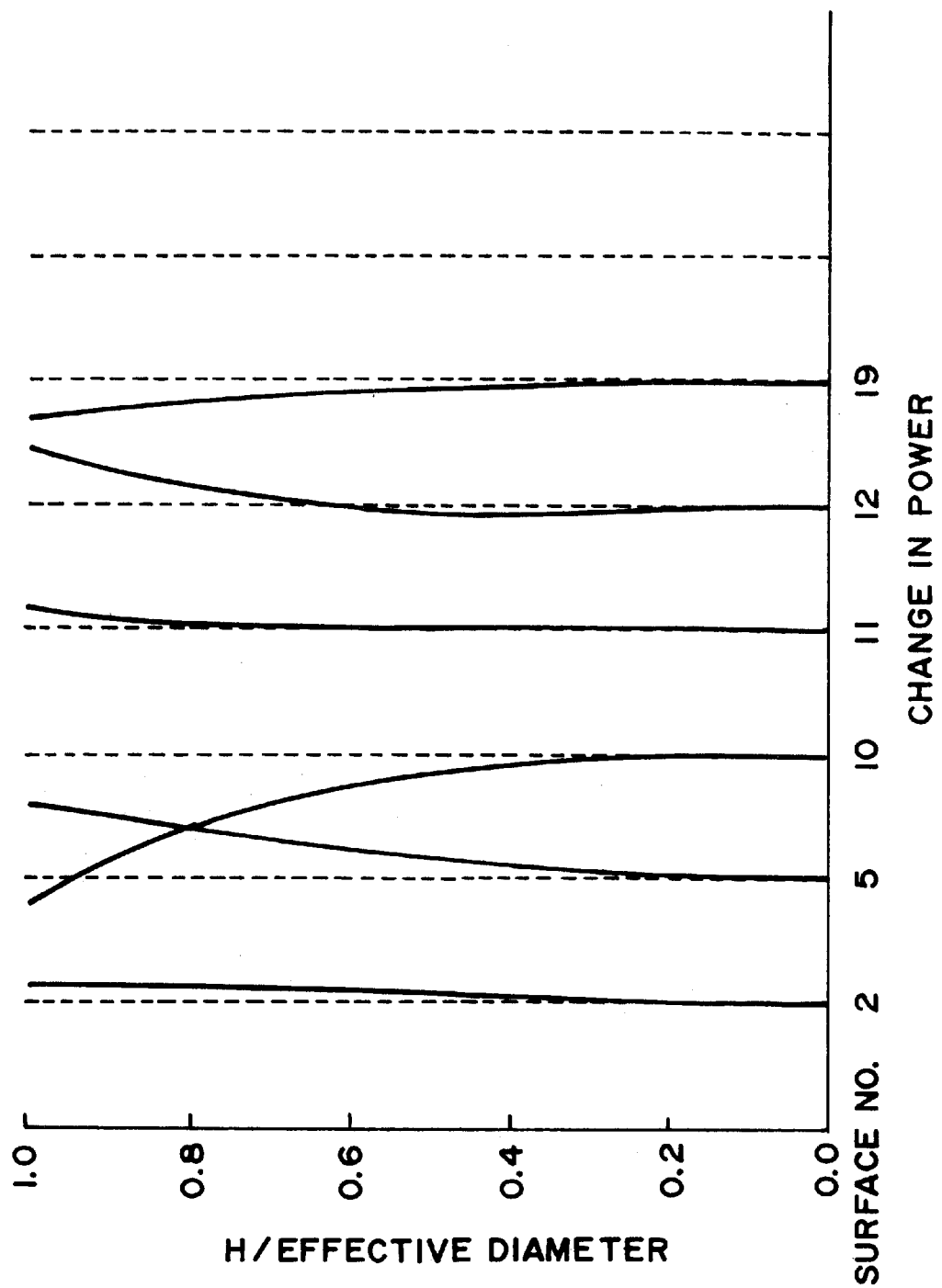
FIG. 11 is a graph for explaining changes in a local curvature power of an aspherical surface of a projection optical system according to Numerical Example 4.
Figure 12:
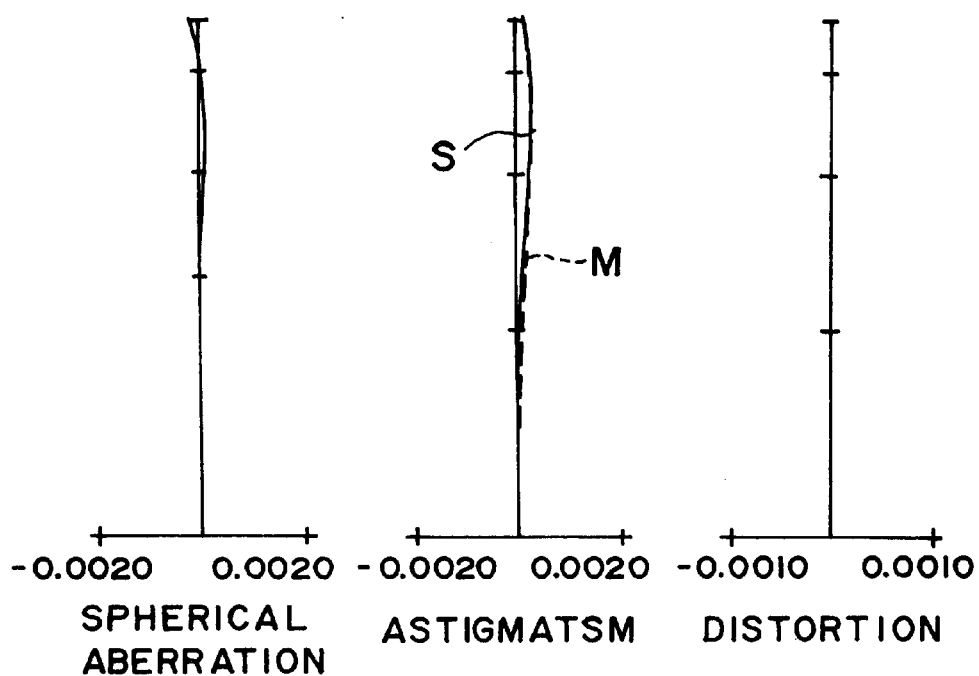
FIG. 12 illustrates aberrations of a projection optical system according to Numerical Example 4.
Figure 12:
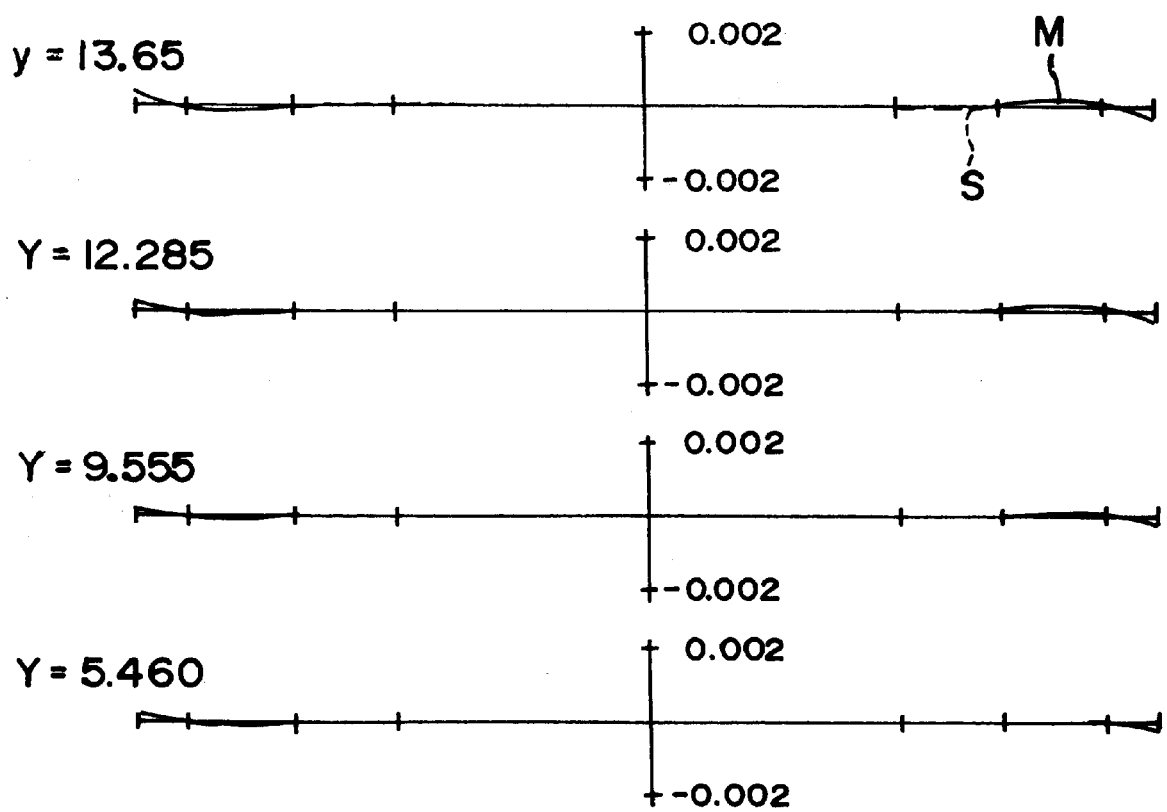

FIG. 10 is a lens sectional view of a projection optical system for use in a projection exposure apparatus, according to Numerical Example 4 of the present invention. FIG. 11 is a graph for explaining changes in a local curvature power of an aspherical surface of a projection optical system according to Numerical Example 4. FIG. 12 illustrates aberrations of a projection optical system according to Numerical Example 4.

Figure 14:
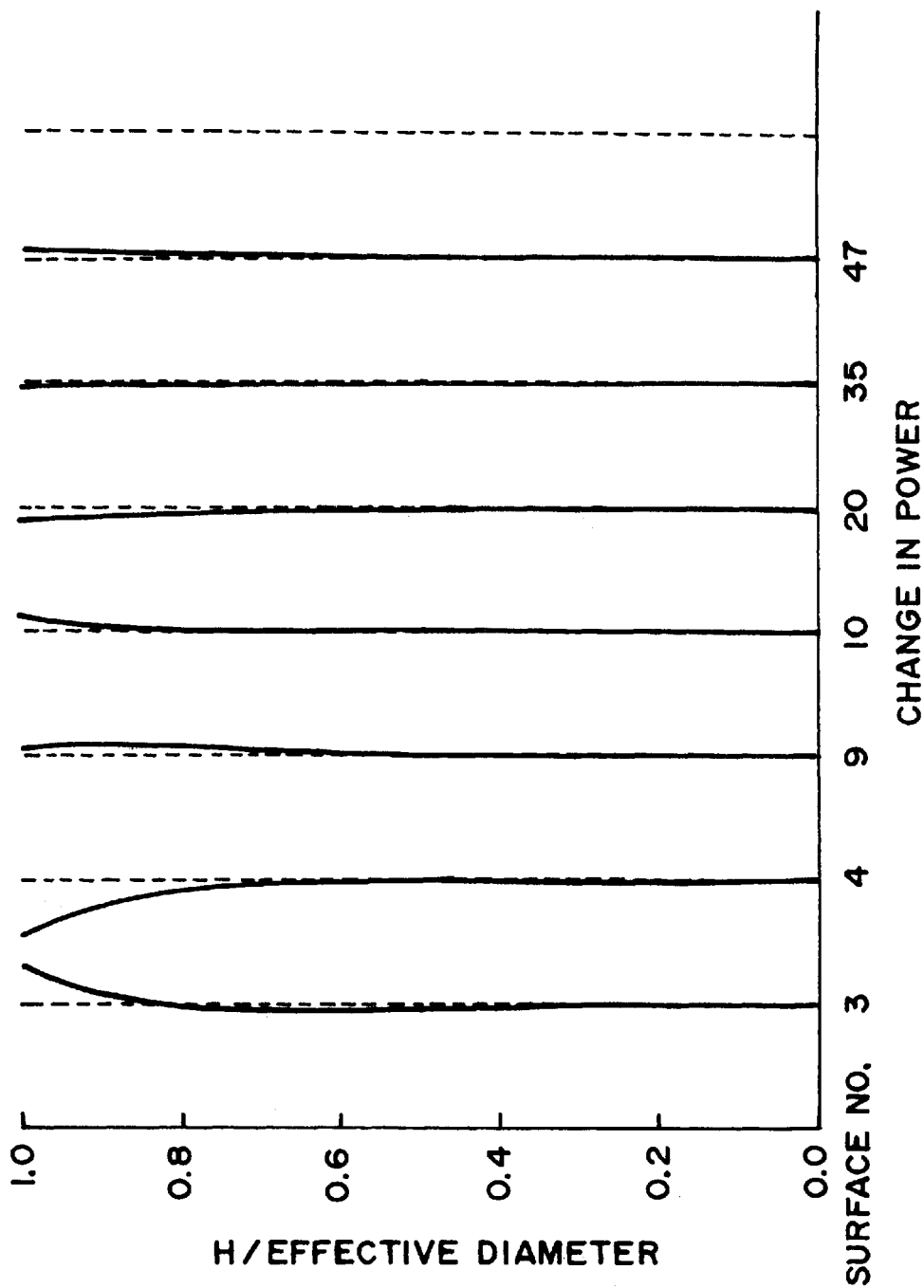
FIG. 14 is a graph for explaining changes in local curvature power of an aspherical surface of a projection optical system according to Numerical Example 5.
Figure 15:
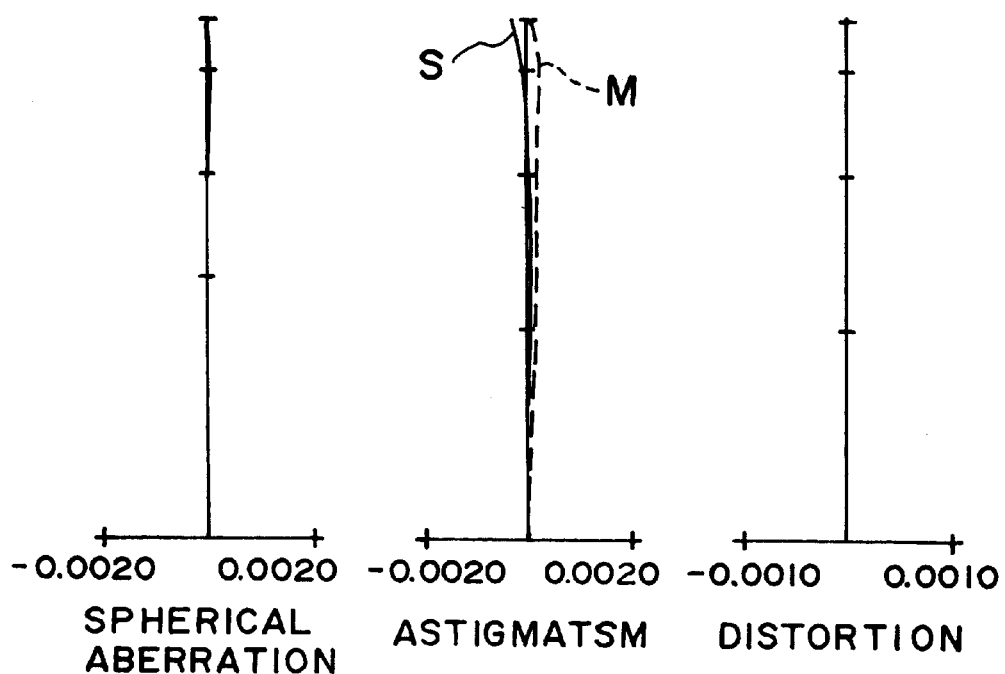
FIG. 15 illustrates aberrations of a projection optical system according to Numerical Example 5.
Figure 15:
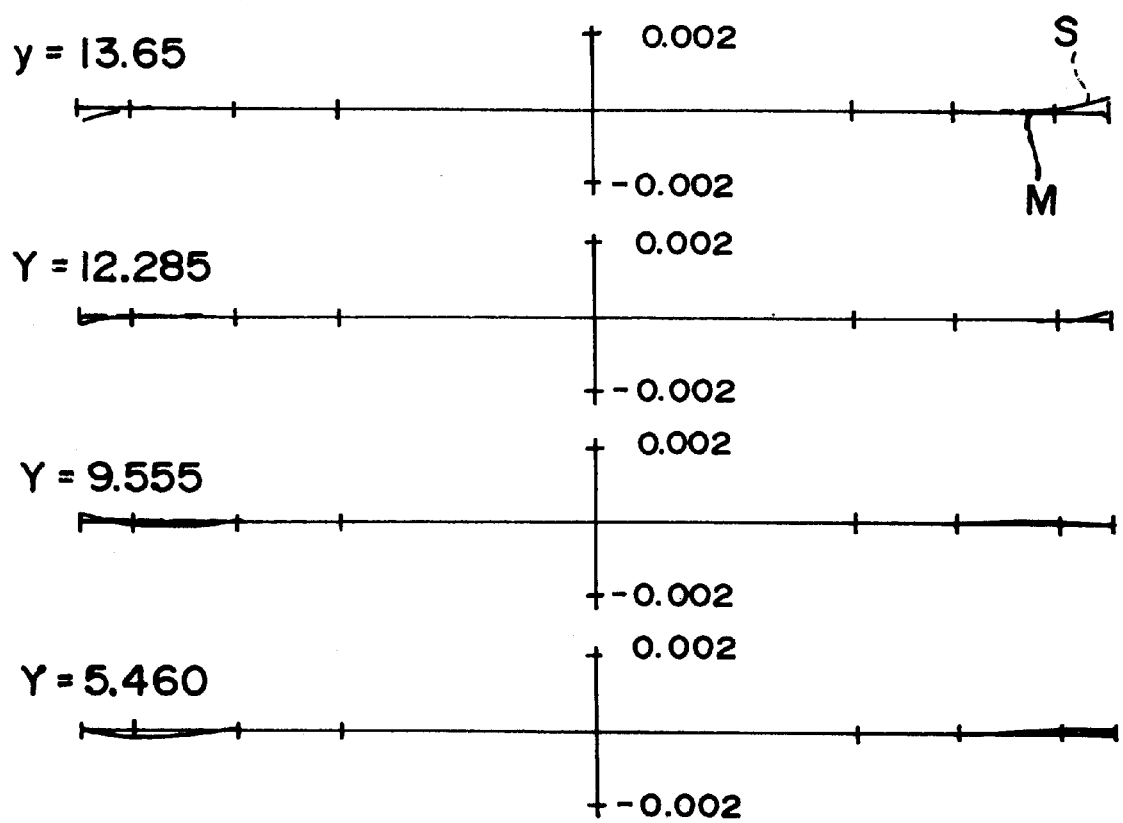

FIG. 13 is a lens sectional view of a projection optical system for use in a projection exposure apparatus, according to Numerical Example 5 of the present invention. FIG. 14 is a graph explaining changes in a local curvature power of an aspherical surface of a projection optical system according to Numerical Example 5. FIG. 15 illustrates aberrations of a projection optical system according to Numerical Example 5.

Figure 16:
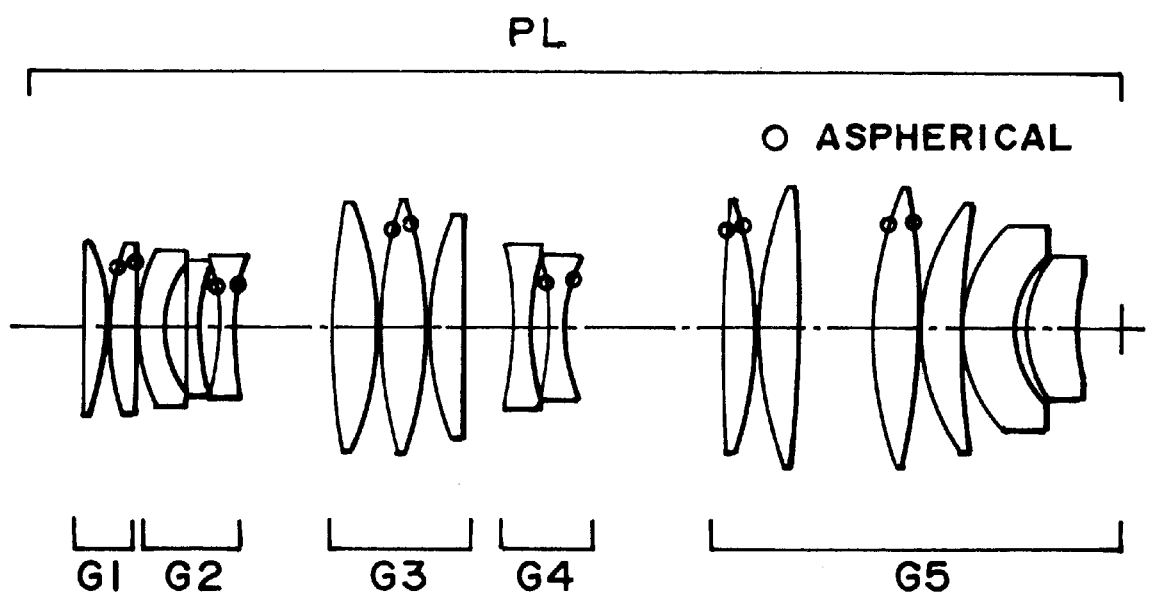
FIG. 16 is a lens sectional view of a projection optical system for use in a projection exposure apparatus, according to Numerical Example 6 of the present invention.
Figure 17:
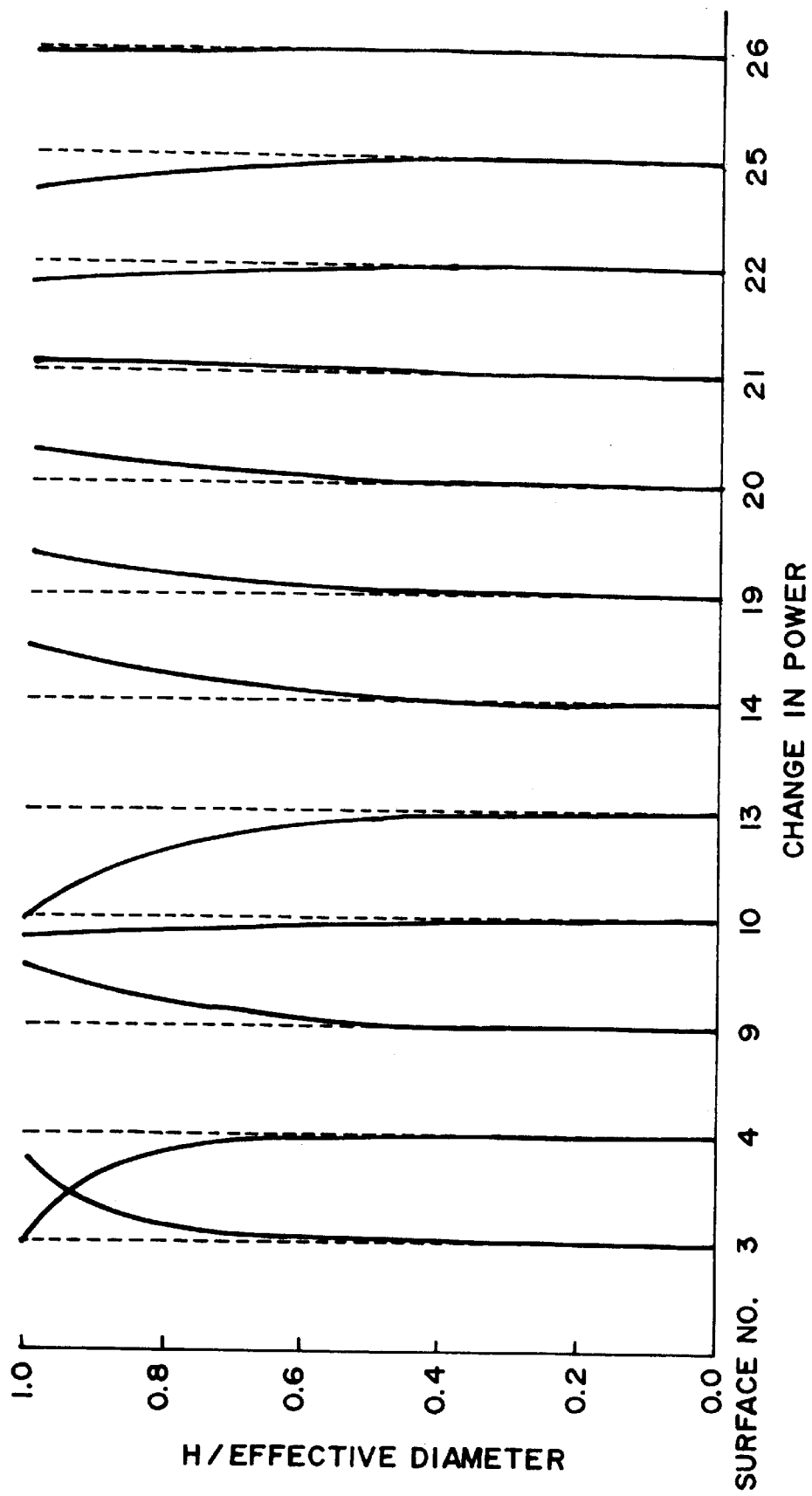
FIG. 17 is a graph for explaining changes in a local curvature power of an aspherical surface of a projection optical system according to Numerical Example 6.
Figure 18:
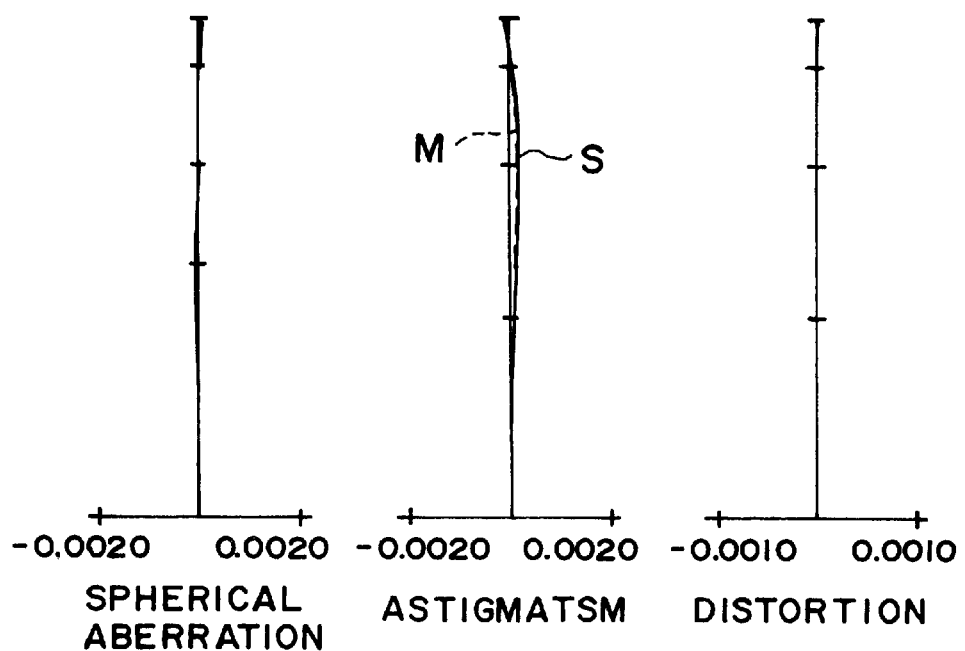
FIG. 18 illustrates aberrations of a projection optical system according to Numerical Example 6.
Figure 18:
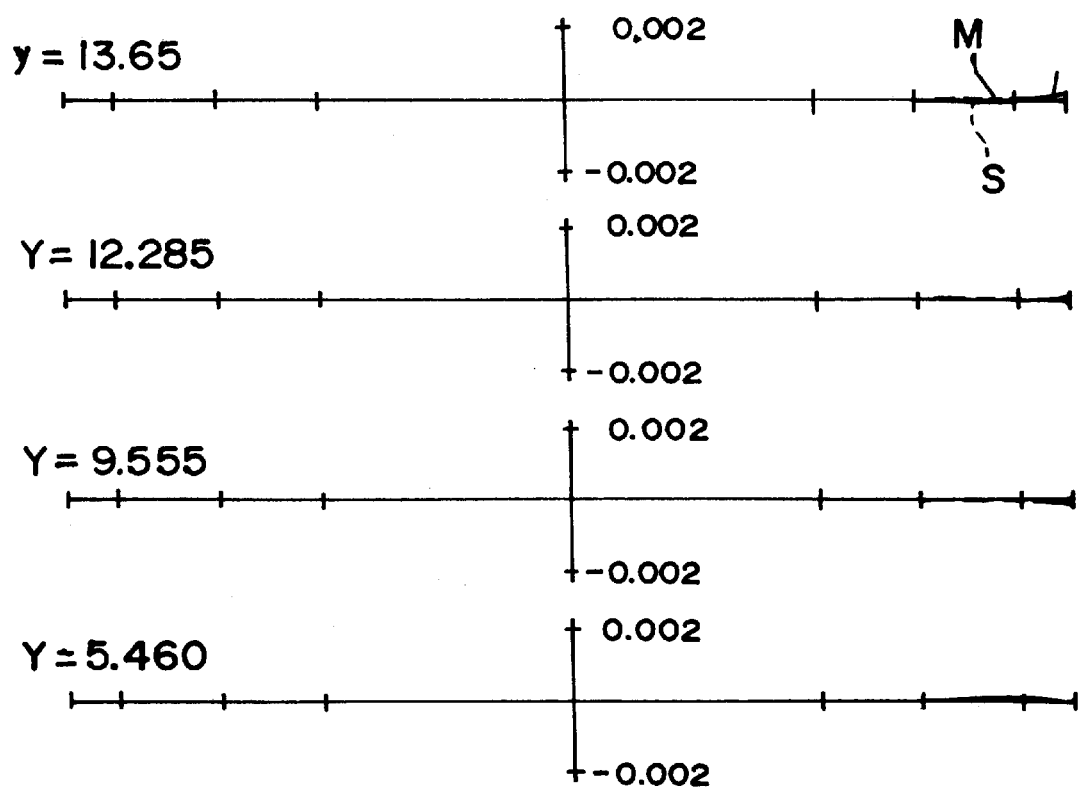

FIG. 16 is a lens sectional view of a projection optical system for use in a projection exposure apparatus, according to Numerical Example 6 of the present invention. FIG. 17 is a graph for explaining changes in a local curvature power of an aspherical surface of a projection optical system according to Numerical Example 6. FIG. 18 illustrates aberrations of a projection optical system according to Numerical Example 6.

Figure 19:
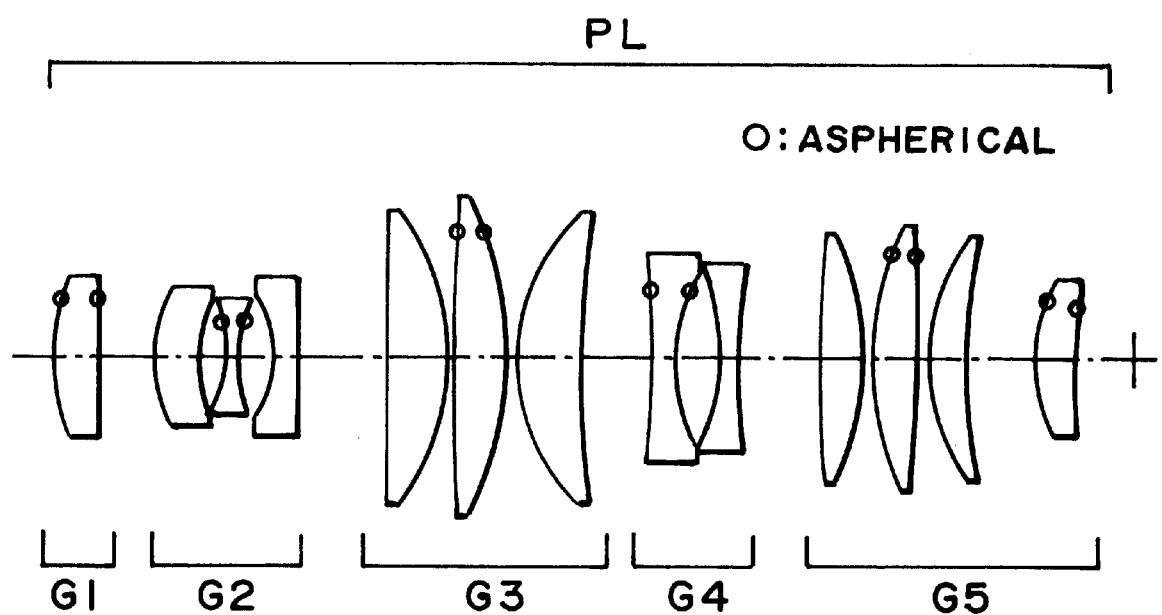
FIG. 19 is a lens sectional view of a projection optical system for use in a projection exposure apparatus, according to Numerical Example 7 of the present invention.
Figure 20:
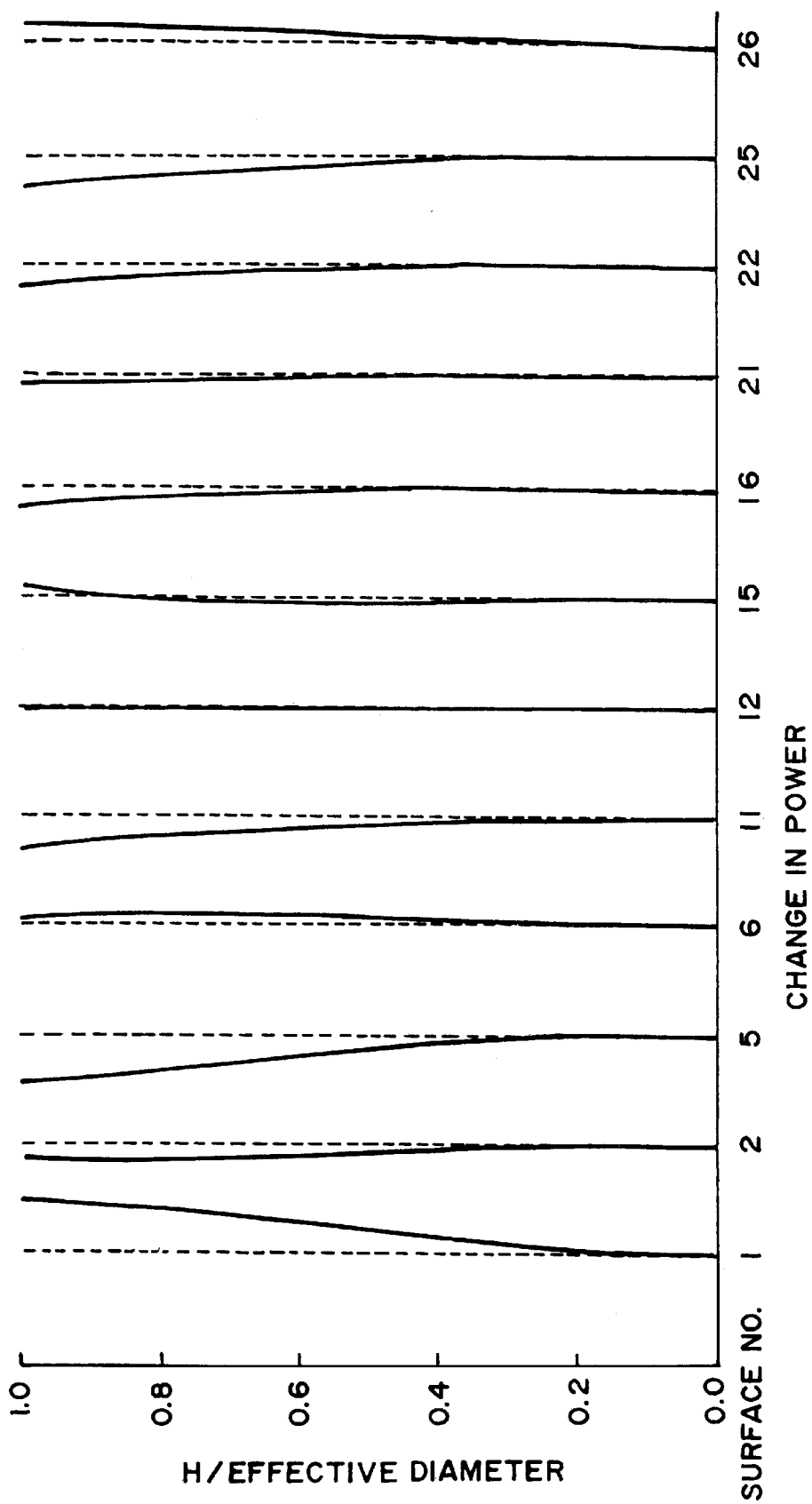
FIG. 20 is a graph for explaining changes in a local curvature power of an aspherical surface of a projection optical system according to Numerical Example 7.
Figure 21:
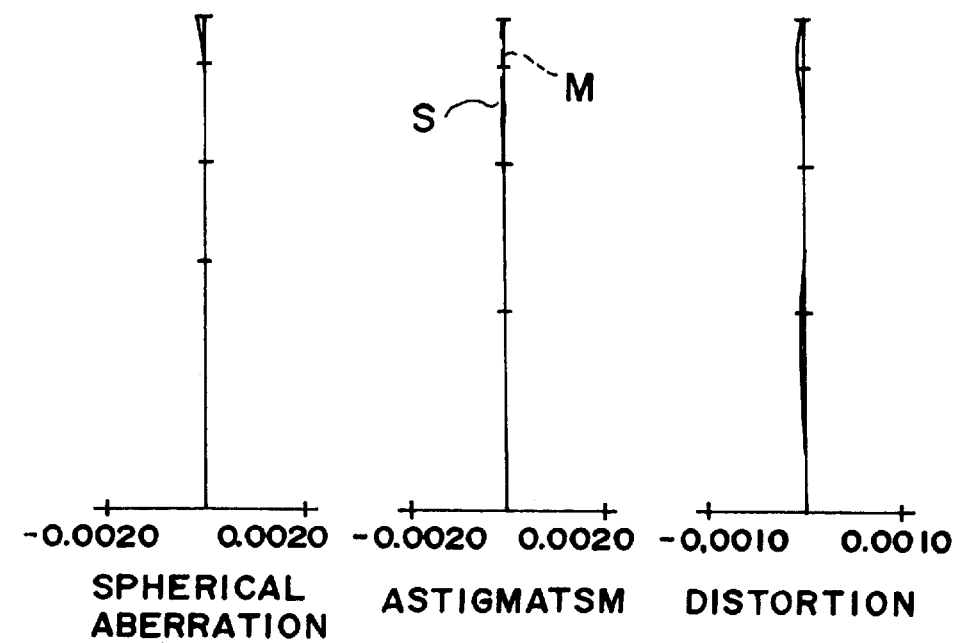
FIG. 21 illustrates aberrations of a projection optical system according to Numerical Example 7.
Figure 21:
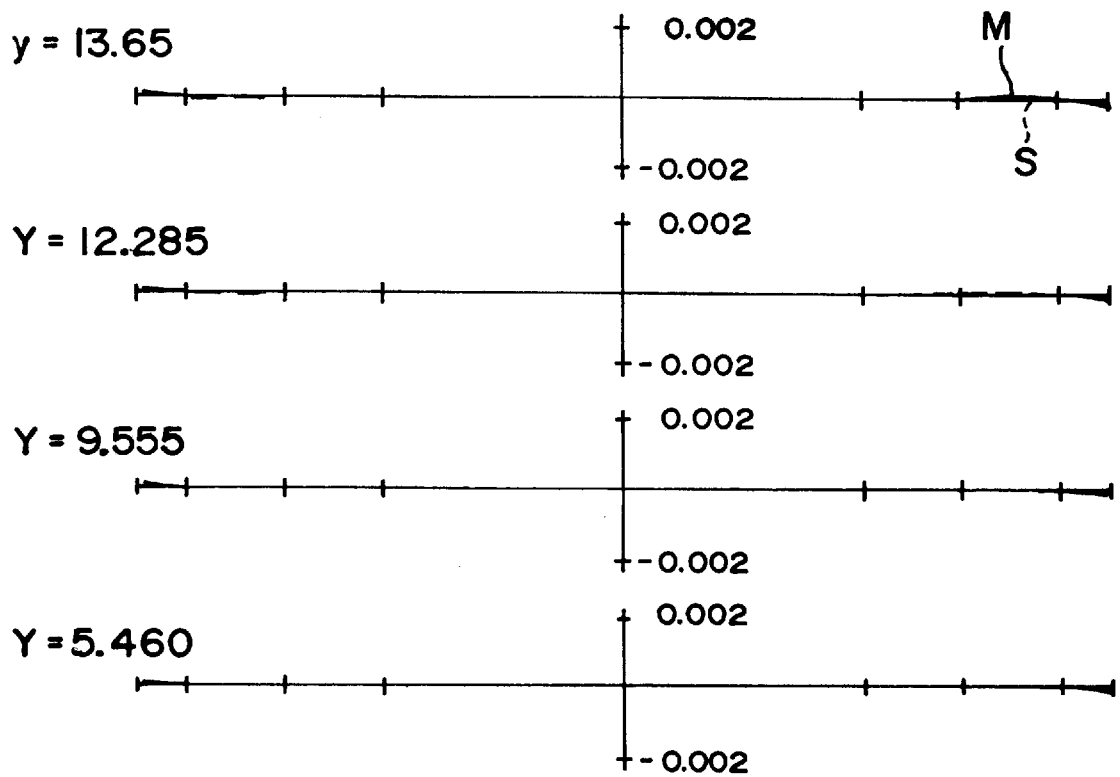

FIG. 19 is a lens sectional view of a projection optical system for use in a projection exposure apparatus, according to Numerical Example 7 of the present invention. FIG. 20 is a graph for explaining changes in a local curvature power of an aspherical surface of a projection optical system according to Numerical Example 7. FIG. 21 illustrates aberrations of a projection optical system according to Numerical Example 7.

Figure 22:
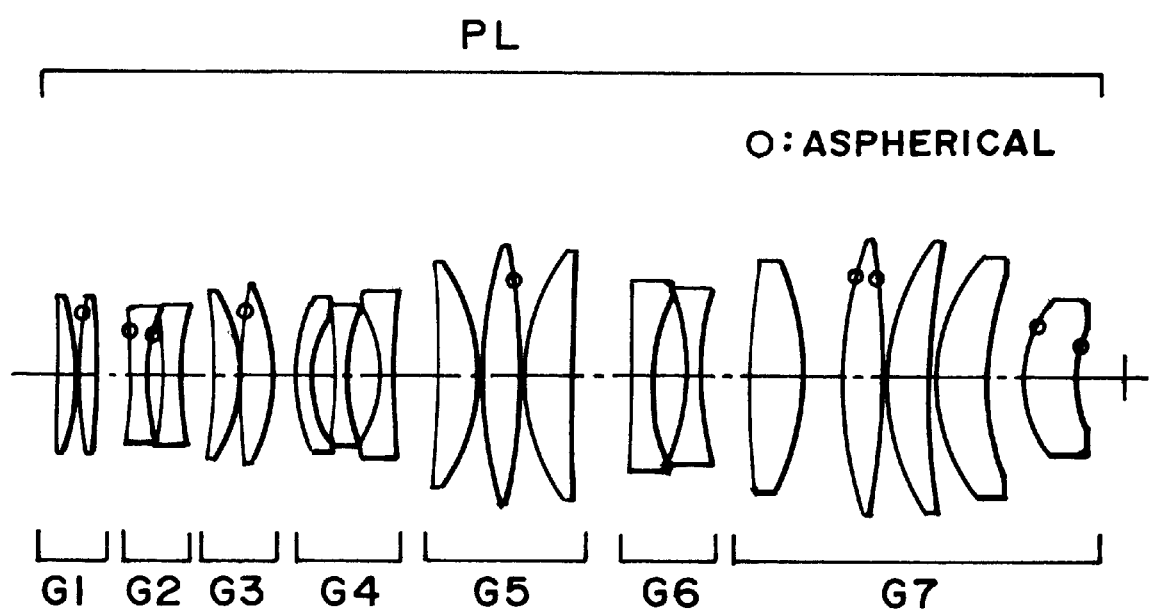
FIG. 22 is a lens sectional view of a projection optical system for use in a projection exposure apparatus, according to Numerical Example 8 of the present invention.
Figure 23:
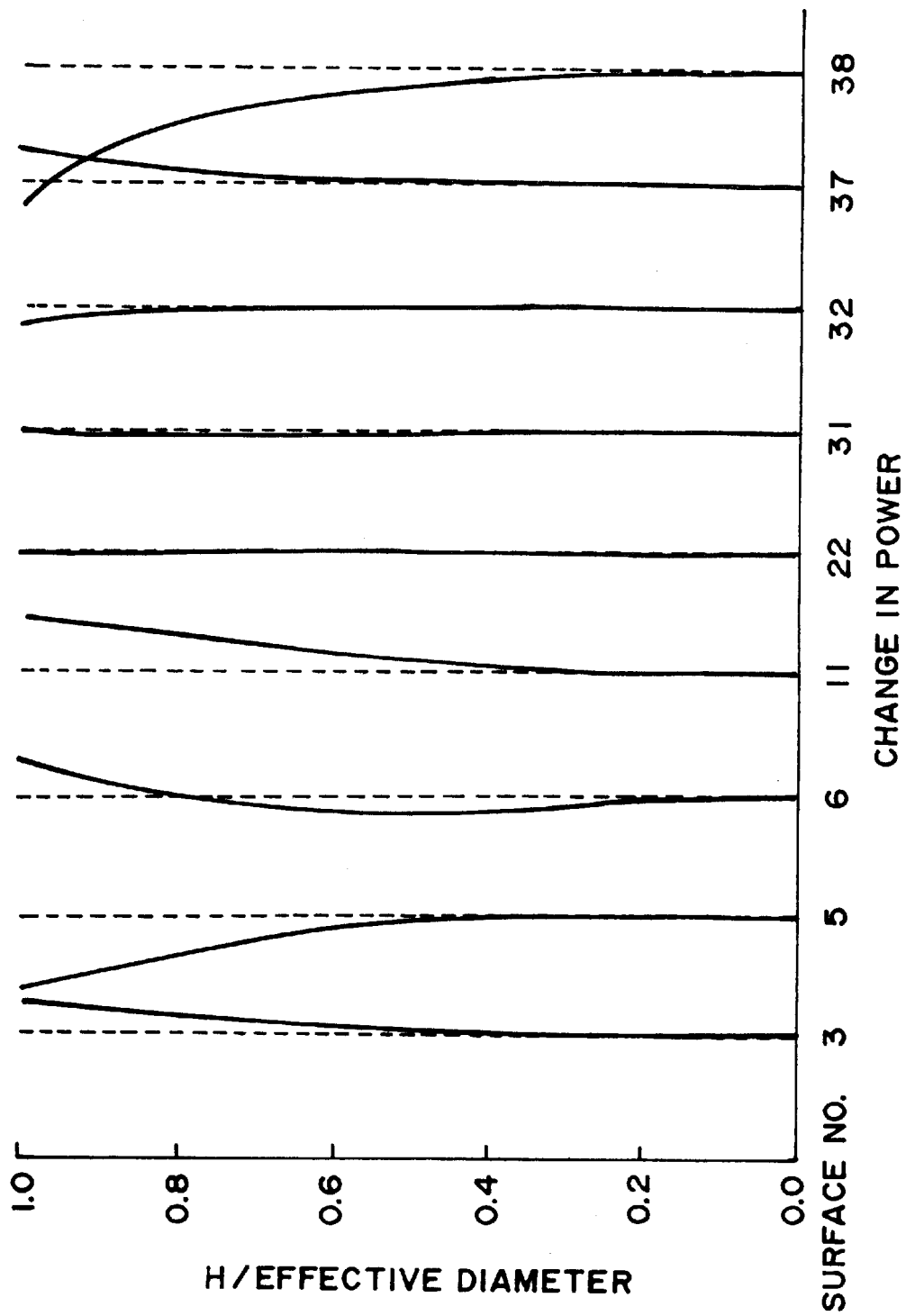
FIG. 23 is a graph for explaining changes in a local curvature power of an aspherical surface of a projection optical system according to Numerical Example 8.
Figure 24:
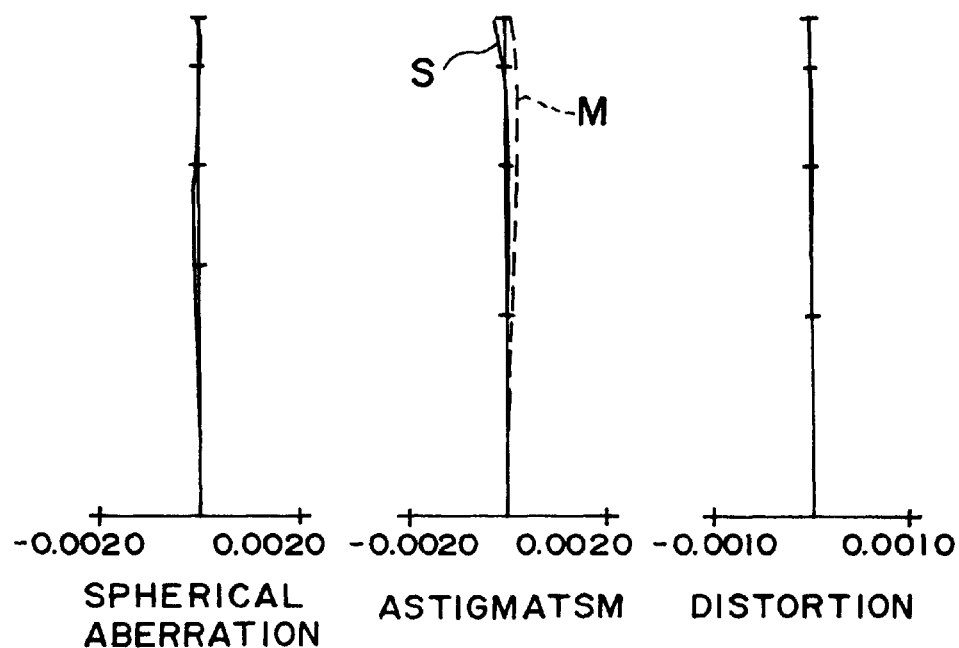
FIG. 24 illustrates aberrations of a projection optical system according to Numerical Example 8.
Figure 24:
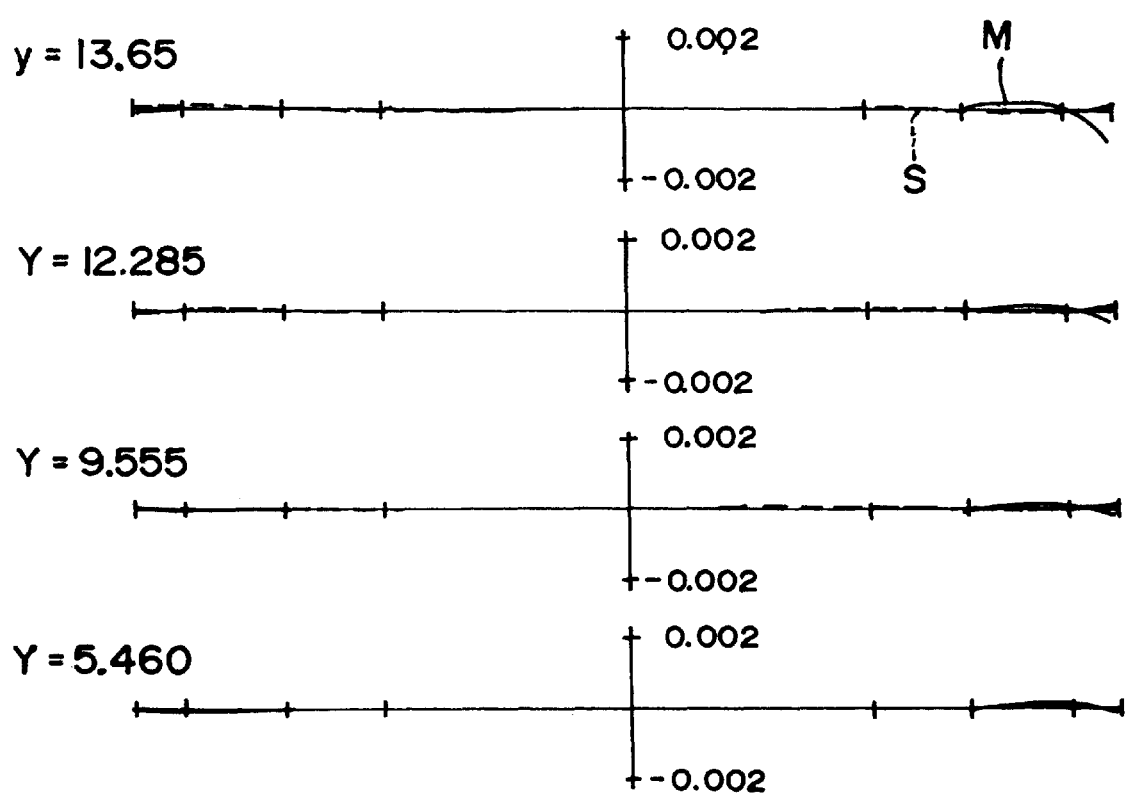

FIG. 22 is a lens sectional view of a projection optical system for use in a projection exposure apparatus, according to Numerical Example 8 of the present invention. FIG. 23 is a graph for explaining changes in a local curvature power of an aspherical surface of a projection optical system according to Numerical Example 8. FIG. 24 illustrates aberrations of a projection optical system according to Numerical Example 8.

Figure 25:
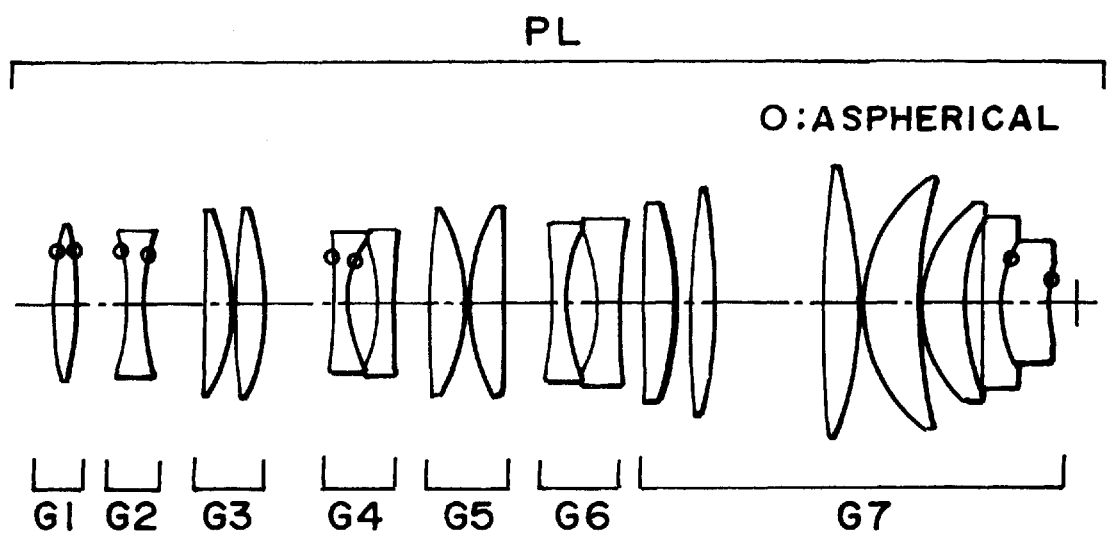
FIG. 25 is a lens sectional view of a projection optical system for use in a projection exposure apparatus, according to Numerical Example 9 of the present invention.
Figure 26:
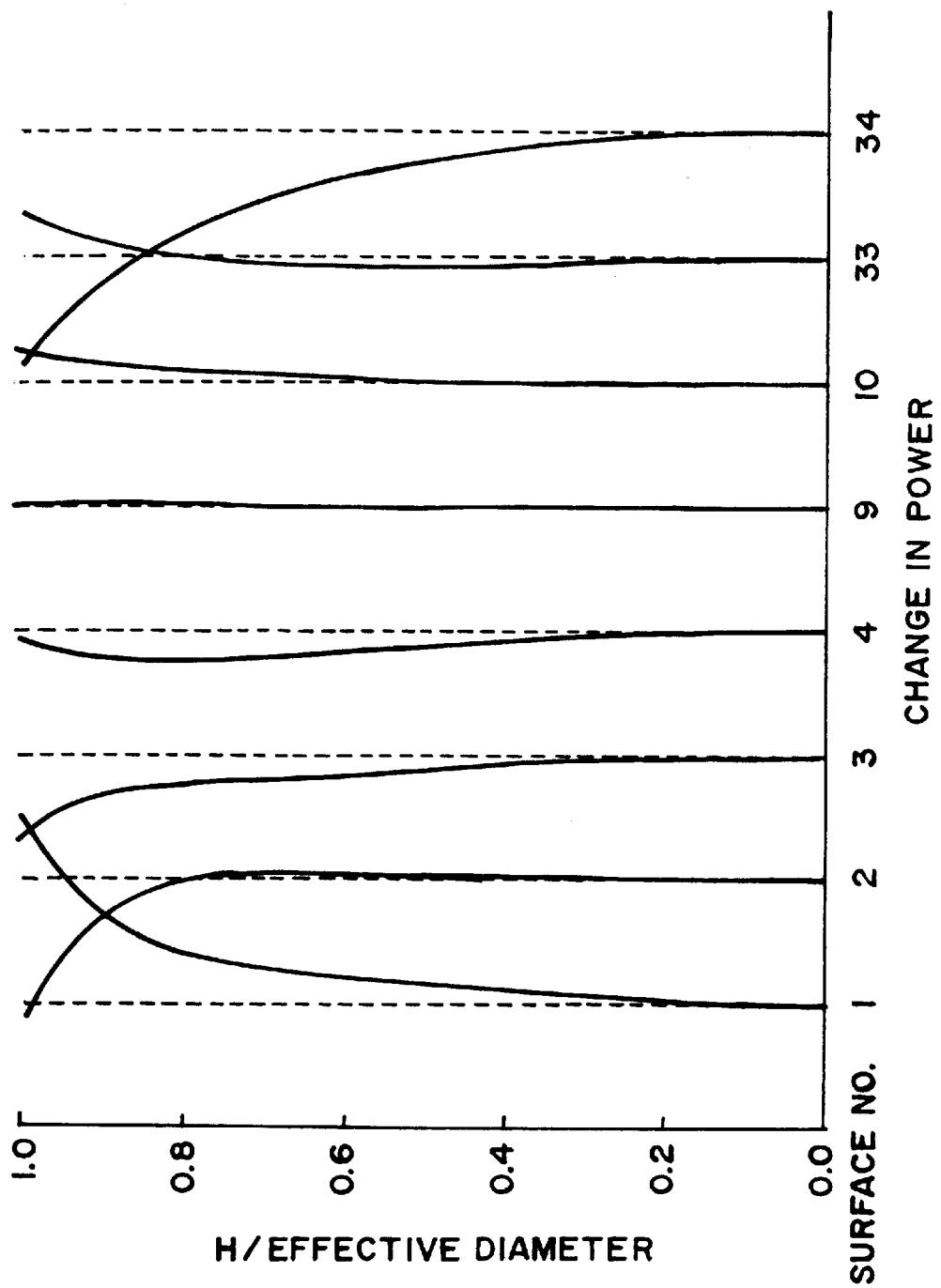
FIG. 26 is a graph for explaining changes in a local curvature power of an aspherical surface of a projection optical system according to Numerical Example 9.
Figure 27:
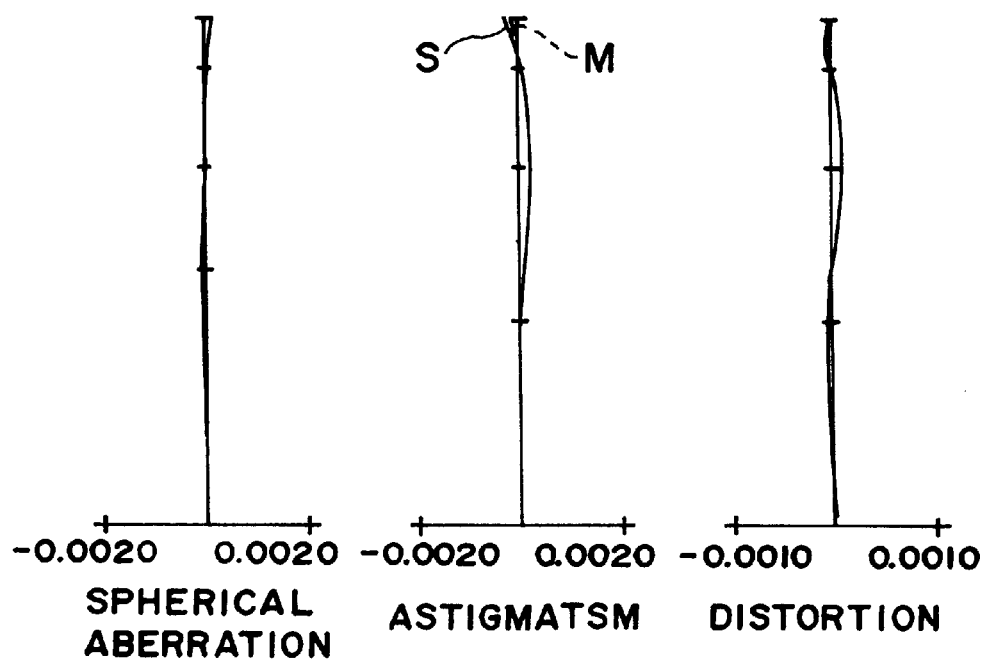
FIG. 27 illustrates aberrations of a projection optical system according to Numerical Example 9.
Figure 27:
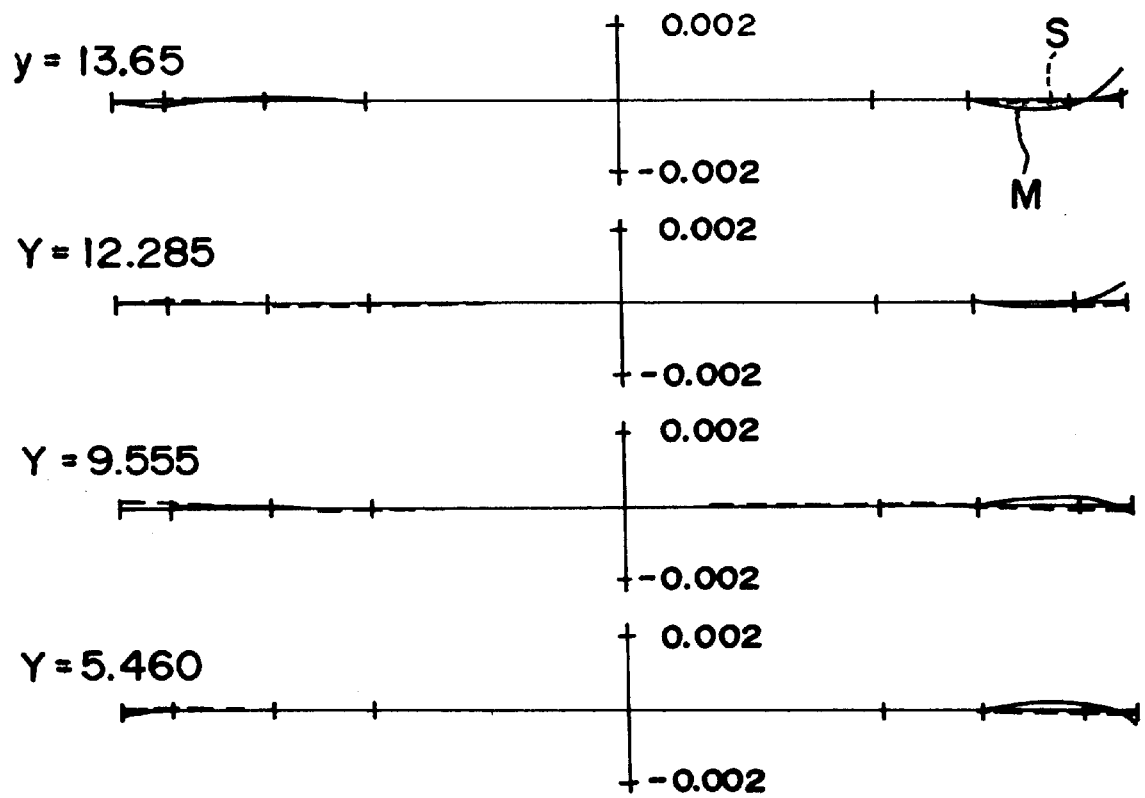

FIG. 25 is a lens sectional view of a projection optical system for use in a projection exposure apparatus, according to Numerical Example 9 of the present invention. FIG. 26 is a graph for explaining changes in a local curvature of power of an aspherical surface of a projection optical system according to Numerical Example 9. FIG. 27 illustrates aberrations of a projection optical system according to Numerical Example 9.

In these lens sectional views, a reference character PL denotes a projection optical system, and a reference character Gi denotes the i-th lens group (i-th group) of the projection optical system, in an order from the object side (conjugate side of longer distance).

Denoted at IP is an image plane which corresponds to a wafer surface, when the projection optical system is used in a projection exposure apparatus. In the lens groups Gi, those lens groups having an odd number assigned for "i" are lens groups having a positive refractive power, while those lens groups having an even number assigned for "i" are lens groups having a negative refractive power.

Also, those lens surfaces with a small circle added thereto are aspherical surfaces.

In each of the Numerical Examples 1–4 shown in FIGS. 1, 4, 7 and 10, respectively, the projection optical system comprises three lens groups (three-group type), which have positive, negative, and positive refractive powers, respectively, in an order from the object side.

In each of Numerical Examples 5–7 shown in FIGS. 13, 16 and 19, respectively, the projection optical system comprises five lens groups (five-group type), which have positive, negative, positive, negative and positive refractive powers, respectively, in an order from the object side.

In each of Numerical Examples 8 and 9 shown in FIGS. 22 and 25, the projection optical system comprises seven lens groups (seven-group type), which have positive, negative, positive, negative, positive, negative, and positive refractive powers, respectively, in an order from the object side.

In these numerical examples, while appropriate power sharing is made through the whole lens system, aspherical surfaces are introduced to appropriate lens faces, by which a good optical performance is accomplished.

Projection optical systems according to the present invention provide a large numerical aperture and a wide exposure area.

To this end, the optical system as a whole comprises a plurality of lens groups including a lens group having a positive refractive power and a lens group having a negative refractive power, wherein the power sharing (refractive power sharing) is set appropriately.

A projection optical system according to the present invention includes at least one lens having aspherical surfaces formed on both sides (faces) thereof, by which a good optical performance is assured.

A projection optical system according to the present invention enables a larger numerical aperture and a wider exposure region, as compared with conventional projection optical systems. Based on this, it is still necessary to improve the freedom for aberration correction, in order to obtain a better imaging performance. In consideration of it, when one or more aspherical surface lenses are used, the or one of the aspherical surface lenses is formed with an aspherical surface on both sides (faces) thereof. Alternatively, all the aspherical surface lenses may have aspherical surfaces formed on both sides. A difference with respect to aberration correction, between an aspherical surface lens having aspherical surfaces formed on both sides thereof (hereinafter, "bi-aspherical surface lens") and an aspherical surface lens having an aspherical surface formed on only one side thereof (hereinafter, "mono-aspherical surface lens"), will be particularly notable in the case of a projection optical system wherein satisfactory aberration correction is required even up to higher order aberration regions.

In a projection optical system provided by all aspherical surface lenses, if there is no space for accommodating any additional lens, introduction of a bi-aspherical surface lens is very effective to widen the freedom for aberration correction considerably, without increasing the number of lenses and, in some cases, it decreases the number of lenses.

In the mono-aspherical surface lens, one face thereof is spherical or plane. As a result, while the aberration in a higher order region can be corrected, there still remains an influence of lower order aberration. It is, therefore, necessary to make some adjustment to assure total balance. With a bi-aspherical surface lens, however, correction of lower order and higher order aberrations can be made independently.

Further, for better imaging performance, in the present invention, the lens arrangement is determined also with respect to the power sharing. For, while the Petzval sum should be made smaller for correction of the curvature of field and astigmatism, this is determined in accordance with the power arrangement in an optical system regardless of whether there is an aspherical surface or not.

Thus, in one preferred form of the present invention, a relation such as defined in equation (1) below is preferably satisfied.

$$|L \times \phi| > 17 \tag{1}$$

where L is a conjugate distance (object-to-image distance) of a projection optical system and $\phi$ is the total power $\phi$ of a negative lens group or groups. Generally, if the conjugate distance L becomes longer, the total power ø becomes smaller. If, on the other hand, the conjugate distance becomes shorter, the total power ø becomes larger.

In one preferred form of the present invention, the product of the conjugate distance and the total power is set to be not less than 17. The total power of the negative refractive power lens group is, therefore, made larger, mainly for satisfactory correction of the curvature of image field and the astigmatism. If the lower limit of the condition of equation (1) is exceeded, the Petzval sum increases in the positive direction, such that satisfactory correction of the curvature of image field or astigmatism becomes difficult to accomplish, even if an aspherical surface is used.

In order to obtain much better imaging performance as a result of introduction of an aspherical surface, the condition as defined by equation (2) below should preferably be satisfied.

$$|\Delta ASPH/L| > 1 \times 10^{-6} \qquad (2)$$

where $\Delta ASPH$ is the aspherical amount, and L is the object-to-image distance.

Here, the aspherical amount refers to a deviation between a spherical surface, following a design curvature radius, and an aspherical surface with respect to an optical axis direction.

If the lower limit of condition (2) is exceeded, the effect of the aspherical surface does not function well even though the aspherical surface is used in design to obtain a good imaging performance.

For example, if the conjugate distance is 1000 mm and the wavelength used is 193 nm, from equation (2), $\Delta ASPH$ is equal to 0.001 mm, which corresponds to about ten Newton's rings. This is a sufficiently large value as an aspherical surface to be used in a projection optical system. Further, for more effective use of an aspherical surface, the following relation may be satisfied $$|\Delta ASPH/L| > 1 \times 10^{-5}$$

to enlarge the aspherical amount.

In one preferred form of the present invention, an aspherical surface is preferably formed on such a surface that satisfies a condition as defined by equation (3) below.

$$|h_b/h| > 0.35 \qquad (3)$$

The condition of equation (3) defines an appropriate surface for introduction of an aspherical surface, based on satisfaction of the condition (1). In conventional reduction projection optical systems, it is very difficult to satisfactorily correct distortion, curvature of image field, and astigmatism as well as transverse aberrations of meridional and sagittal, while maintaining the telecentricity.

This is because of the following reason. The telecentricity, distortion, curvature of image field, and astigmatism are all aberration amounts related to a principal ray passing through the center of a light flux. Although these aberrations depend on the placement and shape of lenses on the object side where, in the lens system as a whole, the height of the principal ray is high, practically, it is very difficult to maintain, on one hand, the telecentricity with respect to principal rays from every object point on the object and, on the other hand, to refract the same principal ray so as to correct the distortion, the curvature of image field and the astigmatism.

Further, since on a lens surface those rays below the meridional are refracted at a height still higher than the principal ray, it is difficult to balance the meridional transverse aberration and aberration concerning these principle rays. Simultaneously, in order to correct the curvature of image field, which has a tendency that it is "under" with a higher image height, usually a concave lens is used to refract the light strongly. Then, however, the peripheral portion (sagittal halo) of the sagittal transverse aberration at high image heights further changes "over". Thus, it is difficult to balance them satisfactorily.

Enlarging the numerical aperture and widening the exposure area under these situations directly lead to further enlargement of the object side light flux and image height, and it amplifies the difficulties in aberration correction.

In one preferred form of the present invention, in consideration of the above, the condition of equation (3) is satisfied and an aspherical surface is formed on such a surface having a large influence to abaxial principal rays, thereby to concentratedly and effectively correct the above-described aberrations to be improved. This effectively reduces the load for correction of other aberrations, and accomplishes a good optical performance.

If the lower limit of the condition of equation (3) is exceeded, the influence to axial marginal light rays increases, rather than to the abaxial principle rays, and therefore, the effect of correcting the aberrations to be improved diminishes. Thus, it becomes difficult to attain an enlarged numerical aperture and a wider exposure area.

Further, conditions as defined by equations (1a), (2a) and (3a) below may preferably be satisfied, for better correction of aberrations.

$$|L \times \phi| < 70 \qquad (1a)$$

$$|\Delta ASPH/L| < 0.02 \qquad (2a)$$

$$|h_b/h| < 15 \qquad (3a)$$

If the upper limit of the condition of equation (1a) is exceeded, the power of a negative lens group or groups having a negative refractive power becomes too strong. Therefore, the Petzval sum is over-corrected, and it becomes difficult to mainly correct the curvature of image field and astigmatism, satisfactorily.

Further, the lens diameter of a positive lens group having a positive refractive power becomes larger, or the number of lenses increases.

If the upper limit of the condition of equation (2a) is exceeded, lenses become too close to the object plane and the working distance cannot be kept. If the magnification of the projection optical system is extraordinarily small, the working distance may be kept even though the condition is exceeded. However, an optical system having such an extraordinarily small magnification is not practical for use in lithography.

When the upper limit of the condition of equation (3a) is exceeded, the aspherical amount becomes too large, causing a large increase in the time necessary for lens machining. Further, higher order aberrations produced at the aspherical surface become strong, which makes the satisfactory correction of aberration very difficult.

In accordance with the present invention, introduction of aspherical surfaces can be made effectively. Additionally, when at least one of the following conditions is satisfied, the effect of aspherical surfaces can be improved more.

(a1) There should be two aspherical surfaces having regions in which local curvature powers change with mutually opposite signs, from the surface center to the surface peripheral portion.

(a2) The two aspherical surfaces should be those formed on both sides of an aspherical surface lens.

(a3) Each lens group should include at least one aspherical surface lens having aspherical surfaces formed on both sides thereof.

As regards correction of aberration by use of an aspherical surface, generally, an aspherical surface is introduced to a certain lens surface so as to reduce production of aberration at that surface (i.e., auxiliary introduction). An example is that, in a case of a convex single lens, since the spherical aberration is "under", an aspherical surface whose curvature becomes smaller in the peripheral portion is used to correct the spherical aberration.

In the present invention, as compared therewith, while reducing the number of lenses is aimed at on one hand, aspherical surfaces are introduced so as to cancel aberration in combination with other surfaces, to thereby accomplish good performance as well (i.e., positive introduction). By doing so, aberrations are corrected successfully.

More specifically, by satisfying the condition (a1), a relation of cancelling two aspherical surface powers is defined. By this, it is assured that a change in refractive power applied to an arbitrary light from an object produces a refractive power change with which plural aberrations can be minimized simultaneously, which are not attainable with use of only spherical surfaces or a lens having only one aspherical surface. Higher order aberrations which cannot be easily corrected, such as distortion, curvature of field, astigmatism, sagittal transverse aberration or meridional transverse aberration, in higher order regions, for example, can be well corrected by the function of the condition (a1) above.

Figure 28A:
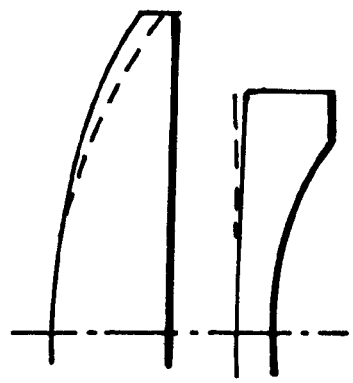
FIGS. 28A and 28B are schematic views, respectively, for explaining an optical action in relation to introduction of an aspherical surface in the present invention.

However, considering one lens with an aspherical surface, the change in aspherical surface differs between an aspherical surface having a spherical surface on one face thereof and an aspherical surface lens having aspherical surfaces on both faces thereof. In the case of an aspherical surface having a spherical surface on one face thereof, since one face thereof is determined by a spherical surface, a change in refractive power in the diameter direction when the aberration is controlled on the basis of cancellation with another aspherical surface lens becomes large (see FIG. 28A wherein solid lines depict the spherical surface shape, while broken lines depict the aspherical surface shape).

Figure 28B:
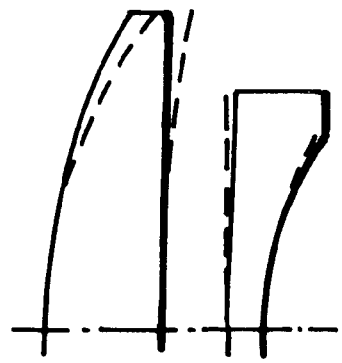

Thus, when considered as a unit lens, the situation is that higher order aberration may be produced easily. This means that the system becomes more sensitive to any eccentricity during the lens production. On the other hand, in the case of an aspherical surface having aspherical surfaces on both sides thereof, by satisfying the condition (2) above, enlargement of the refractive power change in the diameter direction can be suppressed (see FIG. 28B wherein solid lines depict the spherical surface shape, while broken lines depict the aspherical surface shape). It may be stated as mutual bending of aspherical surfaces. Thus, when considered as a unit lens, as compared with a mono-aspherical surface lens, production of higher order aberration is well suppressed. This is particularly advantageous in relation to eccentricity during the lens production.

In consideration of the above, by satisfying the condition (a3), the aspherical surface power cancellation function can be applied while suppressing aberrations produced at the lens groups (as auxiliary introduction of aspherical surfaces), on the other hand, successful aberration correction can be attained.

Preferably, a first lens group having a positive refractive power may include at least one aspherical surface and a second lens group having a negative refractive power includes at least two aspherical surfaces. On that occasion, distortion, curvature of field, astigmatism, sagittal transverse aberration and meridional transverse aberration can be corrected well.

As described, a projection optical system according to the present invention basically uses an aspherical surface lens having aspherical surfaces on opposite sides thereof. The power sharing is set appropriately, and an appropriate aspherical amount is set. Also, the aspherical surface shape is determined to satisfy a predetermined condition or conditions. With this arrangement, particularly the distortion, curvature of field and astigmatism are corrected while maintaining dual-telecentricity. Also, the projection optical system can be accomplished by use of a reduced number of lenses.

Important features of lens structures in numerical examples of projection optical systems according to the present invention, will now be described.

EXAMPLE 1

FIG. 1 is a lens sectional view of a projection optical system according to Numerical Example 1 of the present invention. The projection optical system has a reference wavelength 193 nm, a numerical aperture NA=0.65, a projection magnification $\beta$=1:4, a lens conjugate distance L=1000 mm, and an exposure region of a diameter ø27.3 mm. This optical system is accomplished by lenses of a small number 15 (fifteen). It uses nine aspherical surfaces, six of which are bi-aspherical.

Table 1 shows specifications of this example, in regard to the conditions. FIG. 2 illustrates changes in power of aspherical surfaces, wherein the axis of the ordinate represents the height of an aspherical surface from the optical axis, being standardized with respect to the effective diameter, and the axis of the abscissa denotes the aspherical surface number. The leftward and rightward directions correspond to negative and positive directions of the change in local curvature power, respectively. FIG. 3 illustrates aberrations of this example.

In Numerical Example 1, surfaces r1–r8 belong to a positive first lens group G1, wherein r7 and r8 are bi-aspherical surfaces. Surfaces r9–r14 belong to a negative second lens group G2, wherein r9 and r10 are bi-aspherical surfaces. Surfaces r15–r30 belong to a positive third lens group G3, wherein r18, r21 and r23 are mono-aspherical surfaces while r29 and r30 are bi-aspherical surfaces.

In this example, as shown in Table 1, first the condition of equation (1) for correction of the Petzval sum is satisfied and then, by satisfying the condition of equation (2), aspherical surfaces are effectively utilized. Particularly, two bi-aspherical surfaces are placed in the first group and two bi-aspherical surfaces are placed in the second group, by which the condition of equation (3) is satisfied. With this arrangement, the telecentricity, distortion and curvature of field, for example, are corrected well.

The first lens group is provided by one negative lens and three positive lenses. Particularly, the bi-aspherical surfaces r7 and r8 include regions in which the local curvature powers change with mutually opposite signs so as to cancel each other. Thus, the functions as defined by conditions (a1) and (a2) described above are satisfied.

The second lens group is provided by three negative lenses. The bi-aspherical surfaces at r9 and r10 similarly include regions in which the local curvature powers change with mutually opposite signs so as to cancel each other. Thus, the functions as defined by conditions (a1) and (a2) described above are satisfied.

The third lens group is provided by seven positive lenses and one negative lens. In the aspherical surfaces at r18, r21 and r23, the local curvature power changes in the negative direction so as mainly to correct the spherical aberration. The bi-aspherical surfaces at r29 and r30 serve mainly to correct lower orders of the distortion aberration. The changes in the local curvature powers have opposite signs to cancel each other, such that the functions of conditions (a1) and (a2) are satisfied. However, in total, the local curvature powers change in the positive direction.

In this example, each lens group has a bi-aspherical surface lens, such that the condition (a3) is also satisfied.

With this arrangement, aberrations are corrected satisfactorily, as illustrated in FIG. 3.

EXAMPLE 2

FIG. 4 is a lens sectional view of a projection optical system according to Numerical Example 2 of the present invention. The projection optical system has a reference wavelength 193 nm, a numerical aperture NA=0.65, a projection magnification p=1:4, a lens conjugate distance L=979 mm, and an exposure region of diameter ø27.3 mm. This optical system is accomplished by lenses of a small number 14 (fourteen). It uses ten aspherical surfaces, six of which are bi-aspherical.

Table 2 shows specifications of this example, in regard to the conditions. FIG. 5 illustrates changes in power of aspherical surfaces, wherein the axis of the ordinate represents the height of an aspherical surface from the optical axis, being standardized with respect to the effective diameter, and the axis of the abscissa denotes the aspherical surface number. The leftward and rightward directions correspond to negative and positive directions of the change in local curvature power, respectively. FIG. 6 illustrates aberrations of this example.

In Numerical Example 2, surfaces r1–r8 belong to a positive first lens group G1, wherein r7 and r8 are bi-aspherical surfaces. Surfaces r9–r14 belong to a negative second lens group G2, wherein r9 and r10 are bi-aspherical surfaces. Surfaces r15–r28 belong to a positive third lens group G3, wherein r17, r18, r21, r22, r27 and r28 are bi-aspherical surfaces.

In this example, as shown in Table 2, first the condition of equation (1) for correction of the Petzval sum is satisfied and then, by satisfying the condition of equation (2), aspherical surfaces are effectively utilized. Particularly, two bi-aspherical surfaces are placed in the first group and two bi-aspherical surfaces are placed in the second group, by which the condition of equation (3) is satisfied. With this arrangement, the telecentricity, distortion and curvature of field, for example, are corrected well.

The first lens group is provided by one negative lens and three positive lenses. Particularly, the bi-aspherical surfaces at r7 and r8 include regions in which the local curvature powers change with mutually opposite signs so as to cancel each other. Thus, the functions as defined by conditions (a1) and (a2) described above are satisfied.

The second lens group is provided by three negative lenses. The bi-aspherical surfaces at r9 and r10 similarly include regions in which the local curvature powers change with mutually opposite signs so as to cancel each other. Thus, the functions as defined by conditions (a1) and (a2) described above are satisfied.

The third lens group is provided by six positive lenses and one negative lens. In the aspherical surfaces at r18, r21 and r22, the local curvature power changes in the negative direction so as mainly to correct the spherical aberration. The bi-aspherical surfaces at r27 and r28 serve mainly to correct lower orders of the distortion aberration. Thus, there are regions in which changes in the local curvature powers have opposite signs to cancel each other, such that the functions of conditions (a1) and (a2) are satisfied. However, in total, the local curvature powers change in the positive direction.

In this example, each lens group has a bi-aspherical surface lens, such that the condition (a3) is also satisfied.

With this arrangement, aberrations are corrected satisfactorily, as illustrated in FIG. 6.

EXAMPLE 3

FIG. 7 is a lens sectional view of a projection optical system according to Numerical Example 3 of the present invention. The projection optical system has a reference wavelength of 193 nm, a numerical aperture NA=0.65, a projection magnification p=1:4, a lens conjugate distance L=1000 mm, and an exposure region of diameter ø27.3 mm. This optical system is accomplished by lenses of a small number 15 (fifteen). It uses eight aspherical surfaces, six of which are bi-aspherical.

Table 3 shows specifications of this example, in regard to the conditions. FIG. 8 illustrates changes in power of aspherical surfaces, wherein the axis of the ordinate represents the height of an aspherical surface from the optical axis, being standardized with respect to the effective diameter, and the axis of the abscissa denotes the aspherical surface number. The leftward and rightward directions correspond to negative and positive directions of the change in local curvature power, respectively. FIG. 9 illustrates aberrations of this example.

In Numerical Example 3, surfaces r1–r8 belong to a positive first lens group G1, wherein r7 and r8 are bi-aspherical surfaces. Surfaces r9–r14 belong to a negative second lens group G2, wherein r9 and r10 are bi-aspherical surfaces. Surfaces r15–r30 belong to a positive third lens group G3, wherein r18 and r23 are mono-aspherical surfaces while r29 and r30 are bi-aspherical surfaces.

In this example, as shown in Table 3, first the condition of equation (1) for correction of the Petzval sum is satisfied and then, by satisfying the condition of equation (2), aspherical surfaces are effectively utilized. Particularly, two bi-aspherical surfaces are placed in the first group and two bi-aspherical surfaces are placed in the second group, by which the condition of equation (3) is satisfied. With this arrangement, the telecentricity, distortion and curvature of field, for example, are corrected well.

The first lens group is provided by one negative lens and three positive lenses. Particularly, the bi-aspherical surfaces at r7 and r8 include regions in which the local curvature powers change with mutually opposite signs so as to cancel each other. Thus, the functions as defined by conditions (a1) and (a2) described above are satisfied.

The second lens group is provided by three negative lenses. The bi-aspherical surfaces at r9 and r10 similarly include regions in which the local curvature powers change with mutually opposite signs so as to cancel each other. Thus, the functions as defined by conditions (a1) and (a2) described above are satisfied.

The third lens group is provided by seven positive lenses and one negative lens. In the aspherical surfaces at r18 and r23, the local curvature power changes in the negative direction so as mainly to correct the spherical aberration. The bi-aspherical surfaces at r29 and r30 serve mainly to correct lower orders of the distortion aberration. Particularly, in the peripheral portion of the surface r29, the local curvature power changes in the positive direction.

In this example, each lens group has a bi-aspherical surface lens, such that the condition (a3) is also satisfied.

With this arrangement, aberrations are corrected satisfactorily, as illustrated in FIG. 9.

EXAMPLE 4

FIG. 10 is a lens sectional view of a projection optical system according to Numerical Example 4 of the present invention. The projection optical system has a reference wavelength of 193 nm, a numerical aperture NA=0.65, a projection magnification β=1:4, a lens conjugate distance L=1000 mm, and an exposure region of diameter ø27.3 mm. This optical system is accomplished by lenses of a small number 13 (thirteen). It uses six aspherical surfaces, two of which are bi-aspherical.

Table 4 shows specifications of this example, in regard to the conditions. FIG. 11 illustrates changes in power of aspherical surfaces, wherein the axis of the ordinate represents the height of an aspherical surface from the optical axis, being standardized with respect to the effective diameter, and the axis of the abscissa denotes the aspherical surface number. The leftward and rightward directions correspond to the negative and positive directions of the change in local curvature power, respectively. FIG. 12 illustrates aberrations of this example.

In Numerical Example 4, surfaces r1–r8 belong to a positive first lens group G1, wherein r2 and r5 are mono-aspherical surfaces. Surfaces r9–r14 belong to a negative second lens group G2, wherein r10 is a mono-aspherical surface, and r11 and r12 are bi-aspherical surfaces. Surfaces r15–r26 belong to a positive third lens group G3, wherein r19 is a mono-aspherical surface.

In this example, as shown in Table 4, first the condition of equation (1) for correction of the Petzval sum is satisfied and then, by satisfying the condition of equation (2), aspherical surfaces are effectively utilized. Particularly, two mono-aspherical surfaces are placed in the first group while one mono-aspherical surface and two bi-aspherical surfaces are planned in the second group, by which the condition of equation (3) is satisfied. With this arrangement, the telecentricity, distortion and curvature of field, for example, are corrected well.

The first lens group is provided by one negative lens and three positive lenses. In the aspherical surfaces at r2 and r5, the local curvature powers change in the positive direction.

The second lens group is provided by three negative lenses. For correction of higher order components such as curvature of field and distortion aberration, for example, the aspherical surfaces at r10 and r11 as well as at r10 and r12 include regions in which the local curvature powers change with mutually opposite signs to cancel each other. Thus, the function as defined by condition (a1) described above is satisfied. On the other hand, in the surfaces r11 and r12 as bi-aspherical surfaces, while at the central portion the signs are mutually opposite, the powers change both in the positive direction at the peripheral portion. Also, in the relationship between the surface at r10 and the surface at r5 of the first lens group, there are regions in which the changes in local curvature power have mutually opposite signs to cancel each other, such that the function of condition (a1) described above is satisfied. Thus, the structure is effective to correct distortion, for example.

The third lens group is provided by five positive lenses and one negative lens. Only one surface at r19 is an aspherical surface, and the local curvature power changes in the negative direction so as mainly to correct the spherical aberration.

With this arrangement, aberrations are corrected satisfactorily, as illustrated in FIG. 12.

EXAMPLE 5

FIG. 13 is a lens sectional view of a projection optical system according to Numerical Example 5 of the present invention. The projection optical system has a reference wavelength of 248 nm, a numerical aperture NA=0.65, a projection magnification $\beta=1:4$, a lens conjugate distance L=1000 mm, and an exposure region of diameter $\phi 27.3$ mm. This optical system is accomplished by lenses of a relatively small number 24 (twenty-four) as a five-group lens system. It uses seven aspherical surfaces, four of which are bi-aspherical.

Table 5 shows specifications of this example, in regard to the conditions. FIG. 14 illustrates changes in power of aspherical surfaces, wherein the axis of the ordinate represents the height of an aspherical surface from the optical axis, being standardized with respect to the effective diameter, and the axis of the abscissa denotes the aspherical surface number. The leftward and rightward directions correspond to negative and positive directions of the change in local curvature power, respectively. FIG. 15 illustrates aberrations of this example.

In Numerical Example 5, surfaces r1–r6 belong to a positive first lens group G1, wherein r3 and r4 are bi-aspherical surfaces. Surfaces r7–r14 belong to a negative second lens group G2, wherein r9 and r10 are bi-aspherical surfaces. Surfaces r15–r26 belong to a positive third lens group G3, wherein r20 is a mono-aspherical surface. Surfaces r27–r30 belong to a negative fourth lens group G4 wherein all surfaces are spherical. Surfaces r31–r48 belong to a positive fifth lens group G5, wherein r35 and r47 are mono-aspherical surfaces.

In this example, as shown in Table 5, first the condition of equation (1) for correction of the Petzval sum is satisfied and then, by satisfying the condition of equation (2), aspherical surfaces are effectively utilized. Particularly, two bi-aspherical surfaces are placed in the first group and two bi-aspherical surfaces are placed in the second group, by which the condition of equation (3) is satisfied. With this arrangement, the telecentricity, distortion and curvature of field, for example, are corrected well.

The first lens group is provided by three positive lenses. Particularly, the bi-aspherical surfaces at r3 and r4 include regions in which the local curvature powers change with mutually opposite signs so as to cancel each other. Thus, the functions as defined by conditions (a1) and (a2) described above are satisfied.

The second lens group is provided by two negative lenses. The bi-aspherical surfaces at r9 and r10 similarly include regions in which the local curvature powers change with mutually opposite signs so as to cancel each other. Thus, the functions as defined by conditions (a1) and (a2) described above are satisfied.

The third lens group is provided by five position lenses and one negative lens. In the aspherical surface at r20, the local curvature power changes in the negative direction so as to correct the spherical aberration, for example.

The fourth lens group is provided by two negative lenses, and they function mainly to correct the Petzval sum.

The fifth lens group is provided by eight positive lenses and one negative lens. In the aspherical surface at r35, the local curvature power changes in the negative direction so as mainly to correct the spherical aberration. The aspherical surface at r47 includes a region in which the local curvature power changes in the positive direction so as to correct the distortion aberration, for example.

With this arrangement, aberrations are corrected satisfactorily, as illustrated in FIG. 15.

EXAMPLE 6

FIG. 16 is a lens sectional view of a projection optical system according to Numerical Example 6 of the present invention. The projection optical system has a reference wavelength of 193 nm, a numerical aperture NA=0.65, a projection magnification $\beta 1:4$, a lens conjugate distance L=1000 mm, and an exposure region of diameter $\phi 27.3$ mm. This optical system is accomplished by lenses of a relatively small number 16 (sixteen) as a five-group lens system. It uses twelve aspherical surfaces, all of which are bi-aspherical.

Table 6 shows specifications of this example, in regard to the conditions. FIG. 17 illustrates changes in power of aspherical surfaces, wherein the axis of the ordinate represents the height of an aspherical surface from the optical axis, being standardized with respect to the effective diameter, and the axis of the abscissa denotes the aspherical surface number. The leftward and rightward directions correspond to negative and positive directions of the change in local curvature power, respectively. FIG. 18 illustrates aberrations of this example.

In Numerical Example 6, surfaces r1–r4 belong to a positive first lens group G1, wherein r3 and r4 are bi-aspherical surfaces. Surfaces r5–r10 belong to a negative second lens group G2, wherein r9 and r10 are bi-aspherical surfaces. Surfaces r11–r16 belong to a positive third lens group G3, wherein r13 and r14 are bi-aspherical surfaces. Surfaces r17–r20 belong to a negative fourth lens group G4, wherein r19 and r20 are bi-aspherical surfaces. Surfaces r21–r32 belong to a positive fifth lens group G5, wherein r25 and r26 are bi-aspherical surfaces.

In this example, as shown in Table 6, first the condition of equation (1) for correction of the Petzval sum is satisfied and then, by satisfying the condition of equation (2), aspherical surfaces are effectively utilized. Particularly, two bi-aspherical surfaces are placed in the first group and two bi-aspherical surfaces are placed in the second group, by which the condition of equation (3) is satisfied. With this arrangement, the telecentricity, distortion and curvature of field, for example, are corrected well.

The first lens group is provided by two positive lenses. Particularly, the bi-aspherical surfaces at r3 and r4 include regions in which the local curvature powers change with mutually opposite signs so as to cancel each other. Thus, the functions as defined by conditions (a1) and (a2) described above are satisfied.

The second lens group is provided by three negative lenses. The bi-aspherical surfaces at r9 and r10 similarly include regions in which the local curvature powers change with mutually opposite signs so as to cancel each other. Thus, the functions as defined by conditions (a1) and (a2) described above are satisfied.

The third lens group is provided by three positive lenses. The bi-aspherical surfaces at r13 and r14 include regions in which changes in the local curvature power have mutually opposite signs to cancel with each other. Thus, the functions of conditions (a1) and (a2) are satisfied. In total, however, there remains a component in the negative direction, and spherical aberration, for example, is corrected.

The fourth lens group is provided by two negative lenses. In the bi-aspherical surfaces at r19 and r20, the local curvature powers change both in the positive direction, by which a diverging action produced by this lens group itself is cancelled.

The fifth lens group is provided by five positive lenses and one negative lens. In the bi-aspherical surfaces at r25 and r26, there are regions in which changes in the local curvature power have mutually opposite signs to cancel with each other. Thus, the functions of conditions (a1) and (a2) are satisfied. In total, however, there remains a component in the negative direction, and spherical aberration, for example, is corrected. In the bi-aspherical surfaces at r25 and r26, the local curvature powers change both in the negative direction, and, similarly, the spherical aberration is mainly corrected. Four of the five positive lenses are made of fluorite (n=1.5014), which is effective to chromatic aberration correction.

In this example, each lens group has a bi-aspherical surface lens, such that the condition (a3) is also satisfied.

With this arrangement, aberrations are corrected satisfactorily, as illustrated in FIG. 18.

EXAMPLE 7

FIG. 19 is a lens sectional view of a projection optical system according to Numerical Example 7 of the present invention. The projection optical system has a reference wavelength of 193 nm, a numerical aperture NA=0.65, a projection magnification β=1:4, a lens conjugate distance L=1000 mm, and an exposure region of diameter ⌀27.3 mm. This optical system is accomplished by lenses of a remarkably small number 13 (thirteen) as a five-group lens system. It uses twelve aspherical surfaces, all of which are bi-aspherical.

Table 7 shows specifications of this example, in regard to the conditions. FIG. 20 illustrates changes in power of aspherical surfaces, wherein the axis of the ordinate represents the height of an aspherical surface from the optical axis, being standardized with respect to the effective diameter, and the axis of the abscissa denotes the aspherical surface number. The leftward and rightward directions correspond to negative and positive directions of the change in local curvature power, respectively. FIG. 21 illustrates aberrations of this example.

In Numerical Example 7, surfaces r1–r2 belong to a positive first lens group G1, wherein r1 and r2 are bi-aspherical surfaces. Surfaces r3–r8 belong to a negative second lens group G2, wherein r5 and r6 are bi-aspherical surfaces. Surfaces r9–r14 belong to a positive third lens group G3, wherein r11 and r12 are bi-aspherical surfaces. Surfaces r15–r18 belong to a negative fourth lens group G4, wherein r15 and r16 are bi-aspherical surfaces. Surfaces r19–r26 belong to a positive fifth lens group G5, wherein r21 and r22 as well as r25 and r26 are bi-aspherical surfaces.

In this example, as shown in Table 7, first the condition of equation (1) for correction of the Petzval sum is satisfied and then, by satisfying the condition of equation (2), aspherical surfaces are effectively utilized. Particularly, two bi-aspherical surfaces are placed in the first group and two bi-aspherical surfaces are placed in the second group, by which the condition of equation (3) is satisfied. With this arrangement, the telecentricity, distortion and curvature of field, for example, are corrected well.

The first lens group is provided by one positive lens. The bi-aspherical surfaces at r1 and r2 include regions in which the local curvature powers change with mutually opposite signs so as to cancel each other. Thus, the functions as defined by conditions (a1) and (a2) described above are satisfied. In total, a power change in the positive direction remains.

The second lens group is provided by one positive lens and two negative lenses. The bi-aspherical surfaces at r5 and r6 similarly include regions in which the local curvature powers change with mutually opposite signs so as to cancel each other. Thus, the functions as defined by conditions (a1) and (a2) described above are satisfied. In total, a power change in the negative direction remains. Thus, also in the point that it is in a cancelling relationship with the first lens group, the function of condition (a1) is satisfied.

The third lens group is provided by three positive lenses. The bi-aspherical surfaces at r11 and r12 include regions in which the local curvature powers change in the negative direction, and thus the spherical aberration, for example, is corrected thereby.

The fourth lens group is provided by two negative lenses. The bi-aspherical surfaces at r15 and r16 include regions in which their local curvature powers change with mutually opposite signs to cancel each other. Thus, the functions as defined by conditions (a1) and (a2) described above are satisfied. In total, a power change in the negative direction remains, this being effective to correct spherical aberration, for example.

The fifth lens group is provided by four positive lenses. The bi-aspherical surfaces at r25 and r26 include regions in which the local curvature powers change both in the negative direction, and thus, spherical aberration, for example, is corrected. In the bi-aspherical surfaces at r25 and r26, the local curvature powers change with mutually opposite signs, such that the function of conditions (a1) and (a2) described above are satisfied. Distortion and coma aberration, for example, are corrected thereby.

In this example, each lens group has a bi-aspherical surface lens, such that condition (a3) is also satisfied.

With this arrangement, aberrations are corrected satisfactorily, as illustrated in FIG. 21.

EXAMPLE 8

FIG. 13 is a lens sectional view of a projection optical system according to Numerical Example 8 of the present invention. The projection optical system has a reference wavelength of 193 nm, a numerical aperture NA=0.65, a projection magnification β=1:4, a lens conjugate distance L=1000 mm, and an exposure region of diameter ø27.3 mm. This optical system is accomplished by lenses of a relatively small number 19 (nineteen) as a seven-group lens system. It uses nine aspherical surfaces, six of which are bi-aspherical.

Table 8 shows specifications of this example, in regard to the conditions. FIG. 23 illustrates changes in power of aspherical surfaces, wherein the axis of the ordinate represents the height of an aspherical surface from the optical axis, being standardized with respect to the effective diameter, and the axis of the abscissa denotes the aspherical surface number. The leftward and rightward directions correspond to negative and positive directions of the change in local curvature power, respectively. FIG. 24 illustrates aberrations of this example.

In Numerical Example 8, surfaces r1–r4 belong to a positive first lens group G1, wherein r3 is a mono-aspherical surface. Surfaces r5–r8 belong to a negative second lens group Gs, wherein r5 and r6 are bi-aspherical surfaces. Surfaces r9–r12 belong to a positive third lens group G3, wherein r11 is a mono-aspherical surface. Surfaces r13–r18 belong to a negative fourth lens group G4, all of which are spherical surfaces. Surfaces r19–r24 belong to a positive fifth lens group G5, wherein r21 is a mono-aspherical surface. Surfaces r25–r28 belong to a negative sixth lens group G6, all of which are spherical surfaces. Surfaces r29–r38 belong to a positive seventh lens group G7, wherein r31 and r32 as well as r37 and r38 are bi-aspherical surfaces.

In this example, as shown in Table 8, first the condition of equation (1) for correction of the Petzval sum is satisfied and then, by satisfying the condition of equation (2), aspherical surfaces are effectively utilized. Particularly, one aspherical surface is placed in the first group, two bi-aspherical surfaces are placed in the second group, and one aspherical surface is placed in the third lens group, by which the condition of equation (3) is satisfied. With this arrangement, the telecentricity, distortion and curvature of field, for example, are corrected well.

The first lens group is provided by two positive lenses. In the mono-aspherical surface at r3, the local curvature power changes in the positive direction.

The second lens group is provided by two negative lenses. The bi-aspherical surfaces at r5 and r6 include regions in which the local curvature powers change with mutually opposite signs so as to cancel each other. Thus, the functions as defined by conditions (a1) and (a2) described above are satisfied. In total, a power change in the negative direction remains. Thus, also in the point that it is in a cancelling relationship with the first lens group, the function of condition (a1) is satisfied.

The third lens group is provided by two positive lenses. The aspherical surface at r11 includes a region in which the local curvature power changes in the positive direction, this being effective to correct meridional and sagittal transverse aberration. Also, in the point that it is in a cancelling relationship with the surface r5 of the second lens group, the function of condition (a1) is satisfied.

The fourth lens group is provided by three negative lenses, and mainly the Petzval sum is corrected.

The fifth lens group is provided by three positive lenses. In the aspherical surface at r22, the local curvature power changes in the negative direction, and thus, spherical aberration, for example, is corrected.

The sixth lens group is provided by two negative lenses, and mainly the Petzval sum is corrected.

The seventh lens group is provided by five positive lenses. In the bi-aspherical surfaces at 31 and r32, the local curvature powers change both in the negative direction, and thus, spherical aberration, for example, is corrected. In the bi-aspherical surfaces at r37 and r38, the local curvature powers change with mutually opposite signs to cancel with each other, such that the function of conditions (a1) and (a2) described above are satisfied. Distortion and coma aberration, for example, are corrected thereby.

With this arrangement, aberrations are corrected satisfactorily, as illustrated in FIG. 21.

EXAMPLE 9

FIG. 25 is a lens sectional view of a projection optical system according to Numerical Example 9 of the present invention. The projection optical system has a reference wavelength of 193 nm, a numerical aperture NA=0.65, a projection magnification β=1:4, a lens conjugate distance L=1000 mm, and an exposure region of diameter ø27.3 mm. This optical system is accomplished by lenses of a relatively small number 17 (seventeen) as a seven-group lens system. It uses eight aspherical surfaces, all of which are bi-aspherical.

Table 9 shows specifications of this example, in regard to the conditions. FIG. 26 illustrates changes in power of aspherical surfaces, wherein the axis of the ordinate represents the height of an aspherical surface from the optical axis, being standardized with respect to the effective diameter, and the axis of the abscissa denotes the aspherical surface number. The leftward and rightward directions correspond to negative and positive directions of the change in local curvature power, respectively. FIG. 27 illustrates aberrations of this example.

In Numerical Example 9, surfaces r1 and r2 belong to a positive first lens group G1, wherein r1 and r2 are bi-aspherical surfaces. Surfaces r3 and r4 belong to a negative second lens group G2, wherein r3 and r4 are bi-aspherical surfaces. Surfaces r5–r8 belong to a positive third lens group G3, all of which are aspherical surfaces. Surfaces r9–r12 belong to a negative fourth lens group G4, wherein r9 and r10 are bi-aspherical surfaces. Surfaces r13–r16 belong to a positive fifth lens group G5, all of which are spherical surfaces. Surfaces r17–r20 belong to a negative sixth lens group G6, all of which are spherical surfaces. Surfaces r21–r34 belong to a positive seventh lens group G7, wherein r33 and r34 are bi-aspherical surfaces.

In this example, as shown in Table 9, first the condition of equation (1) for correction of the Petzval sum is satisfied and then, by satisfying the condition of equation (2), aspherical surfaces are effectively utilized. Particularly, two bi-aspherical surfaces are placed in the first group, two bi-aspherical surfaces are placed in the second group and two aspherical surfaces are placed in the third lens group, by which the condition of equation (3) is satisfied. With this arrangement, the telecentricity, distortion and curvature of field, for example, are corrected well.

The first lens group is provided by one positive lens. The bi-aspherical surfaces at r1 and r2 include regions wherein the local curvature powers change with mutually opposite signs to cancel each other, whereby the functions as defined by the conditions (a1) and (a2) described above are satisfied. In total, a power change in the positive direction remains.

The second lens group is provided by one negative lens. The bi-aspherical surfaces at r3 and r4 include regions, at peripheral portions, in which the local curvature powers change with mutually opposite signs so as to cancel each other. Thus, the functions as defined by conditions (a1) and (a2) described above are satisfied. In total, a power change in the negative direction remains. Thus, also in the point that it is in a cancelling relationship with the first lens group, the function of condition (a1) is satisfied.

The third lens group is provided by two positive lenses, this being effective to correct meridional and sagittal transverse aberrations.

The fourth lens group is provided by two negative lenses. The bi-aspherical surfaces at r9 and r10 are in a slightly cancelling relation with each other, at the outermost peripheral portions of them. However, in total, a power change in the positive direction remains. With this arrangement, the diverging function to be produced in this group itself is corrected.

The fifth lens group is provided by two positive lenses.

The sixth lens group is provided by two negative lenses, and mainly the Petzval sum is corrected.

The seventh lens group is provided by six positive lenses and one negative lens. In the bi-aspherical surfaces at r33 and r34, the local curvature powers at the peripheral portions change with mutually opposite signs, such that the function of conditions (a1) and (a2) described above are satisfied. In total, however, a power change in the negative direction remains. Distortion, coma aberration, and spherical aberration, for example, are corrected thereby.

With this arrangement, aberrations are corrected satisfactorily, as illustrated in FIG. 27.

The conical constant k regarding the aspherical surface shape is taken as zero, in some of the examples described above. However, the aspherical surface shape may be designed while taking the conical constant k as a variable.

Further, in some examples, all lenses are made of a glass material of silica (n=1.5602). However, fluorite may be used. When both silica and fluorite are used, chromatic aberration can be corrected to be very small.

In these examples, the exposure light source uses an ArF laser having a wavelength of 193 nm or a KrF laser having a wavelength of 248 nm. However, regardless of the lens type, a wavelength not longer than 250 nm may be used. For example, an $F_2$ laser wavelength may be used.

Next, structural specifications of these numerical examples will be described. In the numerical example data to be described below, "ri" refers to the curvature radius of the i-th lens surface, in an order from the object side, and "di" refers to the i-th lens thickness or air spacing, in an order from the object side. Further, "ni" refers to the refractive index of the glass material of the i-th lens lens, in an order from the object side.

The shape of an aspherical surface can be given by the following equation:

$$X = \frac{H^2/ri}{1 + \{1 - (1+k)\cdot(H/ri)^2\}^{1/2}} + A\cdot H^4 + B\cdot H^6 + C\cdot H^8 + D\cdot H^{10} + E\cdot H^{12} + F\cdot H^{14} + G\cdot H^{16} + \ldots$$

where X is the displacement amount in the optical axis direction from the lens vertex, H is the distance from the optical axis, ri is the curvature radius, k is the conical constant, and A, B, C, . . . , G are aspherical coefficients. Here, the refractive index of silica and fluorite with respect to the exposure wavelength of 193 nm are 1.5602 and 1.5014, respectively.

The following is numerical data for Numerical Examples 1–9. Also, Tables 1–9 below show the relation between the conditions described above and these numerical examples.

NUMERICAL EXAMPLE 1

|     | i  | ri        | di     | ni      | Obj-distance = 76.862 |
|-----|----|-----------|--------|---------|----------------------|
|     | 1  | 0.000     | 11.653 | 1.56020 |                      |
|     | 2  | 279.569   | 18.972 |         |                      |
|     | 3  | −2622.804 | 21.246 | 1.56020 |                      |
|     | 4  | −245.200  | 1.501  |         |                      |
|     | 5  | 334.793   | 35.026 | 1.56020 |                      |
|     | 6  | −216.223  | 2.884  |         |                      |
| ASP | 7  | 187.902   | 30.803 | 1.56020 |                      |
| ASP | 8  | 226.893   | 60.089 |         |                      |
| ASP | 9  | −363.644  | 9.310  | 1.56020 |                      |
| ASP | 10 | 146.213   | 69.247 |         |                      |
|     | 11 | −69.852   | 9.310  | 1.56020 |                      |
|     | 12 | −2270.363 | 24.833 |         |                      |

|     | i  | ri        | di      | ni      | Obj-distance = 76.862 |
|-----|----|-----------|---------|---------|----------------------|
|     | 13 | −99.616   | 10.344  | 1.56020 |                      |
|     | 14 | −944.909  | 19.845  |         |                      |
|     | 15 | −2244.324 | 33.311  | 1.56020 |                      |
|     | 16 | −216.071  | 1.001   |         |                      |
|     | 17 | −4280.619 | 40.000  | 1.56020 |                      |
| ASP | 18 | −219.092  | 1.000   |         |                      |
|     | 19 | 618.763   | 39.293  | 1.56020 |                      |
|     | 20 | −438.165  | 191.745 |         |                      |
| ASP | 21 | 293.474   | 49.892  | 1.56020 |                      |
|     | 22 | 7080.234  | 12.874  |         |                      |
| ASP | 23 | 268.232   | 36.978  | 1.56020 |                      |
|     | 24 | 10845.650 | 11.212  |         |                      |
|     | 25 | 202.627   | 31.642  | 1.56020 |                      |
|     | 26 | 570.370   | 2.341   |         |                      |
|     | 27 | 189.128   | 46.339  | 1.56020 |                      |
|     | 28 | 104.346   | 22.351  |         |                      |
| ASP | 29 | 186.597   | 25.796  | 1.56020 |                      |
| ASP | 30 | −3797.323 |         |         |                      |

| aspherical surfaces | | | | | |
|---|---|---|---|---|---|
| i | K | A | B | C | D |
| 7  | 0.000000e+000 | 2.689079e−008  | −5.292149e−013 | 1.962342e−017  | 2.767038e−020 |
| 8  | 0.000000e+000 | −6.588227e−009 | −6.091242e−012 | −9.308520e−017 | 1.893655e−019 |
| 9  | 0.000000e+000 | −3.950276e−008 | 1.205981e−011  | 5.668382e−015  | 1.183230e−019 |
| 10 | 0.000000e+000 | −6.257472e−008 | 1.521126e−011  | 5.823880e−015  | 1.753969e−019 |
| 18 | 0.000000e+000 | 2.091086e−008  | 4.059984e−013  | 4.107056e−018  | 4.476865e−023 |

-continued aspherical surfaces

| | | | | |
|---|---|---|---|---|
| 21 0.000000e+000 | −3.374304e−009 | −5.446443e−013 | 5.223545e−018 | −2.024836e−022 |
| 23 0.000000e+000 | −2.358414e−008 | 3.158521e−013 | 1.026597e−018 | −3.097409e−023 |
| 29 0.000000e+000 | 3.743760e−008 | 4.267460e−012 | −2.378983e−016 | 1.249910e−019 |
| 30 0.000000e+000 | 7.790003e−009 | 7.967693e−013 | −2.008497e−016 | 1.636728e−020 |

| i | E | F | G |
|---|---|---|---|
| 7 | 3.787953e−024 | 1.184106e−028 | 0.000000e+000 |
| 8 | 6.022855e−024 | 0.000000e+000 | 0.000000e+000 |
| 9 | −7.189714e−023 | 0.000000e+000 | 0.000000e+000 |
| 10 | −7.106786e−023 | 1.589341e−026 | 0.000000e+000 |
| 18 | −5.385298e−027 | 1.570188e−031 | 0.000000e+000 |
| 21 | 3.514887e−027 | 6.967802e−033 | 0.000000e+000 |
| 23 | −3.613855e−027 | −3.554710e−032 | 0.000000e+000 |
| 29 | −2.330996e−023 | 2.649642e−027 | 0.000000e+000 |
| 30 | 4.394385e−024 | 0.000000e+000 | 0.000000e+000 |

NA = 0.65
β = 1/4
L = 1000

NUMERICAL EXAMPLE 2

| | i | ri | di | ni | Obj-distance = 76.729 |
|---|---|---|---|---|---|
| | 1 | ∞ | 10.630 | 1.56020 | |
| | 2 | 262.778 | 21.348 | | |
| | 3 | −2352.332 | 24.105 | 1.56020 | |
| | 4 | −235.727 | 3.497 | | |
| | 5 | 335.785 | 34.929 | 1.56020 | |
| | 6 | −219.548 | 1.210 | | |
| ASP | 7 | 174.011 | 30.803 | 1.56020 | |
| ASP | 8 | 223.533 | 58.374 | | |
| ASP | 9 | −721.643 | 9.310 | 1.56020 | |
| ASP | 10 | 117.483 | 67.811 | | |
| | 11 | −72.728 | 9.310 | 1.56020 | |
| | 12 | 2719.240 | 25.453 | | |
| | 13 | −98.805 | 10.344 | 1.56020 | |
| | 14 | −727.917 | 19.799 | | |
| | 15 | −988.788 | 34.866 | 1.56020 | |
| | 16 | −181.841 | 1.000 | | |
| ASP | 17 | −63212.427 | 38.988 | 1.56020 | |
| ASP | 18 | −248.015 | 1.000 | | |
| | 19 | 652.250 | 39.209 | 1.56020 | |
| | 20 | −381.746 | 204.164 | | |
| ASP | 21 | 237.211 | 51.746 | 1.56020 | |
| ASP | 22 | −534.246 | 11.973 | | |
| | 23 | 175.589 | 33.761 | 1.55020 | |
| | 24 | 457.536 | 2.163 | | |
| | 25 | 173.823 | 45.901 | 1.56020 | |
| | 26 | 104.356 | 22.473 | | |
| ASP | 27 | 183.135 | 47.090 | 1.56020 | |
| ASP | 28 | −18395.030 | | | |

| | | | aspherical surfaces | | |
|---|---|---|---|---|---|
| i | K | A | B | C | D |
| 7 | 0.000000e+000 | 2.602087e-008 | -9.861657e-013 | 1.543773e-016 | 3.406696e-020 |
| 8 | 0.000000e+000 | -4.996999e-009 | -7.964895e-012 | 3.960131e-016 | 2.894002e-019 |
| 9 | 0.000000e+000 | -9.044863e-008 | 1.795894e-011 | 1.168555e-014 | -1.916381e-019 |
| 10 | 0.000000e+000 | -9.122145e-008 | 2.638660e-011 | 1.484569e-014 | -3.164586e-019 |
| 11 | 0.000000e+000 | -2.313834e-009 | 4.776923e-013 | -1.219135e-017 | -8.487163e-022 |
| 18 | 0.0000000+000 | 1.619892e-008 | 6.583868e-013 | 5.134005e-018 | -1.010684e-023 |
| 21 | 0.000000e+000 | -2.460447e-008 | -8.025827e-014 | 5.851226e-019 | -6.974895e-023 |
| 22 | 0.000000e+000 | 4.392679e-009 | 1.790428e-013 | -3.316430e-018 | -7.037122e-023 |
| 27 | 0.000000e+000 | 6.116374e-009 | 1.014227e-011 | -1.144411e-016 | -1.547734e-019 |
| 28 | 0.000000e+000 | -3.758336e-008 | 2.767725e-011 | -1.049151e-014 | 2.230695e-018 |

| i | E | F | G |
|---|---|---|---|
| 7 | 8.828934e-024 | 6.065203e-029 | 0.000000e+000 |
| 8 | 8.277960e-024 | 0.000000e+000 | 0.000000e+000 |
| 9 | -1.939457e-022 | 0.000000e+000 | 0.000000e+000 |
| 10 | 1.549810e-022 | 1.589349e-026 | 0.000000e+000 |
| 17 | 2.904456e-026 | 0.000000e+000 | 0.000000e+000 |
| 18 | -7.201050e-026 | 2.156004e-030 | 0.000000e+000 |
| 21 | -8.625227e-027 | 8.632202e-032 | 0.000000e+000 |
| 22 | -2.921158e-028 | 0.000000e+000 | 0.000000e+000 |
| 27 | 2.856544e-023 | -1.501637e-027 | 0.000000e+000 |
| 28 | -2.036432e-022 | 0.000000e+000 | 0.000000e+000 |

NA = 0.65
β = 1/4
L = 979

NUMERICAL EXAMPLE 3

| | i | ri | di | ni | Obj-distance = 94.777 |
|---|---|---|---|---|---|
| | 1 | -211.935 | 25.002 | 1.56020 | |
| | 2 | -274.973 | 34.686 | | |
| | 3 | 921.019 | 19.213 | 1.56020 | |
| | 4 | -878.587 | 1.375 | | |
| | 5 | 310.870 | 29.825 | 1.56020 | |
| | 6 | -410.625 | 1.000 | | |
| ASP | 7 | 162.868 | 29.679 | 1.56020 | |
| ASP | 8 | 719.157 | 37.255 | | |
| ASP | 9 | -694.335 | 8.000 | 1.56020 | |
| ASP | 10 | 151.022 | 45.485 | | |
| | 11 | -212.339 | 10.002 | 1.56020 | |
| | 12 | 510.246 | 34.725 | | |
| | 13 | -64.375 | 8.000 | 1.55020 | |
| | 14 | 278.092 | 60.268 | | |
| | 15 | 1463.988 | 43.610 | 1.56020 | |
| | 16 | -189.700 | 1.000 | | |
| | 17 | 5371.657 | 28.376 | 1.56020 | |

-continued

| | i | ri | di | ni | Obj-distance = 94.777 |
|---|---|---|---|---|---|
| ASP | 18 | -313.325 | 3.549 | | |
| | 19 | 312.645 | 39.189 | 1.56020 | |
| | 20 | 306.130 | 112.761 | | |
| | 21 | 386.134 | 42.570 | 1.56020 | |
| | 22 | -1353.684 | 65.759 | | |
| ASP | 23 | 210.713 | 45.920 | 1.56020 | |
| | 24 | -7100.101 | 3.172 | | |
| | 25 | 161.697 | 40.777 | 1.56020 | |
| | 26 | 672.543 | 24.705 | | |
| | 27 | -2434.070 | 10.000 | 1.56020 | |
| | 28 | 257.881 | 1.113 | | |
| ASP | 29 | 203.124 | 37.891 | 1.56020 | |
| ASP | 30 | 2059.555 | | | |

| | | | alpherical surface: | | |
|---|---|---|---|---|---|
| i | K | A | B | C | D |
| 7 | 6.495603e-001 | 3.625859e-008 | 1.741255e-013 | -1.414452e-017 | 1.744975e-020 |
| 8 | 0.000000e+000 | 6.098222e-009 | -2.569543e-012 | 2.225990e-016 | 8.493683e-020 |
| 9 | 0.000000e+000 | -5.436344e-008 | 1.105804e-011 | 5.667300e-015 | -3.480729e-019 |
| 10 | 8.962335e-001 | 3.597303e-008 | 1.251516e-011 | 5.836732e-015 | 1.516663e-020 |
| 18 | 2.384810e-001 | 1.556881e-008 | 1.578934e-113 | -7.371860e-019 | 1.581607e-022 |
| 23 | 5.623844e-002 | -1.320180e-008 | -4.292778e-013 | -8.709804e-018 | -3.927143e-023 |
| 29 | 0.000000e+000 | 5.318060e-008 | 5.315370e-012 | -4.059718e-016 | -3.209372e-020 |
| 30 | 0.000000e+000 | -2.730145e-008 | 6.579062e-012 | 7.288556e-017 | -3.648637e-019 |

| i | E | F | G |
|---|---|---|---|

-continued

| | alpherical surface: | | |
|---|---|---|---|
| 7 | 4.363123e−025 | 9.563679e−028 | −1.965524e−033 |
| 8 | 7.645759e−024 | −5.447221e−028 | −7.558589e−032 |
| 9 | −1.501620e−022 | 3.545450e−028 | 1.529071e−030 |
| 10 | −2.368293e−022 | 1.602413e−026 | −1.126581e−029 |
| 18 | −1.625511e−026 | 8.891181e−031 | −1.806298e−035 |
| 23 | −6.738671e−027 | 2.324125e−031 | −7.432070e−036 |
| 29 | −6.309136e−024 | 1.135376e−027 | −5.838246e−032 |
| 30 | 8.493168e−023 | −9.227818e−027 | 4.009184e−031 |

NA = 0.65
β = 1/4
L = 1000

NUMERICAL EXAMPLE 4

| | i | ri | di | ni | Obj-distance = 70.000 |
|---|---|---|---|---|---|
| | 1 | 331.609 | 12.974 | 1.56020 | |
| ASP | 2 | 156.031 | 47.241 | | |
| | 3 | −3417.281 | 32.656 | 1.56020 | |
| | 4 | −219.033 | 86.919 | | |
| ASP | 5 | 2758.189 | 29.031 | 1.56020 | |
| | 6 | −294.707 | 3.350 | | |
| | 7 | 120.070 | 38.675 | 1.56020 | |
| | 8 | 395.684 | 58.140 | | |
| | 9 | −178.355 | 14.201 | 1.56020 | |
| ASP | 10 | 151.867 | 21.765 | | |
| ASP | 11 | −146.895 | 12.480 | 1.56020 | |
| ASP | 12 | 115.834 | 26.451 | | |
| | 13 | −199.815 | 18.463 | 1.56020 | |

-continued

| | i | ri | di | ni | Obj-distance = 70.000 |
|---|---|---|---|---|---|
| | 14 | −338.483 | 71.912 | | |
| | 15 | −1796.257 | 46.122 | 1.56020 | |
| | 16 | −199.618 | 1.000 | | |
| | 17 | 897.761 | 38.984 | 1.56020 | |
| | 18 | −336.141 | 126.305 | | |
| ASP | 19 | 449.354 | 36.159 | 1.56020 | |
| | 20 | −531.364 | 1.319 | | |
| | 21 | 157.155 | 57.116 | 1.56020 | |
| | 22 | 479.020 | 61.032 | | |
| | 23 | 161.193 | 17.883 | 1.56020 | |
| | 24 | 81.382 | 4.283 | | |
| | 25 | 74.902 | 33.541 | 1.56020 | |
| | 26 | 172.822 | | | |

| | aspherical surface: | | | | |
|---|---|---|---|---|---|
| i | K | A | B | C | D |
| 2 | 0.000000e+000 | −6.382248e−008 | 2.638831e−012 | −6.524224e−017 | 1.220348e−021 |
| 5 | 4.399758e+002 | 3.582120e−008 | 1.385894e−012 | −2.209416e−017 | −2.278720e−021 |
| 10 | 0.000000e+000 | 1.148743e−007 | 6.155297e−011 | 1.915592e−015 | 4.504460e−019 |
| 11 | 0.000000e+000 | 9.848384e−009 | −9.648560e−012 | 5.176920e−015 | −7.288667e−019 |
| 12 | 0.000000e+000 | 2.221313e−007 | −9.003813e−011 | 5.273124e−015 | 2.390446e−019 |
| 19 | 0.000000e+000 | −1.174175e−008 | −1.353071e−013 | −5.557747e−019 | −1.675229e−024 |

| i | E | F | G |
|---|---|---|---|
| 2 | −4.156347e−025 | 5.106050e−029 | 0.000000e+000 |
| 5 | −2.871249e−026 | 2.261849e−030 | 0.000000e+000 |
| 10 | 1.154041e−022 | 1.511505e−027 | 0.000000e+000 |
| 11 | 1.515536e−022 | 0.000000e+000 | 0.000000e+000 |
| 12 | −1.539633e−023 | −6.557398e−027 | 0.000000e+000 |
| 19 | −9.268969e−028 | −5.568278e−033 | 0.000000e+000 |

NA = 0.65
β = 1/4
L = 1000

NUMERICAL EXAMPLE 5

| | i | ri | di | ni | Obj-distance = 94.486 |
|---|---|---|---|---|---|
| | 1 | 337.003 | 22.211 | 1.50850 | |
| | 2 | −355.093 | 0.100 | | |
| ASP | 3 | 292.157 | 21.149 | 1.50850 | |
| ASP | 4 | −560.057 | 0.100 | | |
| | 5 | 521.242 | 20.968 | 1.50850 | |
| | 6 | 76436.568 | 14.385 | | |
| | 7 | 818.454 | 16.035 | 1.50850 | |
| | 8 | 97.900 | 17.606 | | |
| ASP | 9 | −1467.092 | 11.428 | 1.50850 | |
| ASP | 10 | 142.710 | 26.020 | | |
| | 11 | −212.403 | 11.196 | 1.5o850 | |
| | 12 | 353.410 | 20.216 | | |
| | 13 | −134.210 | 11.240 | 1.50850 | |
| | 14 | −1002.862 | 12.039 | | |
| | 15 | −236.025 | 15.914 | 1.50850 | |
| | 16 | −156.795 | 0.204 | | |
| | 17 | 779.273 | 35.407 | 1.50850 | |
| | 18 | −209.072 | 0.100 | | |
| | 19 | −1786.188 | 23.880 | 1.50850 | |
| ASP | 20 | −273.517 | 0.100 | | |
| | 21 | 826.670 | 19.962 | 1.50850 | |
| | 22 | −782.423 | 9.552 | | |
| | 23 | 183.291 | 33.305 | 1.50850 | |
| | 24 | 864.185 | 1.121 | | |
| | 25 | 189.560 | 33.969 | 1.50850 | |
| | 26 | 115.050 | 59.543 | | |

-continued

| | i | ri | di | ni | Obj-distance = 94.486 |
|---|---|---|---|---|---|
| | 27 | −247.564 | 11.800 | 1.50850 | |
| | 28 | 180.291 | 32.382 | | |
| | 29 | −141.987 | 11.800 | 1.50850 | |
| | 30 | 1634.805 | 38.291 | | |
| | 31 | −432.625 | 19.180 | 1.50850 | |
| | 32 | −225.869 | 43.366 | | |
| | 33 | −5580.889 | 36.257 | 1.50850 | |
| | 34 | −251.752 | 0.100 | | |
| ASP | 35 | 656.210 | 28.234 | 1.50850 | |
| | 36 | −1123.439 | 11.355 | | |
| | 37 | 476.442 | 32.359 | 1.50850 | |
| | 38 | −1813.445 | 21.067 | | |
| | 39 | 285.017 | 37.448 | 1.50850 | |
| | 40 | 3204.814 | 0.415 | | |
| | 41 | 153.457 | 38.178 | 1.50850 | |
| | 42 | 357.667 | 0.100 | | |
| | 43 | 144.612 | 27.813 | 1.50850 | |
| | 44 | 279.653 | 12.152 | | |
| | 45 | 1408.031 | 15.899 | 1.50850 | |
| | 46 | 83.926 | 28.089 | | |
| ASP | 47 | 98.536 | 31.980 | 1.50850 | |
| | 48 | −5814.320 | | | |

NA = 0.65
β = 1/4
L = 1050 aspherical surface:

| i | K | A | B | C | D |
|---|---|---|---|---|---|
| 3 | −1.467540e+000 | −8.951376e−009 | −2.285210e−012 | 3.324945e−016 | 2.628948e−020 |
| 4 | 0.000000e+000 | −5.978443e−009 | −1.682938e−012 | 7.478670e−016 | −1.459628e−020 |
| 9 | 0.000000e+000 | −2.123929e−008 | 1.529902e−011 | 2.095313e−015 | −9.109944e−019 |
| 10 | −2.064869e−001 | −1.153015e−008 | 1.122575e−011 | 1.126785e−015 | −1.300266e−018 |
| 20 | 0.000000e+000 | 2.186523e−009 | 9.742324e−014 | 4.753496e−018 | 6.448689e−023 |
| 35 | 0.000000e+000 | −7.203429e−010 | 3.483951e−015 | −3.090615e−019 | −3.685641e−024 |
| 47 | 0.000000e+000 | 1.133753e−009 | −6.956249e−014 | 3.466240e−016 | −9.834080e−022 |

| i | E | F | G |
|---|---|---|---|
| 3 | 4.673713e−024 | 0.000000e+000 | 0.000000e+000 |
| 4 | 4.074521e−024 | 0.000000e+000 | 0.000000e+000 |
| 9 | 1.128762e−023 | 0.000000e+000 | 0.000000e+000 |
| 10 | 1.052897e−022 | 0.000000e+000 | 0.000000e+000 |
| 20 | 8.837182e−027 | 0.000000e+000 | 0.000000e+000 |
| 35 | 1.334447e−029 | 0.000000e+000 | 0.000000e+000 |
| 47 | 2.247095e−023 | 0.000000e+000 | 0.000000e+000 |

NUMERICAL EXAMPLE 6

| | i | ri | di | ni | Obj-distance = 98.214 |
|---|---|---|---|---|---|
| | 1 | 66506.430 | 20.534 | 1.56020 | |
| | 2 | −200.815 | 1.000 | | |
| ASP | 3 | 247.178 | 24.228 | 1.56020 | |
| ASP | 4 | −1273.958 | 1.799 | | |
| | 5 | 171.546 | 22.308 | 1.56020 | |
| | 6 | 98.980 | 17.896 | | |
| | 7 | 1182.942 | 11.000 | 1.56020 | |
| | 8 | 159.619 | 19.222 | | |
| ASP | 9 | −182.740 | 11.000 | 1.56020 | |
| ASP | 10 | 207.068 | 86.213 | | |
| | 11 | 500.819 | 43.015 | 1.56020 | |
| | 12 | −240.019 | 1.000 | | |
| ASP | 13 | 319.058 | 41.291 | 1.56020 | |
| ASP | 14 | −365.817 | 1.000 | | |
| | 15 | 229.840 | 28.376 | 1.56020 | |
| | 16 | −8803.339 | 46.316 | | |
| | 17 | −264.505 | 11.000 | 1.56020 | |
| | 18 | 184.159 | 18.143 | | |
| ASP | 19 | −269.210 | 11.000 | 1.56020 | |
| ASP | 20 | 112.292 | 140.901 | | |
| ASP | 21 | 1504.030 | 27.617 | 1.50140 | |
| ASP | 22 | −325.399 | 1.000 | | |
| | 23 | 287.965 | 37.520 | 1.50140 | |
| | 24 | −1646.618 | 63.842 | | |
| ASP | 25 | 291.973 | 40.105 | 1.50140 | |
| ASP | 26 | −599.669 | 1.000 | | |
| | 27 | 178.529 | 32.020 | 1.50140 | |
| | 28 | 557.997 | 1.000 | | |
| | 29 | 120.000 | 47.000 | 1.56020 | |
| | 30 | 80.443 | 8.223 | | |
| | 31 | 98.682 | 46.988 | 1.56020 | |
| | 32 | 164.043 | | | |

| aspherical surfaces | | | | |
|---|---|---|---|---|
| K | A | B | C | D |
| 3 −2.147054e+000 | 2.855743e−008 | −1.036774e−012 | 1.275547e−016 | 4.593414e−020 |
| 4  0.000000e+000 | 1.336794e−008 | −1.397714e−012 | 3.702893e−016 | 6.224425e−020 |
| 9 −2.089679e−001 | 1.000595e−008 | 7.735659e−012 | 1.330938e−015 | 3.122334e−019 |
| 10  1.063518e+000 | 1.481255e−008 | 1.699184e−012 | 5.097592e−016 | 4.237075e−020 |
| 13 −1.680764e+000 | −5.776339e−009 | −1.148440e−012 | −2.490235e−011 | −5.242060e−022 |
| 14  1.885960e+000 | −7.212811e−009 | −4.316706e−013 | −2.408691e−017 | 1.071687e−022 |
| 19 −3.574249e+000 | 2.409944e−008 | 4.315636e−013 | −3.840839e−016 | 1.186363e−019 |
| 20  9.429294e−002 | −3.335778e−010 | −1.425263e−011 | −6.427809e−016 | 9.891731e−020 |
| 21  2.184806e+001 | 1.253508e−009 | 6.846267e−014 | 1.221954e−018 | 3.386655e−023 |
| 22 −5.933867e−003 | 1.096606e−008 | 1.175524e−013 | 5.758625e−018 | 1.039016e−022 |
| 25 −3.712593e−001 | −8.843257e−009 | −4.036554e−013 | 2.210059e−018 | −1.172535e−022 |
| 26 −5.741502e+000 | 1.687149e−010 | 2.510453e−014 | −2.894874e−018 | 1.807084e−022 |

| i | E | F | G |
|---|---|---|---|
| 3 | −9.393944e−025 | 1.747211e−027 | 0.000000e+000 |
| 4 |  1.068921e−026 | 1.606181e−027 | 0.000000e+000 |
| 9 | −8.189520e−023 | 5.998644e−027 | 0.000000e+000 |
| 10 | −5.874433e−023 | 6.722456e−027 | 0.000000e+000 |

-continued

| | aspherical surfaces | | |
|---|---|---|---|
| 13 | −4.318772e−026 | 1.626810e−030 | 0.000000e+000 |
| 14 | 1.396749e−026 | −1.796726e−030 | 0.000000e+000 |
| 19 | 1.073154e−023 | −1.635891e−027 | 0.000000e+000 |
| 20 | 3.768240e−024 | −1.287764e−027 | 0.000000e+000 |
| 21 | −6.771036e−027 | 9.395056e−032 | 0.000000e+000 |
| 22 | −6.969503e−027 | −1.902148e−031 | 0.000000e+000 |
| 25 | 6.340859e−028 | −9.453066e−032 | 0.000000e+000 |
| 26 | −6.855560e−027 | 5.347354e−032 | 0.000000e+000 |

NA = 0.65
β = 1/4
L = 1000

NUMERICAL EXAMPLE 7

| | i | ri | di | ni | Obj-distance = 70.000 |
|---|---|---|---|---|---|
| | 1 | 208.834 | 40.000 | 1.56020 | |
| ASP | 2 | −2204.367 | 48.301 | | |
| | 3 | 117.104 | 40.000 | 1.56020 | |
| | 4 | 136.645 | 23.945 | | |
| ASP | 5 | −141.268 | 10.000 | 1.56020 | |
| ASP | 6 | 153.903 | 29.127 | | |
| | 1 | −86.471 | 22.693 | 1.56020 | |
| | 8 | −2380.713 | 74.228 | | |
| | 9 | 1316.964 | 54.046 | 1.56020 | |
| | 10 | −197.958 | 3.000 | | |
| ASP | 11 | 1153.120 | 50.098 | 1.56020 | |
| ASP | 12 | −272.743 | 3.000 | | |

-continued

| | i | ri | di | ni | Obj-distance = 70.000 |
|---|---|---|---|---|---|
| | 13 | 164.261 | 55.052 | 1.56020 | |
| | 14 | 695.660 | 65.937 | | |
| ASP | 15 | −792.673 | 18.178 | 1.56020 | |
| ASP | 16 | 163.351 | 43.522 | | |
| | 17 | −154.770 | 10.000 | 1.56020 | |
| | 18 | 465.852 | 70.283 | | |
| | 19 | 1313.769 | 39.444 | 1.56020 | |
| | 20 | −230.952 | 3.401 | | |
| ASP | 21 | 230.618 | 41.629 | 1.56020 | |
| ASP | 22 | −1095.767 | 4.457 | | |
| | 23 | 162.697 | 36.856 | 1.56020 | |
| | 24 | 521.931 | 56.084 | | |
| ASP | 25 | 126.480 | 36.438 | 1.56020 | |
| ASP | 26 | 394.895 | | | |

| | aspherical surfaces | | | | |
|---|---|---|---|---|---|
| | K | A | B | C | D |
| 1 | −3.466662e−001 | 1.433507e−007 | −2.133046e−012 | 5.836183e−017 | 0.000000e+000 |
| 2 | 2.000000e+000 | 7.959536e−008 | −3.744211e−012 | −1.133348e−016 | 0.000000e+000 |
| 5 | 1.004511e+000 | −1.573887e−007 | −6.456960e−012 | 8.518749e−016 | 0.000000e+000 |
| 6 | −6.754456e−001 | −1.134021e−007 | 2.106544e−011 | −3.105587e−016 | 0.000000e+000 |
| 11 | 1.323098e+000 | −1.227290e−008 | 1.434144e−013 | −4.525546e−018 | 0.000000e+000 |
| 12 | 1.664589e−001 | −1.227018e−009 | 1.626884e−013 | −1.920513e−018 | 0.000000e+000 |
| 15 | −2.000000e+000 | −5.085760e−008 | 4.139140e−012 | −8.157887e−017 | 0.000000e+000 |
| 16 | 9.336532e−001 | −2.144321e−008 | −9.878780e−014 | −1.742585e−017 | 0.000000e+000 |
| 21 | −3.149396e−001 | −2.740179e−009 | −2.124860e−013 | 5.859505e−018 | 0.000000e+000 |
| 22 | −4.067584e−001 | 9.667551e−009 | 2.056572e−014 | 4.774158e−018 | 0.000000e+000 |
| 25 | −2.121815e−001 | −5.135833e−008 | −3.003067e−012 | −5.838412e−018 | 0.000000e+000 |
| 26 | 1.283433e−001 | −8.510284e−008 | 6.429230e−012 | −1.847620e−016 | 0.000000e+000 |

| i | E | F | G |
|---|---|---|---|
| 1 | 0.000000e+000 | 0.000000e+000 | 0.000000e+000 |
| 2 | 0.000000e+000 | 0.000000e+000 | 0.000000e+000 |
| 5 | 0.000000e+000 | 0.000000e+000 | 0.000000e+000 |
| 6 | 0.000000e+000 | 0.000000e+000 | 0.000000e+000 |
| 11 | 0.000000e+000 | 0.000000e+000 | 0.000000e+000 |
| 12 | 0.000000e+000 | 0.000000e+000 | 0.000000e+000 |

| | aspherical surfaces | | |
|---|---|---|---|
| 15 | 0.000000e+000 | 0.000000e+000 | 0.000000e+000 |
| 16 | 0.000000e+000 | 0.000000e+000 | 0.000000e+000 |
| 21 | 0.000000e+000 | 0.000000e+000 | 0.000000e+000 |
| 22 | 0.000000e+000 | 0.000000e+000 | 0.000000e+000 |
| 25 | 0.000000e+000 | 0.000000e+000 | 0.000000e+000 |
| 26 | 0.000000e+000 | 0.000000e+000 | 0.000000e+000 |

NA = 0.65
β = 1/4
L = 1000

NUMERICAL EXAMPLE 8

| | i | ri | di | ni | Obj-distance = 65.000 |
|---|---|---|---|---|---|
|  | 1  | −103485.230 | 17.433 | 1.56020 | |
|  | 2  | −201.292    | 0.800  |         | |
| ASP | 3 | 370.683    | 17.976 | 1.56020 | |
|  | 4  | −407.200   | 30.000 |         | |
| ASP | 5 | −456.784   | 11.000 | 1.56020 | |
| ASP | 6 | 145.860    | 16.510 |         | |
|  | 7  | −503.955   | 11.000 | 1.56020 | |
|  | 8  | 203.717    | 34.000 |         | |
|  | 9  | −424.708   | 21.358 | 1.56020 | |
|  | 10 | −129.351   | 0.800  |         | |
| ASP | 11 | 801.838   | 28.215 | 1.56020 | |
|  | 12 | −175.733   | 20.000 |         | |
|  | 13 | 159.132    | 11.676 | 1.56020 | |
|  | 14 | 100.036    | 23.873 |         | |
|  | 15 | −515.415   | 11.000 | 1.56020 | |
|  | 16 | 178.045    | 27.455 |         | |
|  | 17 | −115.893   | 11.000 | 1.56020 | |
|  | 18 | 541.607    | 40.357 |         | |
|  | 19 | −1434.439  | 37.615 | 1.56020 | |
|  | 20 | −151.851   | 0.800  |         | |
|  | 21 | 358.551    | 36.516 | 1.56020 | |
| ASP | 22 | −463.136  | 0.800  |         | |
|  | 23 | 165.301    | 40.791 | 1.56020 | |
|  | 24 | 1423.496   | 53.909 |         | |
|  | 25 | −2299.149  | 11.000 | 1.56020 | |
|  | 26 | 121.688    | 38.458 |         | |
|  | 27 | −170.387   | 11.000 | 1.56020 | |
|  | 28 | 283.691    | 43.497 |         | |
|  | 29 | 772.565    | 47.000 | 1.56020 | |
|  | 30 | −258.987   | 35.908 |         | |
| ASP | 31 | 377.097   | 34.035 | 1.56020 | |
| ASP | 32 | −636.486  | 0.800  |         | |
|  | 33 | 184.387    | 37.630 | 1.56020 | |
|  | 34 | 702.528    | 5.509  |         | |
|  | 35 | 150.000    | 44.788 | 1.56020 | |
|  | 36 | 253.503    | 29.946 |         | |
| ASP | 37 | 99.159    | 47.000 | 1.56020 | |
| ASP | 38 | 110.423   |        |         | |

| | aspherical surfaces | | | | |
|---|---|---|---|---|---|
| i | K | A | B | C | D |
| 3  | 0.000000e+000 | 2.751774e−008  | −1.770975e−012 | 4.138130e−016  | −3.614801e−021 |
| 5  | 0.000000e+000 | 1.175464e−008  | −2.132585e−011 | −2.485640e−015 | 3.535714e−019  |
| 6  | 0.000000e+000 | 2.045218e−007  | −2.001742e−011 | −4.217326e−015 | −8.965853e−019 |
| 11 | 0.000000e+000 | 2.891834e−008  | 4.645221e−012  | −1.114191e−017 | −3.826417e−020 |
| 22 | 0.000000e+000 | 1.029482e−009  | −2.160423e−014 | 1.886393e−020  | 1.290161e−022  |
| 31 | 0.000000e+000 | −5.277072e−009 | 1.078635e−015  | 3.853875e−018  | −9.041445e−023 |
| 32 | 0.000000e+000 | 1.288563e−010  | 1.294359e−013  | 3.817123e−018  | 1.912098e−024  |
| 37 | 0.000000e+000 | 4.179479e−009  | 2.916225e−012  | 1.437591e−016  | 1.965879e−019  |
| 38 | 0.000000e+000 | 2.193704e−007  | 3.821860e−011  | 9.758402e−015  | 3.844117e−018  |

| i | E | F | G |
|---|---|---|---|
| 3  | 4.102479e−024  | −7.556172e−028 | 0.000000e+000 |
| 5  | 9.142663e−023  | −1.206849e−026 | 0.000000e+000 |
| 6  | 4.937104e−022  | −4.929568e−026 | 0.000000e+000 |
| 11 | 1.329561e−024  | 2.686166e−029  | 0.000000e+000 |
| 22 | −6.301310e−027 | 1.073452e−031  | 0.000000e+000 |
| 31 | −2.442106e−026 | 1.631503e−030  | 0.000000e+000 |

| aspherical surfaces | | |
|---|---|---|
| 32 −2.856921e−026 | 1.805409e−030 | 0.000000e+000 |
| 37 −4.239874e−023 | 7.557044e−027 | 0.000000e+000 |
| 38 −1.364150e−021 | 9.820195e−025 | 0.000000e−000 |

NA = 0.65
β = 1/4
L = 1000

NUMERICAL EXAMPLE 9

| | i | ri | di | ni | Obj-distance = 70.000 |
|---|---|---|---|---|---|
| ASP | 1 | 426.303 | 22.143 | 1.56020 | |
| ASP | 2 | −293.270 | 44.991 | | |
| ASP | 3 | −239.063 | 12.287 | 1.56020 | |
| ASP | 4 | 193.554 | 56.615 | | |
| | 5 | 8175.282 | 27.396 | 1.56020 | |
| | 6 | −172.317 | 0.700 | | |
| | 7 | 485.638 | 29.517 | 1.56020 | |
| | 8 | −226.633 | 62.198 | | |
| ASP | 9 | −543.539 | 11.000 | 1.56020 | |
| ASP | 10 | 98.865 | 29.468 | | |
| | 11 | −166.560 | 11.000 | 1.56020 | |
| | 12 | 579.649 | 35.061 | | |
| | 13 | 804.055 | 34.406 | 1.56020 | |
| | 14 | −152.871 | 0.700 | | |
| | 15 | 163.018 | 31.782 | 1.56020 | |
| | 16 | −1638.880 | 46.140 | | |

| | i | ri | di | ni | Obj-distance = 70.000 |
|---|---|---|---|---|---|
| | 17 | −383.725 | 11.000 | 1.56020 | |
| | 18 | 151.783 | 30.642 | | |
| | 19 | −147.895 | 15.264 | 1.56020 | |
| | 20 | 335.023 | 21.043 | | |
| | 21 | 1046.740 | 35.362 | 1.56020 | |
| | 22 | −250.766 | 9.458 | | |
| | 23 | 720.726 | 25.727 | 1.56020 | |
| | 24 | −397.727 | 94.567 | | |
| | 25 | 980.555 | 34.089 | 1.56020 | |
| | 26 | −357.146 | 0.700 | | |
| | 27 | 133.000 | 50.773 | 1.56020 | |
| | 28 | 386.552 | 0.918 | | |
| | 29 | 107.997 | 41.164 | 1.56020 | |
| | 30 | 169.965 | 13.455 | | |
| | 31 | 539.514 | 19.429 | 1.56020 | |
| | 32 | 106.461 | 0.700 | | |
| ASP | 33 | 92.023 | 41.003 | 1.56020 | |
| ASP | 34 | 110.938 | | | |

NA = 0.65
β = 1/4
L = 1000

| aspherical surfaces | | | | |
|---|---|---|---|---|
| i | K | A | B | C | D |
|---|---|---|---|---|---|
| 1 | 0.000000e+000 | 1.179390e−007 | −2.481342e−012 | −8.514994e−016 | −5.507741e−021 |
| 2 | 0.000000e+000 | 1.984808e−009 | −2.379609e−012 | −1.277691e−015 | 2.269844e−019 |
| 3 | 0.000000e+000 | −6.127062e−008 | −2.439639e−011 | 4.940348e−015 | 1.783844e−019 |
| 4 | 0.000000e+000 | 1.351928e−007 | −2.155565e−011 | 4.979933e−015 | −2.254154e−020 |
| 9 | 0.000000e+000 | −1.029855e−008 | 4.222175e−013 | 9.252409e−016 | −3.320195e−020 |
| 10 | 0.000000e+000 | −1.647436e−008 | −6.863313e−012 | 2.498019e−016 | 3.078894e−021 |
| 33 | 0.000000e+000 | −7.872670e−008 | 3.170754e−012 | 7.552635e−016 | 1.265430e−018 |
| 34 | 0.000000e+000 | 5.393494e−007 | 1.483362e−010 | 4.549512e−014 | 5.826949e−017 |

| | E | F | G |
|---|---|---|---|
| 1 | 4.244235e−023 | 1.894592e−027 | 0.000000e+000 |
| 2 | 2.746013e−023 | 6.870822e−028 | 0.000000e+000 |
| 3 | −3.758891e−023 | −1.387715e−026 | 0.000000e+000 |
| 4 | −1.550011e−022 | 1.237198e−026 | 0.000000e+000 |
| 9 | −2.287173e−023 | 1.356755e−027 | 0.000000e+000 |
| 10 | −4.351537e−023 | 6.281604e−028 | 0.000000e+000 |
| 33 | −3.541330e−022 | 7.175493e−026 | 0.000000e+000 |
| 34 | −4.706812e−020 | 3.185353e−023 | 0.000000e+000 |

TABLE 1

[Example 1]

| SURFACE No. | GROUP No. | \|hb/h\| | \|Δasph/L\| |
|---|---|---|---|
| 7 | 1 | 2.260 | 0.001205 |
| 8 | 1 | 1.955 | 0.000323 |
| 9 | 2 | 1.057 | 0.000225 |
| 10 | 2 | 0.947 | 0.000096 |
| 18 | 3 | 0.076 | 0.005474 |
| 21 | 3 | 0.072 | 0.004680 |
| 23 | 3 | 0.101 | 0.005630 |
| 29 | 3 | 0.256 | 0.000989 |
| 30 | 3 | 0.303 | 0.000113 |

$|L \times \phi o| = 25.502$

TABLE 2

[Example 2]

| SURFACE No. | GROUP No. | \|hb/h\| | \|Δasph/L\| |
|---|---|---|---|
| 7 | 1 | 2.216 | 0.001748 |
| 8 | 1 | 1.939 | 0.000180 |
| 9 | 2 | 1.085 | 0.000233 |
| 10 | 2 | 0.971 | 0.000429 |
| 17 | 3 | 0.094 | 0.000127 |
| 18 | 3 | 0.077 | 0.004611 |
| 21 | 3 | 0.093 | 0.007132 |
| 22 | 3 | 0.110 | 0.001873 |
| 27 | 3 | 0.257 | 0.000947 |
| 28 | 3 | 0.387 | 0.000046 |

$|L \times \phi o| = 25.150$

TABLE 3

[Example 3]

| SURFACE No. | GROUP No. | \|hb/h\| | \|Δasph/L\| |
|---|---|---|---|
| 7 | 1 | 1.868 | 0.004140 |
| 8 | 1 | 1.712 | 0.000568 |
| 9 | 2 | 1.235 | 0.000355 |
| 10 | 2 | 1.123 | 0.001114 |
| 18 | 3 | 0.057 | 0.003483 |
| 23 | 3 | 0.109 | 0.006516 |
| 29 | 3 | 0.214 | 0.000567 |
| 30 | 3 | 0.268 | 0.000155 |

$|L \times \phi o| = 26.233$

TABLE 4

[Example 4]

| SURFACE No. | GROUP No. | \|hb/h\| | \|Δasph/L\| |
|---|---|---|---|
| 2 | 1 | 4.249 | 0.001351 |
| 5 | 1 | 1.504 | 0.004555 |
| 10 | 2 | 0.637 | 0.001489 |
| 11 | 2 | 0.423 | 0.000053 |
| 12 | 2 | 0.343 | 0.000258 |
| 19 | 3 | 0.088 | 0.003748 |

$|L \times \phi o| = 19.551$

TABLE 5

[Example 5]

| SURFACE No. | GROUP No. | \|hb/h\| | \|Δasph/L\| |
|---|---|---|---|
| 3 | 1 | 2.991 | 0.000317 |
| 4 | 1 | 2.691 | 0.000209 |
| 9 | 2 | 1.387 | 0.000178 |
| 10 | 2 | 1.233 | 0.000040 |
| 20 | 2 | 0.507 | 0.000460 |
| 35 | 3 | 0.042 | 0.000251 |
| 47 | 5 | 0.311 | 0.000072 |

$|L \times \phi o| = 30.670$

TABLE 6

[Example 6]

| SURFACE No. | GROUP No. | \|hb/h\| | \|Δasph/L\| |
|---|---|---|---|
| 3 | 1 | 2.870 | 0.000521 |
| 4 | 1 | 2.555 | 0.000844 |
| 9 | 2 | 1.337 | 0.000677 |
| 10 | 2 | 1.212 | 0.000634 |
| 13 | 3 | 0.610 | 0.004306 |
| 14 | 3 | 0.561 | 0.002989 |
| 19 | 4 | 0.267 | 0.000720 |
| 20 | 4 | 0.233 | 0.000588 |
| 21 | 5 | 0.042 | 0.000371 |
| 22 | 5 | 0.061 | 0.002088 |
| 25 | 5 | 0.133 | 0.003329 |
| 26 | 5 | 0.151 | 0.000751 |

$|L \times \phi o| = 25.020$

TABLE 7

[Example 7]

| SURFACE No. | GROUP No. | \|hb/h\| | \|Δasph/L\| |
|---|---|---|---|
| 1 | 1 | 4.664 | 0.003187 |
| 2 | 1 | 3.351 | 0.001296 |
| 5 | 2 | 1.028 | 0.001421 |
| 6 | 2 | 0.899 | 0.000531 |
| 11 | 3 | 0.298 | 0.003540 |
| 12 | 3 | 0.282 | 0.000120 |
| 15 | 4 | 0.149 | 0.001508 |
| 16 | 4 | 0.137 | 0.000683 |
| 21 | 5 | 0.081 | 0.001328 |
| 22 | 5 | 0.102 | 0.001908 |
| 25 | 5 | 0.257 | 0.001789 |
| 26 | 5 | 0.330 | 0.000570 |

$|L \times \phi o| = 21.600$

TABLE 8

[Example 8]

| SURFACE No. | GROUP No. | \|hb/h\| | \|Δasph/L\| |
|---|---|---|---|
| 3 | 1 | 4.239 | 0.000654 |
| 5 | 2 | 2.512 | 0.001034 |
| 6 | 2 | 2.212 | 0.001059 |
| 11 | 3 | 1.126 | 0.001592 |
| 22 | 5 | 0.258 | 0.000155 |

TABLE 8-continued

[Example 8]

| SURFACE No. | GROUP No. | \|hb/h\| | \|Δasph/L\| |
|---|---|---|---|
| 31 | 7 | 0.109 | 0.001030 |
| 32 | 7 | 0.126 | 0.000468 |
| 37 | 7 | 0.277 | 0.000578 |
| 38 | 7 | 0.411 | 0.001395 |

$|L \times \phi_0| = 34.207$

TABLE 9

[Example 9]

| SURFACE No. | GROUP No. | \|hb/h\| | \|Δasph/L\| |
|---|---|---|---|
| 1 | 1 | 4.822 | 0.002485 |
| 2 | 1 | 4.040 | 0.000098 |
| 3 | 2 | 2.368 | 0.001695 |
| 4 | 2 | 2.136 | 0.001942 |
| 9 | 4 | 0.719 | 0.000030 |
| 10 | 4 | 0.655 | 0.000473 |
| 33 | 7 | 0.358 | 0.000358 |
| 34 | 7 | 0.590 | 0.001244 |

$|L \times \phi_0| = 29.054$

Figure 29:
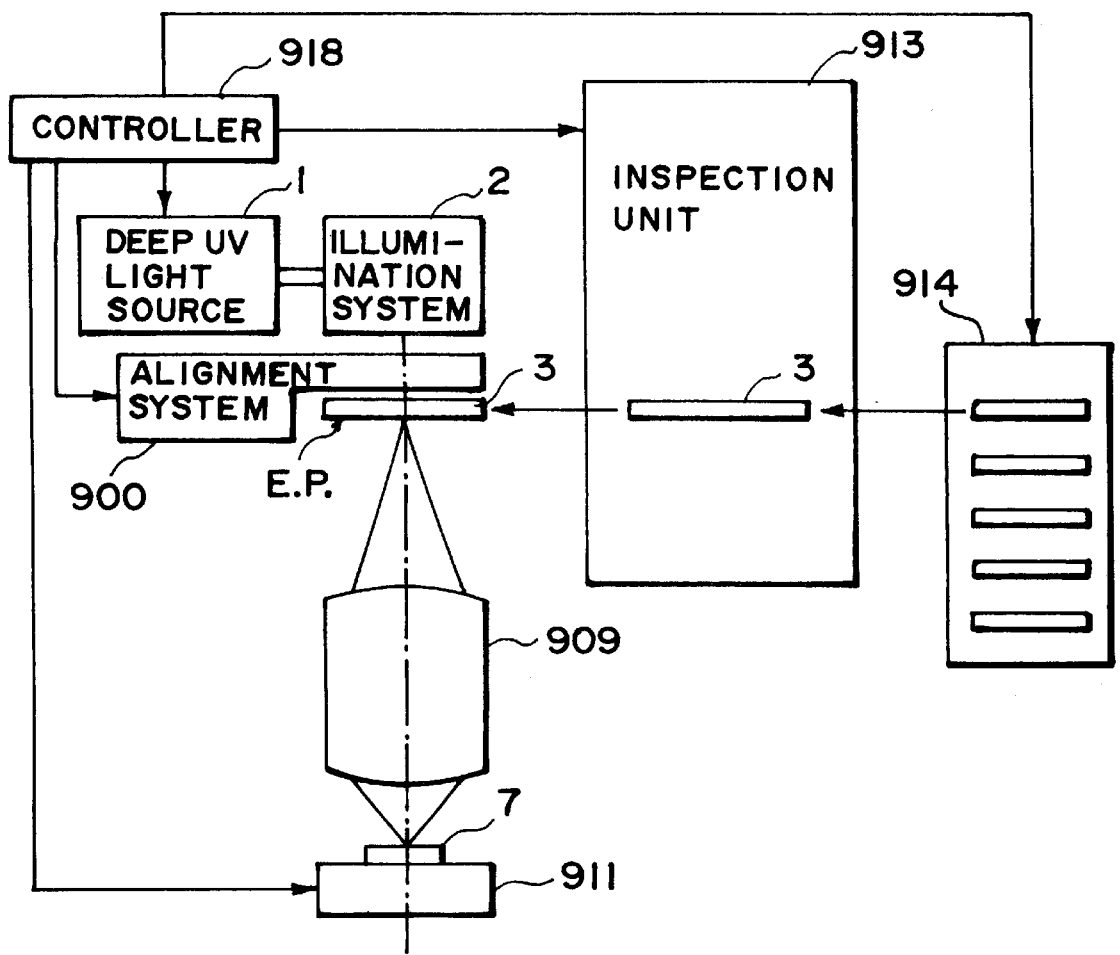
FIG. 29 is a block diagram of a main portion of a semiconductor device manufacturing system according to an embodiment of the present invention.

FIG. 29 is a schematic view of a main portion of a semiconductor device manufacturing system which uses a projection optical system according to the present invention. The manufacturing system of this embodiment is arranged to produce semiconductor devices, by printing a circuit pattern formed on a reticle or photomask (first object), onto a wafer or photosensitive substrate (second object). Generally, the system includes a projection optical system, a mask accommodating unit, a mask inspection unit, and a controller, all of which are disposed in a clean room.

Denoted in FIG. 29 at 1 is an excimer laser as a light source, and denoted at 2 is an illumination optical system which is provided as a unit. A reticle or mask (first object) 3 is placed at an exposure position EP, and then the mask is illuminated from above with a predetermined numerical aperture (NA). Denoted at 909 is a projection optical system according to any one of Numerical Examples 1–9, for example, and it serves to project a circuit pattern of the reticle 3 onto a silicon substrate (wafer) 7 and to print the pattern thereon.

Denoted at 900 is an alignment system for aligning the reticle 3 and the wafer 7, prior to execution of the exposure process. The alignment system 900 includes at least one reticle observation microscope system. Denoted at 911 is a wafer stage. The elements described above are components of the projection exposure apparatus.

Denoted at 914 is a mask accommodating unit, for accommodating plural masks therein. Denoted at 913 is an inspection unit for inspecting the presence/absence of any foreign particles on masks. This inspection unit 913 is used to perform particle inspection when a selected mask is moved out of the mask accommodating unit 914, and before it is fed to the exposure position EP.

The controller 918 serves to control the whole sequence of the system. Specifically, it controls the sequences for operations of the accommodating unit 914 and the inspection unit 913, as well as basic operations of the projection exposure apparatus, such as alignment operation, exposure operation and wafer stepwise motion, for example.

Next, an embodiment of a semiconductor device manufacturing method based on such a device manufacturing system described above, will be explained.

Figure 30:
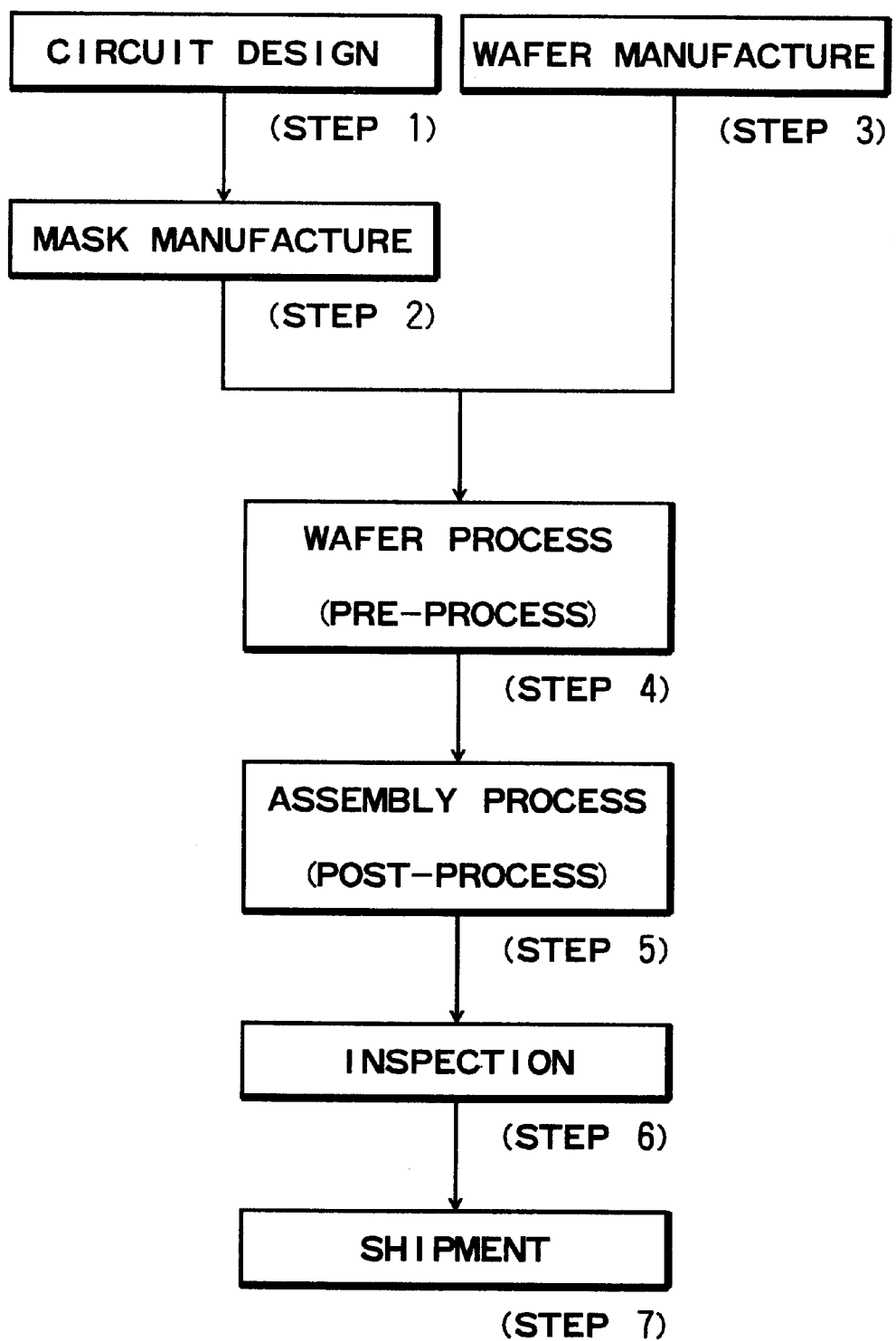
FIG. 30 is a flow chart of semiconductor device manufacturing processes.

FIG. 30 is a flow chart of a procedure for the manufacture microdevices such as semiconductor chips (e.g., ICs or LSIs), liquid crystal panels, or CCDs, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process (called a pre-process) wherein, by using the so prepared mask and wafer, circuits are practically formed on the wafer through lithography. Step 5 subsequent to this is an assembling step (called a post-process) wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 31:
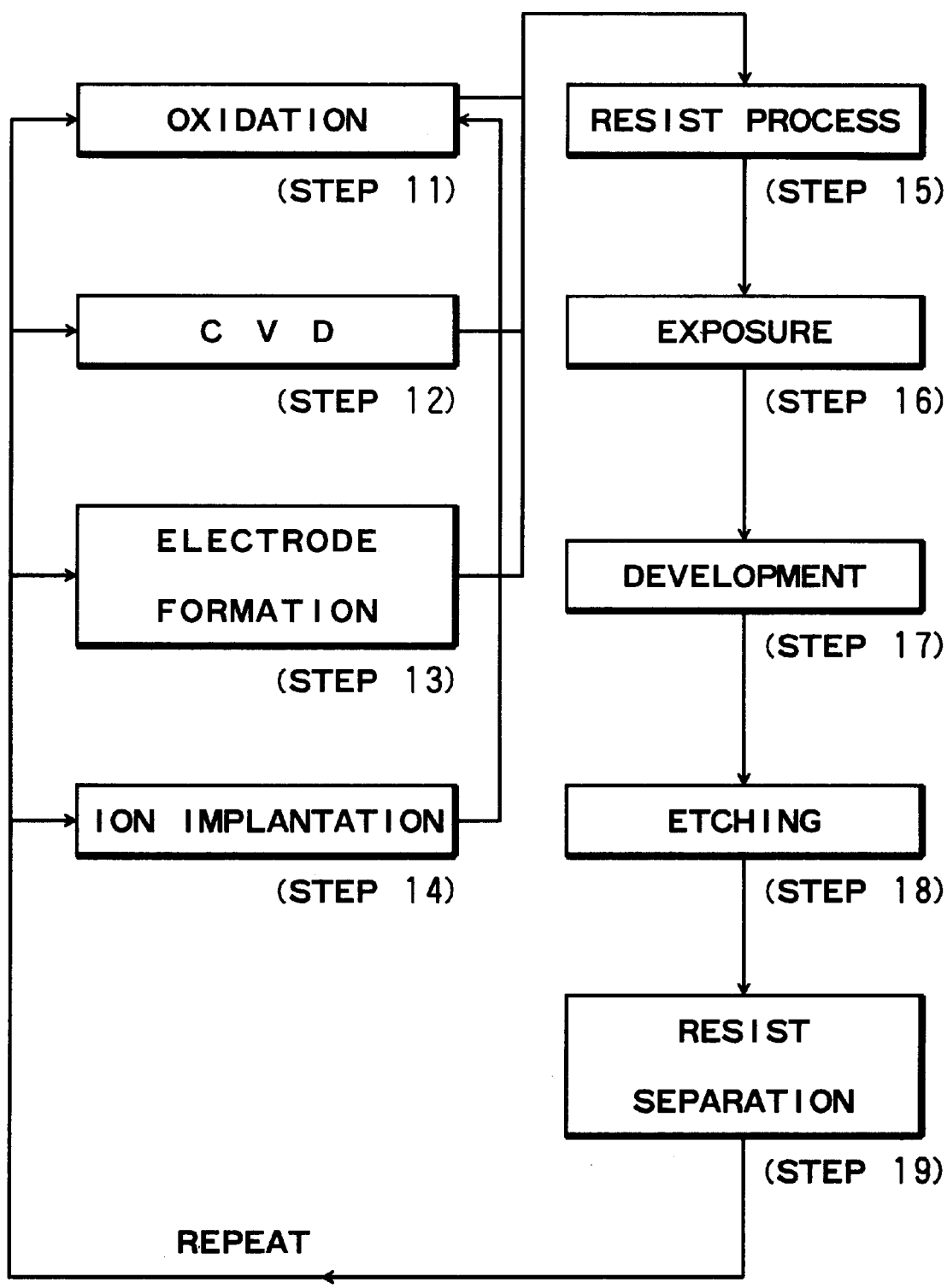
FIG. 31 is a flow chart for explaining details of a wafer process in the procedure of the flow chart of FIG. 30.

FIG. 31 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

In the embodiment described above, the projection exposure apparatus is of the type that the whole circuit pattern of a reticle 3 is printed at once on a wafer. In place of it, the present invention is applicable to a projection exposure apparatus of a scanning type wherein light from a laser light source is projected to a portion of a circuit pattern of a reticle through an illumination optical system and, while the reticle and a wafer are scanningly moved relative to the projection optical system and in a direction perpendicular to the optical axis direction of the projection optical system, the circuit pattern of the reticle is projected and printed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. A projection exposure apparatus, comprising:
    a projection optical system for projecting a pattern of a reticle onto a photosensitive substrate,
    wherein said projection optical system includes at least three lens units, including a lens unit of a positive refractive power and a lens unit of a negative refractive power, and said at least three lens units including an aspherical lens having aspherical surfaces formed on both sides thereof,
    wherein a relation $|L \times \phi_0| > 17$ is satisfied, where L is a conjugate distance of said projection optical system and $\phi_0$ is the total power of the negative lens unit or of negative lens units of said projection optical system, wherein each aspherical surface of said aspherical lens is disposed at a position satisfying a relation $|h_b/h|>0.35$ where h is a height of an axial marginal light ray, and $h_b$ is a height of a most abaxial chief ray, and wherein each aspherical surface of said aspherical lens satisfies a relation $|\Delta ASPH/L|>1.0\times10^{-6}$ where $\Delta ASPH$ is an aspherical amount of the surface of said aspherical lens.

2. An apparatus according to claim 1, wherein each aspherical surface of said aspherical lens includes regions in which local curvature powers change with mutually opposite signs, from a surface center to a surface peripheral portion.

3. An apparatus according to claim 1, wherein each lens unit of said at least three lens units includes an aspherical lens having aspherical surfaces formed on both sides thereof.

4. An apparatus according to claim 1, wherein each aspherical surface of said aspherical lens satisfies a relation $|\Delta ASPH/L|<0.02$.

5. An apparatus according to claim 1, wherein a relation $|L\times\phi_0|<70$ is satisfied.

6. An apparatus according to claim 1, wherein said aspherical lens is disposed within a range that satisfies a relation $|h_b/h|<15$.

7. An apparatus according to claim 1, wherein said projection optical system is telecentric both on an object side and on an image side.

8. An apparatus according to claim 1, wherein said projection optical system includes a plurality of aspherical lenses each having aspherical surfaces formed on both sides thereof.

9. A device manufacturing method, comprising:

a projection exposure step for transferring a pattern of a reticle onto a wafer by use of projection exposure apparatus as recited in claim 1; and a developing step for developing the wafer after said projection exposure step.

* * * * *

UNITED STATES PATENT AND TRADEMARK OFFICE
CERTIFICATE OF CORRECTION

PATENT NO. : 6,621,555 B1
DATED : September 16, 2003
INVENTOR(S) : Chiaki Terasawa et al.

It is certified that error appears in the above-identified patent and that said Letters Patent is hereby corrected as shown below:

Title page,
Item [57], ABSTRACT,
Line 13, "$|h_b/h|>0.36$" should read -- $|h_b/h|>0.35$ --.

Drawings,
SHEET 3, FIGURE 3, "ASTIGMATSM" should read -- ASTIGMATISM --.
SHEET 6, FIGURE 6, "ASTIGMATSM" should read -- ASTIGMATISM --.
SHEET 9, FIGURE 9, "ASTIGMATSM" should read -- ASTIGMATISM --.
SHEET 12, FIGURE 12, "ASTIGMATSM" should read -- ASTIGMATISM --.
SHEET 15, FIGURE 15, "ASTIGMATSM" should read -- ASTIGMATISM --.
SHEET 18, FIGURE 18, "ASTIGMATSM" should read -- ASTIGMATISM --.
SHEET 21, FIGURE 21, "ASTIGMATSM" should read -- ASTIGMATISM --.
SHEET 24, FIGURE 24, "ASTIGMATSM" should read -- ASTIGMATISM --.
SHEET 27, FIGURE 27, "ASTIGMATSM" should read -- ASTIGMATISM --.

Column 2,
Line 40, "$|h_b/h|>0.35$" should read -- $|h_b/h|>0.36$ --.

Column 7,
Line 66, "principle" should read -- principal --.

Column 8,
Line 55, "improved more." should read -- further improved. --

Column 20,
Line 30, under column "ri," "-245.200" should read -- 246.200 --.

Column 24,
In the bottom-most table "alpherical surface:" should read -- aspherical surface: --; and in that table, in column "C," the seventh entry down, "-4.059718e-016" should read -- 4.059718e-016 --.

Column 26,
Line 34, the eleventh entry down in column "ri," "81.382" should read -- 87.382 --.

Column 27,
Line 20, the sixth entry down in column "ni," "1.5o850" should read -- 1.50850 --.

Column 29,
The eighth entry down in column "D." "9.891731e-020" should read -- 9.891739e-020 --.

UNITED STATES PATENT AND TRADEMARK OFFICE
CERTIFICATE OF CORRECTION

PATENT NO.    : 6,621,555 B1
DATED         : September 16, 2003
INVENTOR(S)   : Chiaki Terasawa et al.

It is certified that error appears in the above-identified patent and that said Letters Patent is hereby corrected as shown below:

Column 31,
Line 33, of "NUMERICAL EXAMPLE 7," under column "ri," the ninth entry down, "1316.964" should read -- 13162.964 --.

Column 40,
Line 1, "manufacture" should read -- manufacture of --.

Signed and Sealed this

Twenty-third Day of March, 2004

JON W. DUDAS
*Acting Director of the United States Patent and Trademark Office*